(12) United States Patent
Nagasaka

(10) Patent No.: US 7,714,982 B2
(45) Date of Patent: May 11, 2010

(54) EXPOSURE APPARATUS, EXPOSURE METHOD, AND DEVICE MANUFACTURING METHOD

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 554 days.

(21) Appl. No.: 11/707,075

(22) Filed: Feb. 16, 2007

(65) Prior Publication Data

US 2007/0273858 A1 Nov. 29, 2007

Related U.S. Application Data

(60) Provisional application No. 60/779,437, filed on Mar. 7, 2006, provisional application No. 60/861,439, filed on Nov. 29, 2006, provisional application No. 60/861,451, filed on Nov. 29, 2006.

(30) Foreign Application Priority Data

| Feb. 16, 2006 | (JP) | ............................. 2006-039229 |
| Feb. 16, 2006 | (JP) | ............................. 2006-039833 |
| Feb. 16, 2006 | (JP) | ............................. 2006/039927 |

(51) Int. Cl.
    G03B 27/42 (2006.01)
(52) U.S. Cl. .............................. 355/53; 355/55; 355/67
(58) Field of Classification Search .................... 355/53, 355/55, 67
    See application file for complete search history.

(56) References Cited

U.S. PATENT DOCUMENTS

| 4,666,273 | A |   | 5/1987  | Shimizu et al. |
| 4,780,617 | A |   | 10/1988 | Umatate et al. |
| 4,856,905 | A | * | 8/1989  | Nishi ........................ 356/401 |
| 5,493,403 | A |   | 2/1996  | Nishi |
| 5,646,413 | A |   | 7/1997  | Nishi |
| 5,880,817 | A |   | 3/1999  | Hashimoto |
| 5,969,441 | A |   | 10/1999 | Loopstra et al. |
| 6,018,384 | A |   | 1/2000  | Ota |
| 6,169,602 | B1 |  | 1/2001  | Taniguchi et al. |
| 6,208,407 | B1 |  | 3/2001  | Loopstra |
| 6,235,438 | B1 |  | 5/2001  | Suzuki et al. |
| 6,341,007 | B1 |  | 1/2002  | Nishi et al. |
| 6,383,940 | B1 |  | 5/2002  | Yoshimura |
| 6,400,441 | B1 |  | 6/2002  | Nishi et al. |
| 6,549,269 | B1 |  | 4/2003  | Nishi et al. |
| 6,590,634 | B1 |  | 7/2003  | Nishi et al. |
| 6,608,681 | B2 |  | 8/2003  | Tanaka et al. |
| 6,778,257 | B2 |  | 8/2004  | Bleeker et al. |
| 6,819,405 | B2 |  | 11/2004 | Mulkens et al. |

(Continued)

FOREIGN PATENT DOCUMENTS

EP    1 420 298 A2    5/2004

(Continued)

*Primary Examiner*—Kiet T Nguyen
(74) *Attorney, Agent, or Firm*—Oliff & Berridge, PLC

(57) ABSTRACT

An exposure apparatus includes: an optical system having an optical element on which a first exposure light and a second exposure light are incident, the first exposure light and the second exposure light from the optical element being irradiated onto a first exposure field and a second exposure field; and a detection device that detects at least one of the first exposure light and the second exposure light, which are from the optical element and are directed towards a different direction from directions towards the first and second exposure fields.

35 Claims, 28 Drawing Sheets

U.S. PATENT DOCUMENTS

| | | |
|---|---|---|
| 6,897,963 B1 | 5/2005 | Taniguchi et al. |
| 6,952,253 B2 | 10/2005 | Lof et al. |
| 7,023,610 B2 | 4/2006 | Ohtsuki et al. |
| 7,116,401 B2 | 10/2006 | Nijmeijer et al. |
| 2002/0041377 A1 | 4/2002 | Hagiwara et al. |
| 2004/0165159 A1 | 8/2004 | Lof et al. |
| 2005/0206850 A1 | 9/2005 | Shimizu et al. |
| 2005/0219493 A1 | 10/2005 | Oshida et al. |
| 2005/0248856 A1 | 11/2005 | Omura et al. |
| 2005/0280791 A1 | 12/2005 | Nagasaka et al. |
| 2006/0121364 A1 | 6/2006 | Omura |
| 2006/0231206 A1 | 10/2006 | Nagasaka et al. |
| 2007/0013890 A1 | 1/2007 | Loopstra et al. |

FOREIGN PATENT DOCUMENTS

| | | |
|---|---|---|
| JP | A 60-78454 | 5/1985 |
| JP | A 61-44429 | 3/1986 |
| JP | A 4-65603 | 3/1992 |
| JP | A 4-130710 | 5/1992 |
| JP | A 8-78313 | 3/1996 |
| JP | A 8-78314 | 3/1996 |
| JP | A 8-227847 | 9/1996 |
| JP | A 8-306619 | 11/1996 |
| JP | A 8-313842 | 11/1996 |
| JP | A 9-162110 | 6/1997 |
| JP | A 9-251208 | 9/1997 |
| JP | A 10-116778 | 5/1998 |
| JP | A 10-163099 | 6/1998 |
| JP | A 10-214783 | 8/1998 |
| JP | A 11-135400 | 5/1999 |
| JP | A 11-195602 | 7/1999 |
| JP | A 2000-21742 | 1/2000 |
| JP | A 2000-505958 | 5/2000 |
| JP | A 2000-164504 | 6/2000 |
| JP | A 2000-323404 | 11/2000 |
| JP | A 2001-510577 | 7/2001 |
| JP | A 2001-513267 | 8/2001 |
| JP | A 2001-297976 | 10/2001 |
| JP | A 2002-14005 | 1/2002 |
| JP | A 2003-163158 | 6/2003 |
| JP | A 2004-289126 | 10/2004 |
| JP | A 2004-304135 | 10/2004 |
| WO | WO 99/23692 A1 | 5/1999 |
| WO | WO 99/28790 A1 | 6/1999 |
| WO | WO 99/46835 A1 | 9/1999 |
| WO | WO 99/49504 | 9/1999 |
| WO | WO 02/069049 A2 | 9/2002 |
| WO | WO 03/065428 A1 | 8/2003 |
| WO | WO 2004/019128 A2 | 3/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/107011 A1 | 12/2004 |
| WO | WO 2005/029559 A1 | 3/2005 |
| WO | WO 2005/059617 A2 | 6/2005 |
| WO | WO 2005/059618 A2 | 6/2005 |

* cited by examiner

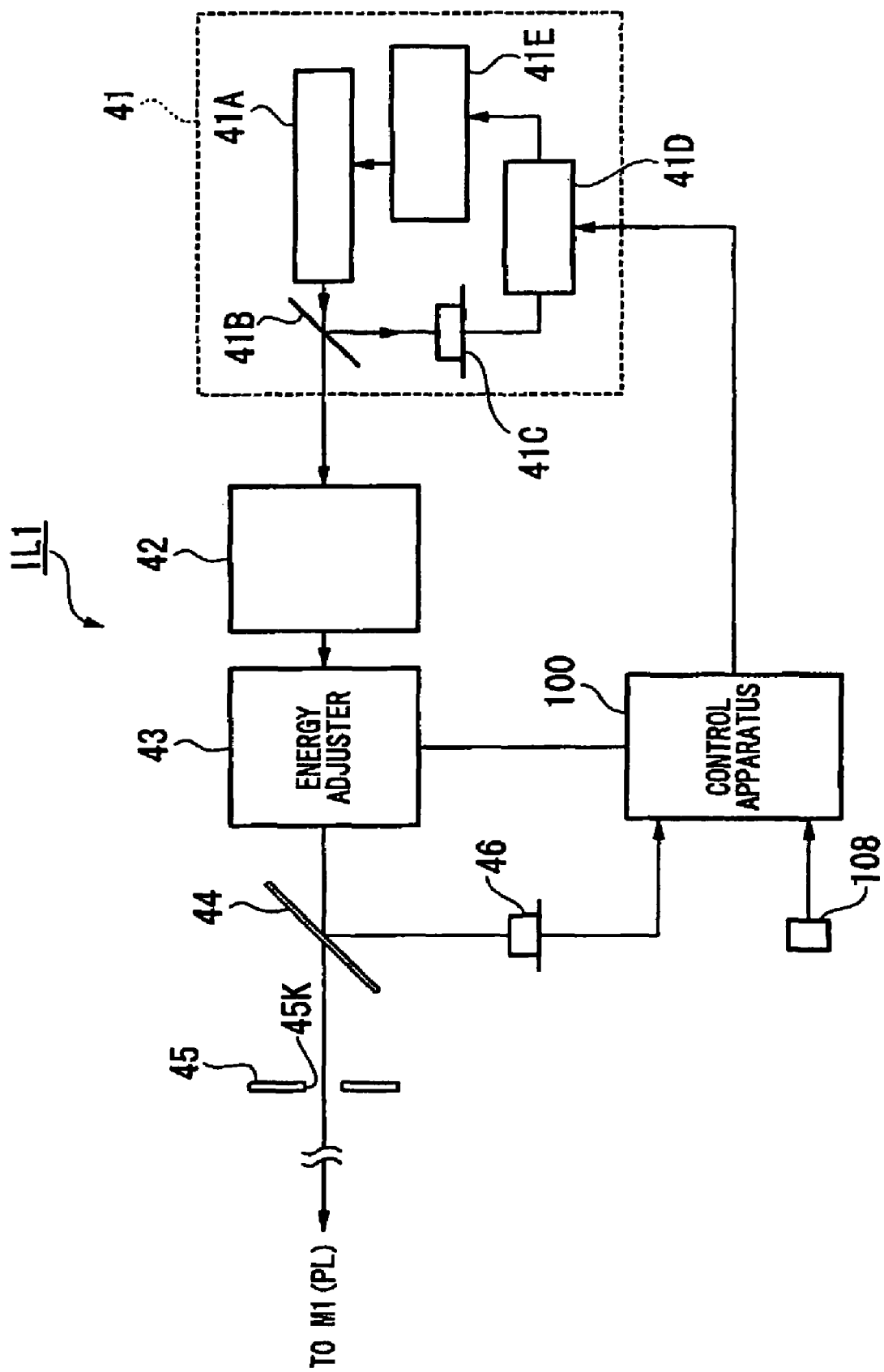

SCANNING MOVEMENT

SCANNING MOVEMENT

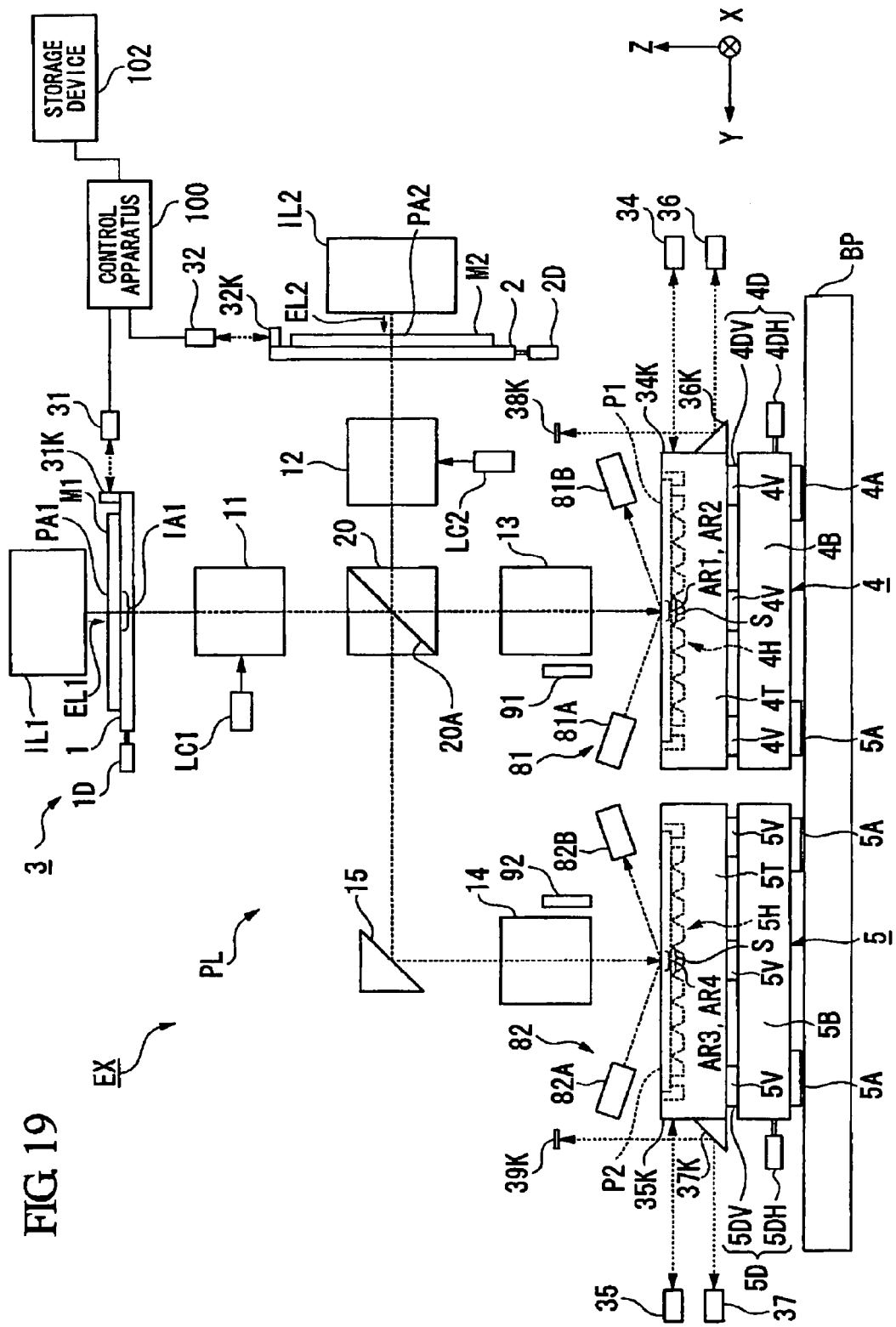

FIG. 25
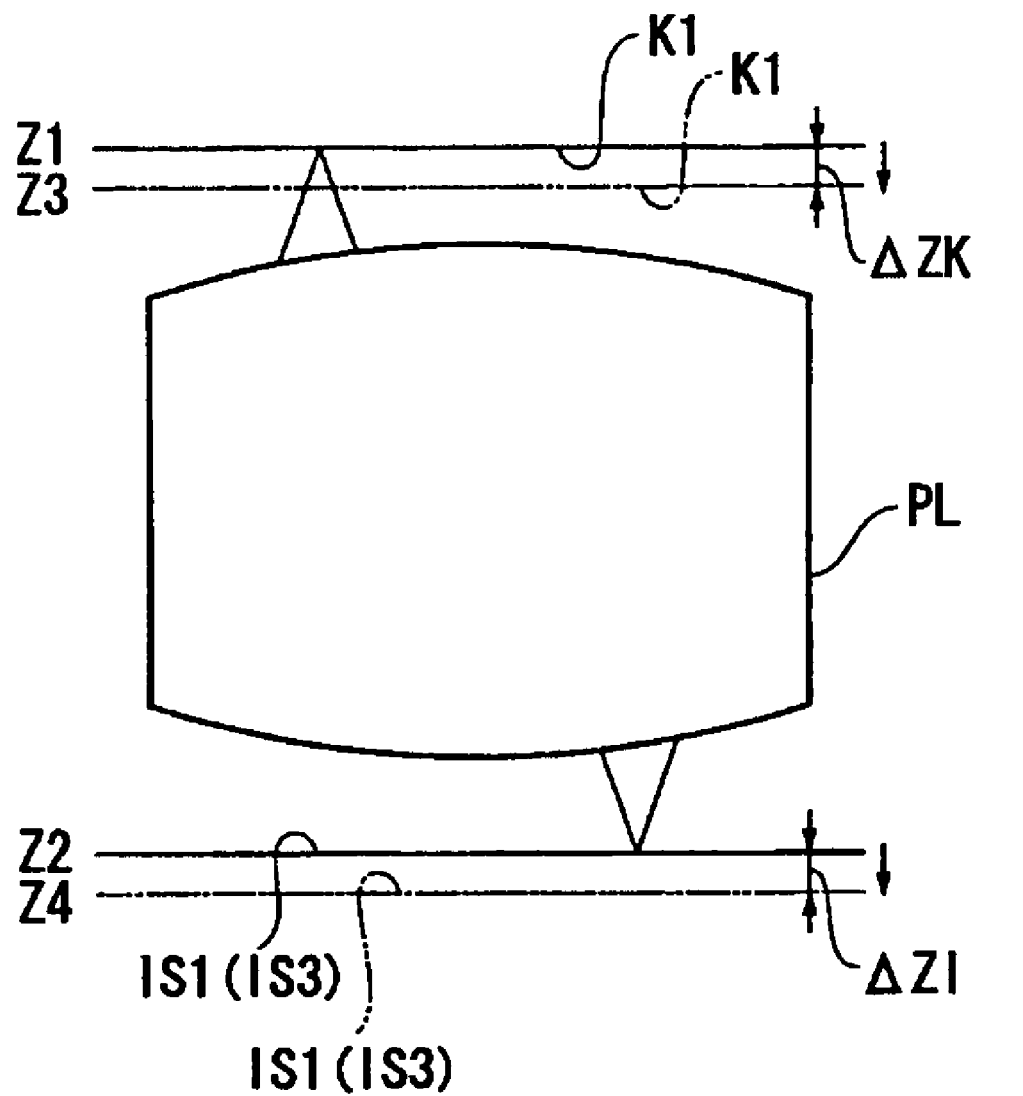
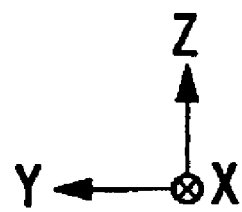

EXPOSURE APPARATUS, EXPOSURE METHOD, AND DEVICE MANUFACTURING METHOD

CROSS-REFERENCE TO RELATED APPLICATION

This application is a non-provisional application claiming benefit of provisional application Nos. 60/779,437 filed Mar. 7, 2006, 60/861,439 and 60/861,451 filed Nov. 29, 2006 and claims priority to Japanese Patent Application Nos. 2006-039229, 2006-039833, 2006-039927, filed Feb. 16, 2006, the contents of which are incorporated herein by reference.

BACKGROUND OF THE INVENTION

1. Field of the Invention

The present invention relates to an exposure apparatus that exposes a substrate, an exposure method, and a device manufacturing method.

2. Background Art

In an exposure apparatus used in a photolithography process, there is devised an exposure apparatus for example as disclosed in Japanese Unexamined Patent Application, First Publication No. 2001-297976, which combines a plurality of optical lights in a combining optical element (a light combining member), and exposes (multiply exposes) a substrate with the combined exposure light.

In order to favorably expose the substrate, then even in the case where a plurality of exposure lights are combined in a combining optical element, it is necessary to irradiate exposure light of a desired state onto the substrate. Therefore, it is desired to devise a technique that is capable of smoothly detecting the condition of the exposure light. In this case, if exposure light from the combining optical element which is not directed towards the substrate is generated, then this has an influence on for example on the various equipments which constitutes the exposure apparatus, so that this can influence the exposure accuracy. In addition, for example, in micro device such as semiconductor device and the like, miniaturization of circuit pattern and also improvement in productivity are important.

A purpose of some aspects of the invention is to provide an exposure apparatus, an exposure method, and device manufacturing method, that can favorably expose a substrate with good efficiency, even in the case where a plurality of exposure lights are combined using a combining optical element. Another purpose is to provide an exposure apparatus, an exposure method, and device manufacturing method, that can expose a substrate efficiently.

SUMMARY

According to a first aspect of the invention, there is provided an exposure apparatus that exposes a substrate, comprising: an optical system having an optical element on which a first exposure light and a second exposure light are incident, the first exposure light and the second exposure light from the optical element being irradiated onto a first exposure field and a second exposure field; and a detection device that detects at least one of the first exposure light and the second exposure light, which are from the optical element and are directed towards a different direction from directions towards the first and second exposure fields.

According the first aspect of the invention, a substrate can be favorable exposed.

According to a second aspect of the invention, there is provided an exposure apparatus that exposes a substrate, comprising: an optical system having an optical element on which a first exposure light and a second exposure light are incident, the first exposure light and the second exposure light from the optical element being irradiated onto a first exposure field and a second exposure field; and a processing device that processes at least one of the first exposure light and the second exposure light, which are from the optical element and are direct towards a different direction from directions towards the first and second exposure fields, so as to suppress an influence due to a light including at least one of the first exposure light and the second exposure light, which are directed towards the different direction.

According the second aspect of the invention, a substrate can be favorable exposed.

According to a third aspect of the invention, there is provided an exposure apparatus that exposes a substrate, comprising: an optical system that has an optical element on which a first and second exposure lights are incident and from which a first and second branched lights each having the first and second exposure lights are exited, each of first and second exposure fields being irradiated with the first and second exposure lights corresponding to the first branched light, each of third and fourth exposure fields being irradiated with the first and second exposure light corresponding to the second branched light, wherein a predetermined field on a first substrate is multiply exposed with the first and second exposure lights corresponding to the first branched light and a predetermined field on a second substrate is multiply exposed with the first and second exposure lights corresponding to the second branched light.

According to the third aspect of the invention, a substrate can be favorably exposed with good efficiency.

According to a fourth aspect of the invention, there is provided an exposure apparatus that exposes a substrate, comprising: an optical system that includes a first system and a second system, the first system forming images of first and second patterns in a first field, the second system forming images of the first and second patterns in a second field different from the first field, a part of the second system is united in the first system, a first substrate being multiply exposed with the images formed in the first field of the first and second patterns, a second substrate being multiply exposed with the images formed in the second field of the first and second patterns.

According to the fourth aspect of the invention, a substrate can be favorably exposed with good efficiency.

According to a fifth aspect of the invention, there is provided a device manufacturing method that uses the exposure apparatus of the aforementioned aspect.

According to the first aspect of the invention, a device can be manufactured using an exposure apparatus that can favorably expose a substrate with good efficiency.

According to a sixth aspect of the invention, there is provided an exposure method for exposing a substrate, the method comprising: irradiating first and second exposure fields with first and second exposure lights via an optical system having an optical element on which the first and second exposure lights are incident, to multiply expose the substrate; and detecting at least one of the first exposure light and the second exposure light, which are from the optical element and are directed towards a different direction from directions towards the first and second exposure fields.

According to the sixth aspect of the invention, a substrate can be favorably exposed with good efficiency.

According to a seventh aspect of the invention, there is provided an exposure method for exposing a substrate, the method comprising: irradiating first and second exposure fields with first and second exposure lights via an optical system having an optical element on which the first and second exposure lights are incident, to multiply expose the substrate; and suppressing an influence due to a light including at least one of the first exposure light and the second exposure light, which are from the optical element and are directed towards a different direction from directions towards the first and second exposure fields.

According to the seventh aspect of the invention, a substrate can be favorably exposed with good efficiency.

According to an eighth aspect of the invention, there is provided an exposure method for exposing a substrate, the method comprising: irradiating each of first and second exposure fields with first and second exposure light corresponding to a first branched light and each of third and fourth exposure fields with the first and second exposure lights corresponding to a second branched light by means of an optical system that has an optical element on which the first and second exposure lights are incident and from which the first and second branched lights each having the first and second exposure lights are exited; and multiply exposing a predetermined field on a first substrate with the first branched light and a predetermined field on a second substrate with the second branched light.

According to the eighth aspect of the invention, a substrate can be favorably exposed with good efficiency.

According to a ninth aspect of the invention, there is provided an exposure method for exposing a substrate, the method comprising: forming images of first and second patterns on a first field and images of the first and second patterns on a second field different from the first field; and multiply exposing a first substrate with the images formed in the first field of the first and second patterns and a second substrate with the images formed in the second field of the first and second patterns.

According to the ninth aspect of the invention, a substrate can be favorably exposed with good efficiency.

According to a tenth aspect of the invention, there is provided a device manufacturing method comprising: exposing the substrate with the method of the aforementioned aspect; developing the exposed substrate; and treating the developed substrate.

According to the tenth aspect of the invention, a device can be manufactured using an exposure apparatus that can favorably expose a substrate with good efficiency.

DETAILED DESCRIPTION OF THE INVENTION

FIG. 2 is a schematic block diagram showing an example of an exposure apparatus and an illumination system.

FIG. 19 is a schematic block diagram showing an exposure apparatus according to a seventh embodiment.

FIG. 25 is a schematic diagram for explaining a relationship between a pattern forming surface and an image plane.

BEST MODE FOR CARRYING OUT THE INVENTION

Hereunder is a description of embodiments of the present invention, with reference to the drawings. However the present invention is not limited to this description. In the following description, an XYZ rectangular co-ordinate system is established, and the positional relationship of respective members is described with reference to this XYZ rectangular co-ordinate system. A predetermined direction within a horizontal plane is made the X axis direction, a on orthogonal to the X axis direction in the horizontal plane is made the Y axis direction, and a direction orthogonal to both the X axis direction and the Y axis direction (that is, a perpendicular direction) is made the Z axis direction. Furthermore, rotation (inclination) directions about the X axis, the Y axis and the Z axis, are made the θX, the θY, and the θZ directions respectively.

First Embodiment

Figure 1:
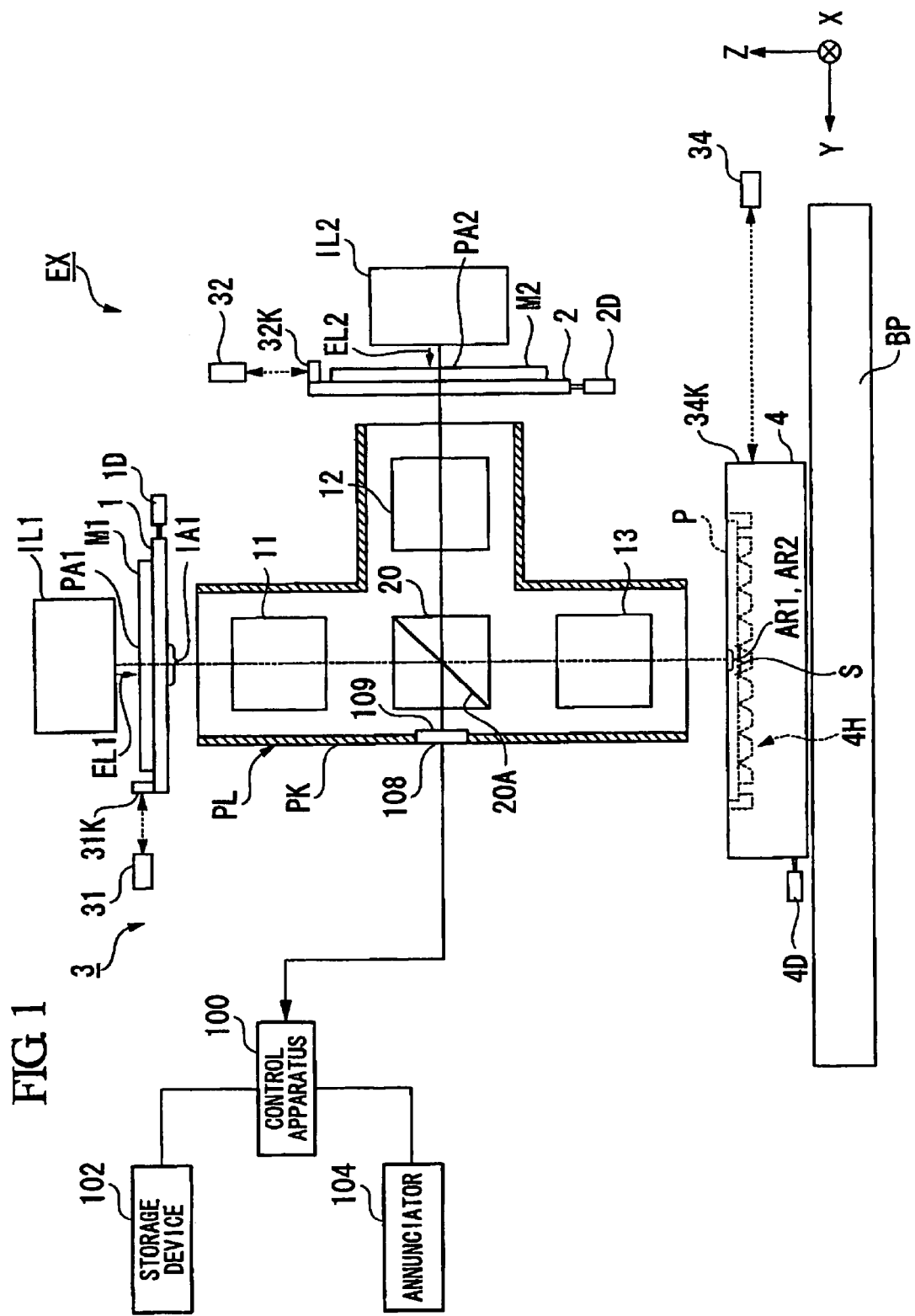
FIG. 1 is a schematic block diagram showing an exposure apparatus according to a first embodiment.

A first embodiment will be described FIG. 1 is a schematic block diagram showing an exposure apparatus EX according to the first embodiment. In FIG. 1, the exposure apparatus EX includes; a first mask stage 1 that is capable of holding and moving a first mask M1 having a first pattern PA1, a second mask stage 2 that is capable of holding and moving a second mask M2 having a second pattern PA2, a substrate step 4 that is capable of holding and moving a substrate P, a measurement system 3 that is capable of measuring position information of the respective stages, a first illumination system IL1 that illuminates the first pattern PA1 of the first mask M1 with first exposure light EL1, a second illumination system IL2 that illuminates the second pattern PA2 of the second mask M2 with second exposure light EL2, a projection optical system PL that projects an image of the first pattern PA1 illuminated by the first exposure light EL1 and an image of the second pattern PA2 illuminated by the second exposure light EL2 onto the substrate P, and a control apparatus 100 that controls the operation of the overall exposure apparatus EX. The substrate stage 4 is capable of moving on a base member DP at adjacent the light emission side of the projection optical system PL, that is, the image plane side of the projection optical system PL. Furthermore, a storage device 102 that stores various information related to the exposure, and an annunciator 104 that is capable of announcing the condition of the exposure operation, are connected to the control apparatus 100. The annunciator 104 includes for example at least one of a display device such as a liquid crystal display, an enunciation that generates a sound (including an alarm), and a light emitting device that generates a light.

Substrate here includes one in which a photosensitive material (photoresist) is spread on a substrate of for example a semiconductor wafer, such as a silicon wafer, and includes one on which various types of membrane such as a protective membrane (top coat membrane) other than a photosensitive membrane is coated. The mask includes a reticle on which is formed a device pattern to be projected in a reduced size onto the substrate, and is for example, one where a predetermined pattern is formed using a light shielding membrane such as chrome or the like on a transparent member of for example a glass plate. The transmission type mask is not limited to a binary mask on which the pattern is formed by a light shielding membrane, and includes, for example, a half tone type or a phase shift mask such as a spatial frequency modulation type. Furthermore, in the present embodiment, a transmission type mask is used for the mask, however a reflection type mask may be used. Moreover, in the present embodiment, the first pattern PA1 and the second pattern PA2 are different patterns. Furthermore, the first and the second masks M1, M2 are not limited to the same type, and can have different type.

For example, one of the first and the second masks M1, M2 can be a binary mask and the other one can be a phase shift mask.

The projection optical system PL of the present embodiment has an optical element 20 on which the first exposure light EL1 from the first pattern PA1 and the second exposure light EL2 from the second pattern PA2 are incident. Here, in the embodiment, the optical element 20 is a combining optical element that combines the first and the second exposure lights EL1 and EL2, and can be termed a combining optical element 20 in follows. Moreover, the projection optical system PL of the present embodiment is capable of setting the first exposure field AR1 and the second exposure field AR2 in a predetermined positional relationship at adjacent the light emission side of the projection optical system PL, that is, the image side of the projection optical system PL, and illuminating the first exposure light EL1 and the second exposure light EL2 from the combining optical element 20 towards the first exposure field AR1 and the second exposure field AR2. Furthermore, the projection optical system PL is capable of forming an image of the first pattern PA1 on the first exposure field AR1, and is capable of forming an image of the second pattern PA2 on the second exposure field AR2.

The exposure apparatus EX of the present embodiment multiply exposes (double exposes) a shot field S on the substrate P with the first exposure light EL1 irradiated onto the first exposure field AR1, and the second exposure light EL2 irradiated onto the second exposure field AR2, via the projection optical system PL. More specifically, the exposure apparatus EX is capable of forming an image of the first pattern PA1 on the first exposure field AR1 by means of the first exposure light EL1 emitted from the first illumination system IL1 and irradiated onto the first exposure field AR1 via the first pattern PA1 and the projection optical system PL, and is capable of forming an image of the second pattern PA2 on the second exposure field AR2 by means of the second exposure light EL2 emitted from the second illumination system IL2 and irradiated onto the second exposure field AR2 via the second pattern PA2 and the projection optical system PL, and it multiply exposes the shot field S on the substrate P with the image of the first pattern PA1 and the image of the second pattern PA2.

Furthermore, the exposure apparatus EX of the present embodiment is a scanning type exposure apparatus (a so called scanning stepper) that projects the image of the first pattern PA1 of the first mask M1 and the image of the second pattern PA2 of the second mask M2 onto the substrate P, while the first mask M1 and the second mask M2, and the substrate P are simultaneously moved in a predetermined scanning direction. In the present embodiment, the scanning direction (the simultaneous movement direction) of the substrate P is the Y axis direction. The exposure apparatus EX, while moving the shot field S of the substrate P in the Y axis direction with respect to the first exposure field AR1 and the second exposure field AR2, respectively irradiates the first exposure light EL1 and the second exposure light EL2 onto the first exposure field AR1 and the second exposure field AR2 via the projection optical system PL, to thereby multiply expose the shot field S on the substrate P with the image of the first pattern PA1 formed by the first exposure light EL1 irradiated onto the first exposure field AR1, and the image of the second pattern PA2 formed by the second exposure light EL2 irradiated onto the second exposure field AR2. Furthermore, the exposure apparatus EX of the present embodiment, in synchronous with the movement in the Y axis direction of the substrate P, moves the first mask M1 in the Y axis direction, and moves the second mask M2 in the Z axis direction. That is, in the present embodiment, the scanning direction (synchronous movement direction) of the first mask M1 is the Y axis direction, and the scanning direction (synchronous movement direction) of the second mask M2 is the Z axis direction.

Furthermore, the exposure apparatus EX of the present embodiment comprises a detection device 108 that detects at least one of the first exposure light EL1 and the second exposure light EL2 other than that directed towards the first exposure field AR1 and the second exposure field AR2 from the combining optical element 20. In the embodiment, the detection device 108 detects a part of at least one of the first and the second exposure lights EL1 and EL2. The part of the first and the second exposure lights EL1, EL2 which are incident on the combining optical element 20 is emitted from the combining optical element 20 and is not directed towards the first exposure field AR1 nor the second exposure field AR2, that is, the part is directed towards a direction or a region different from the first and the second exposure fields AR1 and AR2. Furthermore, in the embodiment, at least one part of the detection device 108 is provided on a lens barrel PK of the projection optical system P1. It should be noted that at least one part of the detection device 108 may be arranged on a member different from the projection optical system PL (lens barrel PK), for example on a measurement frame (not shown in drawings) on which an alignment system that detects an alignment mark on a substrate is provided. In the embodiment, in order to conduct the light from the combining optical element 20 to the detection device 108, at least one optical element is arranged at between the combining optical element 20 and the detection device 108, but is not shown drawings for simplified description. In this regard, no optical element can be arranged at between the combining optical element 20 and the detection device 108 depending on the arrangement position of the detection device 108 or the type of the detection device 108.

The combining optical element 20 of the present embodiment includes a branching optical element (e.g., half mirror) that branches the respective optical paths of the first exposure light EL1 from the first pattern PA1 and the second exposure light EL2 from the second pattern PA2. The projection optical system PL irradiates a part of the first exposure light EL1 from the first pattern PA1 which is branched by the combining optical element (branching optical element) 20, and a part of the second exposure light EL2 from the second pattern PA2 which is branched by the combining optical element (branching optical element) 20 towards the first exposure field AR1 and the second exposure field AR2. Furthermore, from the combining optical element 20 is also generated a first exposure light EL1 which is not directed towards the first exposure field AR1 and a second exposure light EL2 which is not directed towards the second exposure field AR2. However the detection device 108 detects the quantity of light of the first exposure light EL1 and the second exposure light EL2 from the combining optical element 20, other than that directed towards the first exposure field AR1 and the second exposure field AR2.

At first is a description of the first and second illumination systems IL1 and IL2. The first illumination system IL1 illuminates a first illumination field IA1 on a first mask M1 held in the first mask stage 1, with first exposure light EL1 of a uniform luminance distribution. The second illumination system IL2 illuminates a second illumination field IA2 on a second mask M2 held in the second mask stage 2, with second exposure light EL2 of a uniform luminance distribution. For the first and second exposure lights EL1 and EL2 respectively emitted from the first and second illumination systems EL1 and IL2, for example emission lines (g-ray, h-ray, i-ray), emitted for example from a mercury lamp, deep ultraviolet beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm), may be used. In this embodiment, the ArF excimer laser beam is used for the first and second exposure lights EL1 and EL2.

The exposure apparatus EX of the present embodiment has a first light source device corresponding to the first illumination system IL1, and a second light source device corresponding to the second illumination system IL2. That is, the exposure apparatus EX of the present embodiment has a plurality of light source devices (laser emitting devices). Furthermore, the first illumination system IL1 illuminates the first pattern PA1 of the first mask M1 with the first exposure light EL1 of a random polarization (non polarized condition), and the second illumination system IL2 also illuminates the second pattern PA2 of the second mask M2 with the second exposure light EL2 of a random polarization (non polarized condition). The exposure light emitted from one light source device is branched into the first exposure light EL1 and the second exposure light EL2 by a branching optical element, and the first pattern PA1 and the second pattern PA2 may be illuminated by these first exposure light EL1 and second exposure light EL2. Furthermore, a part of the first illumination system IL1 may serve as the second illumination system IL2.

FIG. 2 is a schematic block diagram showing a part of a first light source device 41 and a first illumination system IL1. In FIG. 2, the first illumination system IL1 includes; a beam shaping optical system 42 that shapes the cross-section shape of the first exposure light (laser beam) EL1 emitted from the first light source device 41, and an energy adjuster 43 that adjusts the quantity of light (energy) of the first exposure light EL1 which has passed therethrough, a beam splitter 44 with a small reflectance and a large transmittance, and a blind device (masking system) 45 that defines the first illumination field IA1 of the first exposure light EL1 on the first mask M1. Furthermore, while not shown in the drawing, the first illumination system IL1 also includes; a transforming optical system which allows changing of the illumination condition for the first mask M1 with the first exposure light EL1, an illumination uniforming member (hereinafter referred to as "optical integrator", including for example a integrator having reflecting inner surfaces, or a fly-eye lens) which makes the illumination of the first exposure light EL1 uniform on the first mask M1, a relay optical system, and a condenser lens and the like. It should be noted that the first illumination system IL1 may include an aperture stop arranged at a pupil plane thereof. For example, in the case where the optical integrator is a fly-eye lens, the aperture stop is provided at light emitting plane (i.e., at a focal plane on light emitting side) of the fly-eye lens. Furthermore, the optical integrator is arranged for example between the transforming optical system and the beam splitter 44, and the condenser lens is arranged for example between the blind device 45 and the first mask M1. The transforming optical system is arranged between for example the energy adjuster 43 and the optical integrator and includes a diffractive optical element that is replaceable, and a plurality of prisms (e.g., Axicon prisms) that are capable of changing the space therebetween, and a zoom optical system (afocal system). The pupil plane of the first illumination system EL1 is optically conjugate with the pupil plane of the projection optical system PL, and the intensity distribution of the first exposure light EL1 on the pupil plane of the illumination system IL1 is changed by at least replacement of the diffractive optical element, movement of the prisms, and movement of the zoom optical system (i.e., the shape and/or size of the secondary light source formed on the pupil of the illumination system is changed.). Thus, the illumination condition for the first mask M1 is changed. That is, the first illumination system IL1 can set an illumination condition in accordance with the first pattern PA1 of the first mask M1, and can change the illumination condition in accordance with the changing of the pattern. It should be noted that the transforming optical system may include a polarization adjustment member which allows changing of polarization of the first exposure light EL1 in arbitrary state, and/or the aperture stop described above.

The first light source device 41 is constituted by an excimer laser light source device. As described above, in the present embodiment, as the first exposure light (laser beam) EL1 emitted from the first light source device 41, an ArF excimer laser light is used. The first exposure light EL1 which is emitted from the first light source device 41 and passes through the beam shaping optical system 42, is incident into the energy adjuster 43. The energy adjuster 43 adjusts the quantity of light (energy) of the first exposure light EL1 emitted from the energy adjuster 43. The energy adjuster 43 includes a plurality of neutral density filters, which may be referred to as ND filters, arranged on a revolver that is capable of rotating, and for which the transmittance with response to the first exposure light EL1 is different. The energy adjuster 43 can adjust the quantity of light (energy) of the first exposure light EL1 emitted from the energy adjuster 43, in multi-stages, by rotating the revolver and switching the ND filters arranged on the optical path of the first exposure light EL1. The energy adjuster 43 may adjust the quantity of light with stepless. The operation of the energy adjuster 43 is controlled in the control apparatus 100. The control apparatus 100 is capable of adjusting the quantity of light (cumulative exposure amount) of the first exposure light EL1 using the energy adjuster 43, based on the detection result of one of a detection device 108 and a measuring instrument 46 described later.

The first exposure light EL1 emitted from the energy adjuster 43 is branched into two by the beam splitter 44 for which the reflectance is small and the transmittance is large, via the aforementioned transforming optical system and optical integrator, and so forth. The first exposure light EL1 which has passed through the beam splitter 44 is incident into the blind device 45 via the relay optical system. The blind device 45 is capable of adjusting the first illumination field IA1 of the first exposure light EL1 on the first mask M1, and the first exposure field (projection field) AR1 of the first exposure light EL1 on the substrate P, and is provided on the optical path of the first exposure light EL1. The blind device 45 has an aperture 45K for passing the first exposure light EL1, and by means of the aperture 45K, the first illumination field IA1 of the first exposure light EL1 on the first mask M1, and the first exposure field AR1 of the first exposure light EL1 on the substrate P is set. At least part of the blind device 45, which is for example a plurality of shield plates (masking blades) each of which is capable of independently moving, is arranged on a plane being optically conjugate with a formation plane of the first pattern of the first mask M1 in the first illumination system IL1. By moving at least one of the shield plates, the size (width) and the like of the first illumination field IA1 on the first mask M1, which is equivalent to the first exposure field AR1 on the substrate P (which is projection field of the first pattern PA1 being conjugated with the first illumination field IA1 respect to the projection optical system PL) can be adjusted. Accordingly, the blind device 45 can control beginning and end of the scanning exposure with the first exposure light EL1 irradiated on the first exposure field AR1. Thus, unnecessary exposure, which is onto a different portion on the substrate P from one shot field corresponding to one scanning operation for multiply exposing, is prevented. In the embodiment, it should be noted that this unnecessary exposure may be prevented by controlling the first light source device 41. The first exposure light EL1 which has passed through the blind device 45 illuminates the first illumination field IA1 of a rectangular shape on the first mask M1 which is held on the first mask stage 1 with a uniform illumination distribution, via the relay optical system, the condenser lens, and so forth.

On the other hand, of the first exposure light EL1 which is incident into the beam splitter 44, the first exposure light EL1 which is reflected by the beam splitter 44 is measured by the measuring instrument 46 (which may be referred to as integrator sensor) via a convergent optical system or the like. The measuring instrument 46 measures the quantity of light (energy) of the first exposure light EL1, and is constituted for example by such as a photoelectric transducer. The measurement signal from the measuring instrument 46 is output to the control apparatus 100.

The first light source device 41 is a pulse laser light source device, which emits the first exposure light (laser beam) EL1 in a pulse form. Furthermore, the first light source device 41 can adjust the quantity of light (energy) of the emitted first exposure light EL1. More specifically, the first light source device 41 can adjust the energy of the first exposure light EL1 for each pulse. Furthermore, the first light source device 41 can adjust the pulse emission period (repetition frequency).

The first light source device 41 has a laser resonator 41A, abeam splitter 41B that irradiates the laser beam (first exposure light) EL1 emitted from the laser resonator 41A, an energy meter 41C that measures the energy of the laser beam via the beam splitter 41B, a laser controller 41D that adjusts the energy of the laser beam emitted from the laser resonator 41A, and a high voltage power supply 41E. The beam splitter 41B has a large transmittance and a small reflectance, and of the laser beams radiated pulsewise (i.e., released in a pulsate) from the laser resonator 41A, it emits the laser beam which has passed through the beam splitter 41B to the outside. On the other hand, the laser beam which is reflected by the beam splitter 41B is incident into the energy meter 41C comprising a photoelectric transducer, and is measured in the energy meter 41C.

The laser controller 41D and the control apparatus 100 are connected. The control apparatus 100 is capable of outputting a control signal to the laser controller 41D. In the preset embodiment, the control apparatus 100 outputs a control signal to the laser controller 41D based on the detection result of at least one of the detection device 108 and the measuring instrument 46. The laser controller 41D sets the power source voltage of the high voltage power supply 41E based on the control signal from the control apparatus 100, to thereby set the energy per 1 pulse of the laser beam emitted from the laser resonator 41A. That is to say, the control apparatus 100 also by controlling the first light source device 41 based on the detection result of at least one of the detection device 108 and the measuring instrument 46, is capable of adjusting the quantity of light (cumulative exposure) of the first exposure light EL1.

Furthermore, as described above, the laser beam discharged from the laser resonator 41A and reflected by the beam splitter 41B is measured by the energy meter 41C, and the measurement signal of the energy meter 41C is output to the laser controller 41D. The laser controller 41D adds this to the control signal from the control apparatus 100, and can also use the measurement signal from the energy meter 41C for energy control.

In the above, the first illumination system IL1 and the first light source device 41 have been described. Since the second illumination system EL2 and the second light source device also have substantially the same construction as the first illumination system IL1 and the first light source device 41, their description is omitted. It should be noted that the second illumination system EL2 also includes a transforming optical system which allows changing of the illumination condition of the second mask M2 with the second exposure light EL2. That is, by means of the transforming optical systems of the first and the second illumination systems IL1 and IL2, the illumination conditions can be set in accordance with the first pattern PA1 of the first mask M1 and the second pattern PA2 of the second mask M2 respectively in arbitrary, then for example different conditions between them can be set.

Next is a description of the first mask stage 1. The first mask stage 1 is moveable by drive of a first mask stage drive device 1D which includes an actuator such as for example a linear motor, in at least the X axis, the Y axis, and the θZ directions in a condition with the first mask M1 held. The first mask stage 1 holds the first mask M1 so that a first pattern forming surface formed with a first pattern PA1 of the first mask M1 is substantially parallel with the XY plane. Position information of the first mask stage 1 (and in turn the first mask M1) is measured by a laser interferometer 31 of a measurement system 3. The laser interferometer 31 measures the position information of the first mask stage 1 using a reflecting surface 31K of a moving mirror provided on the first mask stage 1. The control apparatus 100 drives the first mask stage drive device 1D based on the measurement result of the laser interferometer 31, to perform position control of the first mask M1 which is held on the first mask stage 1.

Next is a description of the second mask stage 2. The second mask stage 2 is moveable by drive of a second mask stage drive device 2D which includes an actuator such as for example a linear motor, in at least the Z axis, the X axis, and the θY directions in a condition with the second mask M2 held. The second mask stage 2 holds the second mask M2 so that a second pattern forming surface formed with a second pattern PA2 of the second mask M2 is substantially parallel with the XZ plane. Position information of the second mask stage 2 (and in turn the second mask M2) is measured by a laser interferometer 32 of the measurement system 3. The laser interferometer 32 measures the position information of the second mask stage 2 using a reflecting surface 32K of a moving mirror provided on the second mask stage 2. The control apparatus 100 drives the second mask stage drive device 2D based on the measurement result of the laser interferometer 32, to perform position control of the second mask M2 which is held on the second mask stage 2.

Figure 3A:
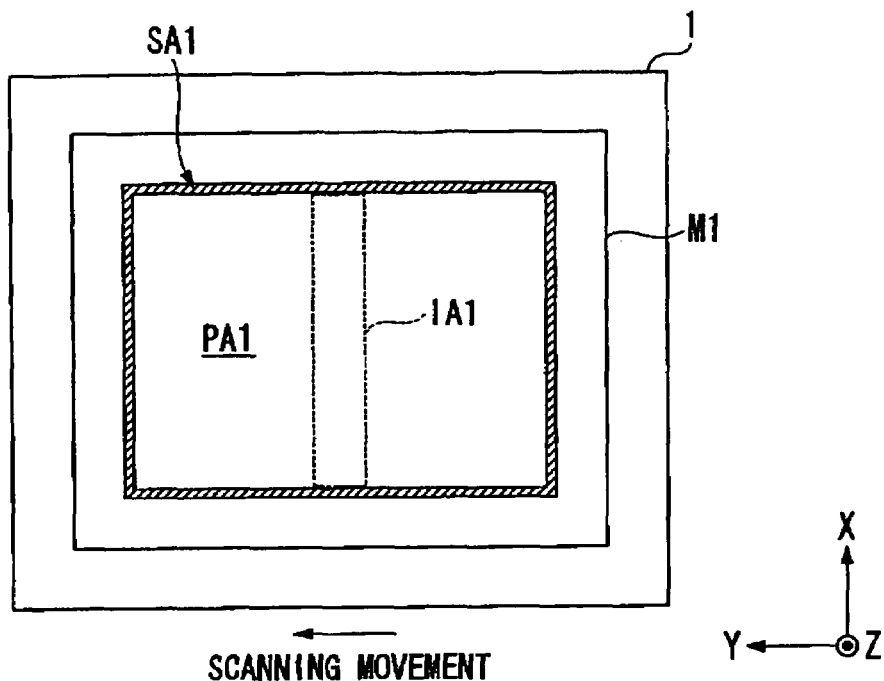
FIG. 3A shows an example of a first mask which is held in a first mask holder.
Figure 3B:
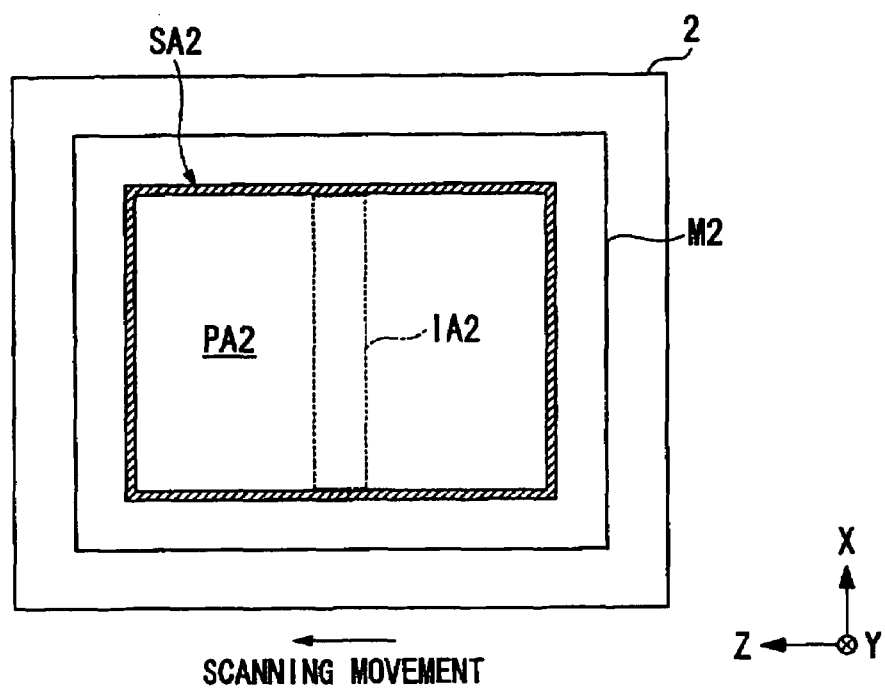
FIG. 3B shows an example of a second make which is held in a second mask holder.

FIG. 3A is a plan view showing the first mask M1 held on the first mask stage 1. FIG. 3B is a plan view showing the second mask M2 held on the second mask stage 2. As shown in FIG. 3A and FIG. 3B, the first mask stage 1 holds the first mask M1 so that the first pattern forming surface formed with the first pattern PA1 of the first mask M1 is substantially parallel with the XY plane. The second mask stage 2 holds the second mask M2 so that the second pattern forming surface formed with the second pattern PA2 of the second mask M2 is substantially parallel with the XZ plane. The first illumination field IA1 for the first exposure light EL1 on the first mask M1 is set in a rectangular shape (slit shape) with the X axis direction as the longitudinal direction. The second illumination field IA2 for the second exposure light EL2 on the second mask M2 is also set in a rectangular shape (slit shape) with the X axis direction as the longitudinal direction.

The first mask stage 1 is capable of moving the first mask M1 having the first pattern PA1 in the Y axis direction with respect to the first exposure tight EL1. Furthermore, the second mask stage 2 is capable of moving the second mask M2 having the second pattern PA2 in the Z axis direction with respect to the second exposure light EL2. The control apparatus 100, when exposing the substrate P, controls the first mask stage 1 so that a first pattern forming field SA1 of the first mask M1 in which is formed at least the first pattern PA1 passes through the first illumination field IA1 for the first exposure light EL1, and moves the first mask M1 in the Y axis direction. Furthermore, the control apparatus 100, when exposing the substrate P, controls the second mask stage 2 so that a second pattern forming field SA2 of the second mask M2 in which is formed at least the second pattern PA2 passes through the second illumination field IA2 for the second exposure light EL2, and moves the second mask M2 in the Z axis direction.

Next is a description of the projection optical system PL, with reference to FIG. 1. The projection optical system PL projects an image of the first pattern PA1 of the first mask M1 which is illuminated by the first exposure light EL1, and an image of the second pattern PA2 of the second mask M2 which is illuminated by the second exposure light EL2, onto the substrate P at a predetermined projection magnification. In the projection optical system PL of the present embodiment, the projection magnification is for example a reduction system of for example ¼, ⅕, or ⅛, and forms a reduced image of the mask pattern on the projection region conjugate with the aforementioned illumination field. The plurality of optical elements of the projection optical system PL are held by the lens barrel PK. Furthermore, at predetermined positions inside the lens barrel PK, in the present embodiment, close to the combining optical element 20, is provided a detection device 108 that is capable of detecting the quality of light of the first and second exposure lights EL1 and EL2.

The projection optical system PL of the present embodiment includes; a first optical system 11 that guides the first exposure light EL1 from the first pattern PA1 to the combining optical element 20, a second optical system 12 that guides the second exposure light EL2 from the second pattern PA2 to the combining optical element 20, and a third optical system 13 that respectively guides the first exposure light EL1 and second exposure light EL2 from the combining optical element 20 to the first exposure field AR1 and the second exposure field AR2. In the embodiment, the first exposure light EL1 and the second exposure light EL2 are entered to the combining optical element 20 from different directions (orthogonal directions with each other in the embodiment). Furthermore, by means of the combining optical element 20, at least a part of the first exposure light EL1 entered from via the first optical system 11 and at least a part of the second exposure light EL2 entered from via the second optical system 12 are both guided to the third optical system 13.

The first exposure light EL1 from the first pattern PA1 of the first mask M1 is incident onto the combining optical element 20 via the first optical system 11. As mentioned above, the combining optical element 20 includes a branching optical element (half mirror), and has a predetermined reflectance and transmittance. A part of the first exposure light EL1 from the first pattern PA1 passes through a predetermined surface 20A of the combining optical element 20 (branching optical element), and is guided to the first exposure field AR1 by the third optical system 13. On the other hand, the remaining part of the first exposure light EL1 from the first pattern PA1 is branched by the predetermined surface 20A of the combining optical element 20 (branching optical element), and detected in the detection device 108. Moreover, a part of the second exposure light EL2 from the second pattern PA2 is reflected by the predetermined surface 20A of the combining optical element 20 (branching optical element) and guided to the second exposure field AR2 by the third optical system 13. On the other hand, the remaining part of the second exposure light EL2 from the second pattern PA2 is passed through the predetermined surface 20A of the combining optical element 20 (branching optical element) and detected in the detection device 108.

Next is a description of the substrate stage 4. The substrate stage 4 is capable of holding and moving the substrate P within a predetermined field including the first exposure field AR1 and the second exposure field AR2 which are irradiated by the first exposure light EL1 and the second exposure light EL2. As shown in FIG. 1, the substrate stage 4 is supported in noncontact on the base member BP by means of for example an air bearing, and has a substrate holder 4H that holds the substrate P. The substrate holder 4H holds the substrate P so that the surface of the substrate P and the XY plane are substantially parallel. The substrate stage 4 can move the substrate P by drive of a substrate stage drive device 4D including an actuator such as for example a linear motor, in directions of 6 degrees of freedom of the X axis, the Y axis, the Z axis, the θX, the θY, and the θZ directions.

The position information of the substrate stage 4 (and in turn the substrate P) is measured by a laser interferometer 34 of the measurement system 3. The laser interferometer 34 measures the position information related to the X axis, the Y axis, and the θZ directions of the substrate stage using a reflecting surface 34K which is provided on the substrate stage 4. Furthermore, the surface information (position information related to the Z axis, the θX, and the θY directions) of the surface of the substrate P held on the substrate stage 4 is detected by a focus leveling system (not shown in the figure). The control apparatus 100 drives the substrate stage drive device 4D based on the measurement result of the laser interferometer 34, and the detection result of the focus leveling detection system, and performs position control of the substrate P held in the substrate stage 4.

Furthermore, the focus leveling system measures the position information of the substrate P in the Z axis direction at a plurality of measurement points respectively, to thereby detect the surface position of the substrate P, as described in for example U.S. Pat. No. 6,608,681 and the like. In the embodiment, at least a part of the measurement points are set within the first and the second exposure fields AR1 and AR2. However, all of the measurement points can be set outside the first and the second exposure fields AR1 and AR2 (or a liquid immersion region). Furthermore, the laser interferometer 34 can be able to measure position information of the substrate stage 4 in the Z axis, the θX and the θY directions. This is disclosed in detail for example in Published Japanese Translation No. 2001-510577 of PCT International Publication (corresponding PCT International Publication No. WO 1999/28790). In this case, it is not necessary to provide the focus leveling detection system so as to be able to measure the position information of the substrate P in the Z-axis direction during the exposure operation, and position control of the substrate P in relation to the Z axis, the θX and the θY directions can be performed using the measurement results of the laser interferometer 34, at least during the exposure operation.

Figure 4:
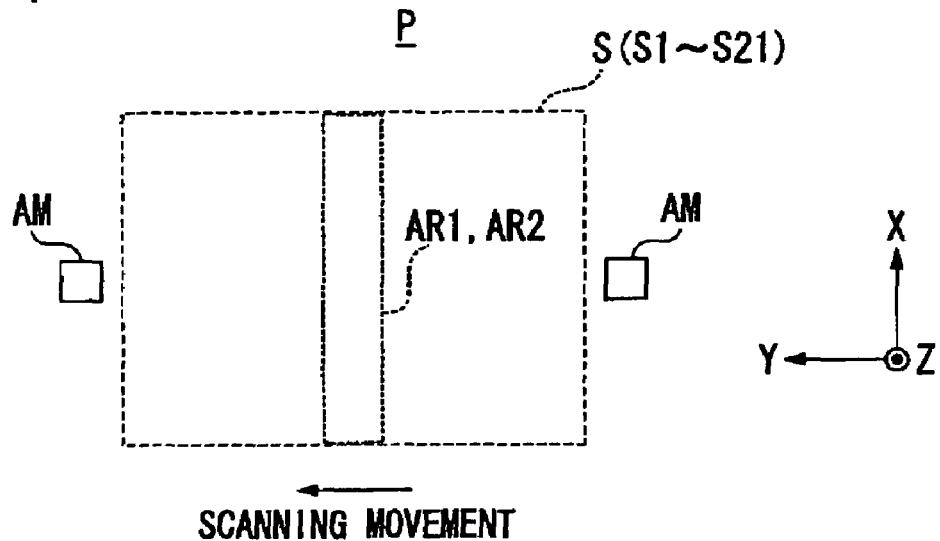
FIG. 4 is a schematic diagram showing a relationship between a shot field of a substrate and a first exposure field, according to the first embodiment.

FIG. 4 is a schematic diagram showing the positional relationship between the shot field S and the first and second exposure fields AR1 and AR2, on the substrate P. As shown in FIG. 4, the first exposure field AR1 for the first exposure light EL1 on the substrate P is set in a rectangular shape (slit shape) with the X axis direction as the longitudinal direction, and also the second exposure field AR2 for the second exposure light EL2 on the substrate P is set in a rectangular shape (slit shape) with the X axis direction as the longitudinal direction. In the present embodiment, the first exposure field AR1 which the first exposure light EL1 irradiates, and the second exposure field AR2 which the second exposure light EL2 irradiates, are the projection fields of the projection optical system PL. Furthermore, in the present embodiment, the first exposure field AR1 and the second exposure field AR2 are overlapped (coincidence). In FIG. 4 is also shown an alignment mark AM for detecting the position information of the shot field S on the substrate P. In the embodiment, the alignment marks AM are formed on both sides in the Y axis direction of the shot field S, however, the number and position of the alignment marks AM is not limited thereto.

The substrate stage 4 is capable of moving the shot field S on the substrate P in the Y axis direction with respect to the first exposure field AR1 and the second exposure field AR2. The control apparatus 100 controls the substrate stage 4 and moves the substrate P in the Y axis direction during exposure of the substrate P so that the shot field S on the substrate P passes through the first and second exposure fields AR1 and AR2 for the first and second exposure lights EL1 and EL2.

Figure 5:
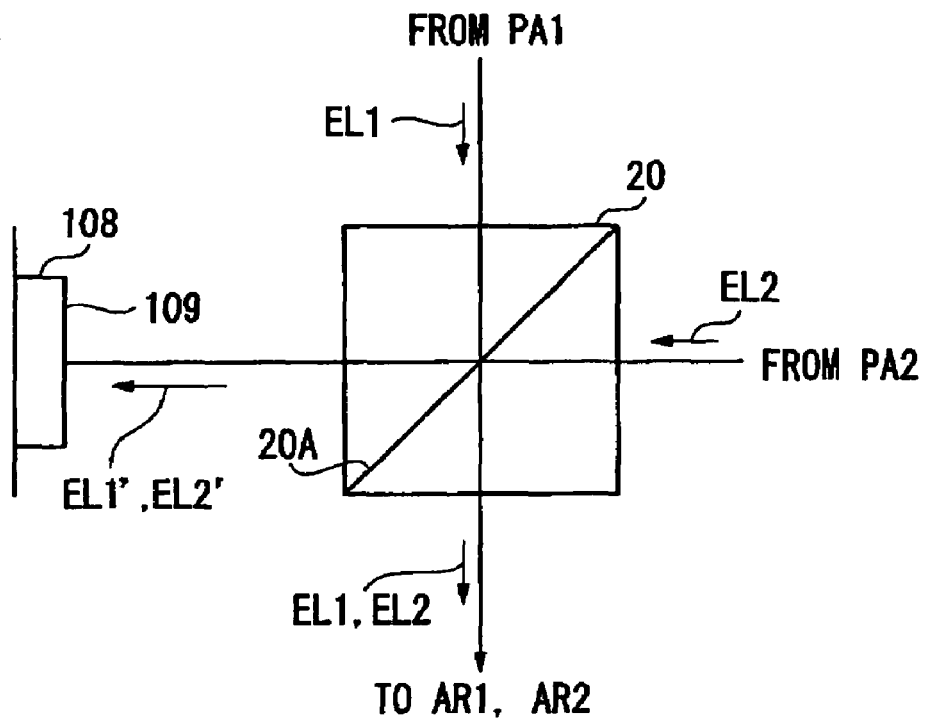
FIG. 5 shows a detection device according to the first embodiment.

FIG. 5 is a drawing for explaining the detection device 108. The detection device 108 is for detecting the first exposure light EL1 and the second exposure light EL2 other than that directed towards the first exposure field AR1 and the second exposure field AR2, from the combining optical element 20. As described above, in the present embodiment, a part of the first and second exposure lights EL1 and EL2 from the combining optical element 20 is directed towards the first and second exposure fields AR1 and AR2 on the substrate P, and the remain part is not directed towards the first and second exposure fields AR1 and AR2. The detection device 108 is able to detect at least one of the quantity of light (energy, cumulative exposure amount) of the first exposure light EL1 and the second exposure light EL2 other than that directed towards the first exposure field AR1 and the second exposure field AR2, from the combining optical element 20. The detection result of the detection device 108 is output to the control apparatus 100.

In the following description, the first exposure light EL1 other than that directed towards the first exposure field AR1 from the combining optical element 20 is appropriately called the first branch light EL1', and the second exposure light EL2 other than that directed towards the second exposure field AR2 from the combining optical element 20 is appropriately called the second branch light EL2'.

As shown in FIG. 5, the detection device 108 is arranged at a position where it is capable of detecting (capable of receiving) the first and second branch lights EL1' and EL2'. The detection device 108 includes for example a photoelectric transducer and the like that is capable of detecting the quantity of light (energy, cumulative exposure amount) of the first and second branch lights EL1' and EL2'.

The detection device 108 includes a detection surface (light receiving surface) 9 that is capable of detecting (capable of receiving light) the first and second branch lights EL1' and EL2'. The detection surface 9 of the detection device 108 is arranged at a position (or close to the position) that is optically conjugate with the object plane and the image plane of the projection optical system PL, that is, at a position (or close to the position) that is optically conjugate with the surface of the substrate P and the first and second forming surfaces of the first and second masks M1 and M2. Consequently, the first exposure light EL1 and the second exposure light EL2 are incident onto a position of the detection surface 9 of the detection device 108, corresponding to the positional relationship of the first exposure field AR1 and the second exposure field AR2 set on the image plane side of the projection optical system PL.

Figure 6:
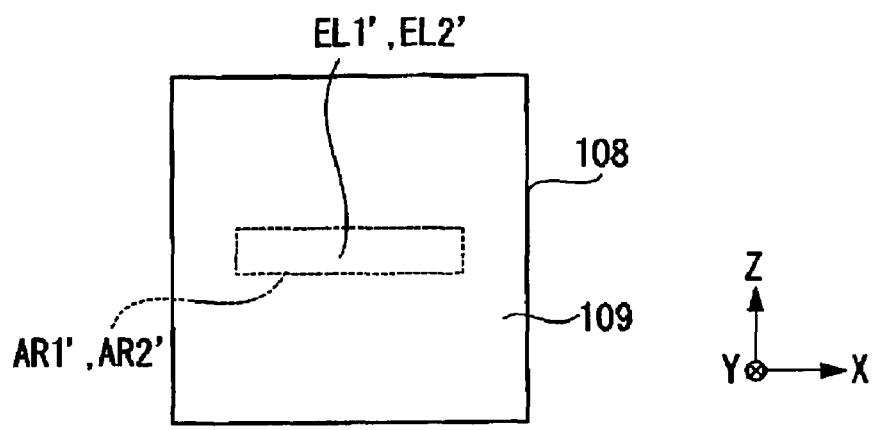
FIG. 6 shows a detection surface of the detection device according to the first embodiment

FIG. 6 shows the detection surface 9 of the detection device 108. In the case where the first and second exposure lights EL1 and EL2 are emitted by the first and second illumination systems IL1 and IL2, and incident on the projection optical system PL, then as shown in FIG. 6, the first exposure light EL1 (first branch light EL1') and the second exposure light EL2 (second branch light EL2') are incident onto a position of the detection surface 9 of the detection device 108, corresponding to the positional relationship of the first exposure field AR1 and the second exposure field AR2. As shown in FIG. 4, in the present embodiment, the first exposure field AR1 and the second exposure field AR2 are set on the substrate P so that the projection optical system PL double exposes the first exposure field AR1 and the second exposure field AR2. Consequently, a field AR1' illuminated by the first branch light EL1', and a field AR2' illuminated by the second branch light EL2', are formed so as to be superimposed on the detection surface 9 of the detection device 108 which is arranged at a position optically conjugate with the surface of the substrate P.

Here in the following description, the field AR1' of the detection surface 9 of the detection device 108, which is irradiated by the first branch light EL1' is appropriately called the first branch light field AR1', and the field AR2' which is irradiated by the second branch light EL2' is appropriately called the second branch light field AR2'.

Furthermore, for example when the first exposure light EL1 is emitted from the first illumination system IL1, and emission of the second exposure light EL2 from the second illumination system 12 is stopped, in other words, when only the first exposure light EL1 is incident on the projection optical system PL, then only the first branch light EL1' (first exposure light EL1) is irradiated onto the first branch light field AR1' of the detection surface 9 of the detection device 108. In this case, the detection device 108 can detect the quantity of light of the first branch light EL1'. Furthermore, when the second exposure light EL2 is emitted from the second illumination system IL2, and emission of the first exposure light EL1 from the first illumination system IL1 is stopped, in other words, when only the second exposure light EL2 is incident on the projection optical system PL, then only the second branch light EL2' (second exposure light EL2) is irradiated onto the second branch light field AR2' of the detection surface 9 of the detection device 108. In this case, the detection device 108 can detect the quantity of light of the second branch light EL2'. Moreover, when the first and second exposure lights EL1 and EL2 are emitted from both of the first and second illumination systems IL1 and IL2, in other words, when both of the first and second exposure lights EL1 and EL2 are incident on the projection optical system PL, then the first and second branch lights EL1' and EL2' (first and second exposure lights EL1 and EL2) are respectively irradiated onto the respective first and second branch light fields AR1' and AR2' of the detection surface 9 of the detection device 108. In this case, the detection device 108 can detect the sum of the quantity of light of the first branch light EL1' and the quantity of light of the second branch light EL2'.

Furthermore, in the storage device 102 is pre-stored information and the like related to the reflectance and transmittance of the combining optical element 20 (branching optical element), and information related to the optical characteristics of the combining optical element 20. Consequently, the control apparatus 100 can obtain the quantity of light of the first and second exposure lights EL1 and EL2 incident on the projection optical system PL from the first and second illumination systems IL1 and IL2, based on the detection result of the detection device 108, and the stored information of the storage device 102. That is to say, in the case where only the first branch light EL1' is incident on the detection surface 9 of the detection device 108, the control apparatus 100 can obtain the quantity of light of the first exposure light EL1 from the first illumination system IL1, incident on the projection optical system PL (the first optical system 11), based on the detection result of the detection device 108, and the stored information of the storage device 102 (the information related to the optical characteristics of the combining optical element 20). Similarly, in the case where only the second branch light EL2' is incident on the detection surface 9 of the detection device 108, the control apparatus 100 can obtain the quantity of light of the second exposure light EL2 from the second illumination system IL2, incident on the projection optical system PL (the second optical system 12), based on the detection result of the detection device 108, and the stored information of the storage device 102. Furthermore, in the case where the first and second branch lights EL1' and EL2' are respectively incident on the detection surface 9 of the detection device 108, the control apparatus 100 can obtain the sum of the quantity of light of the first and second exposure lights EL1 and EL2 from the first and second illumination systems IL1 and IL2, incident on the projection optical system PL, based on the detection result of the detection device 108, and the stored information of the storage device 102.

Furthermore, in the case where only the first branch light EL1' is incident on the detection surface 9 of the detection device 108 in a condition with the first mask M1 held on the first mask stage 1, and the first pattern PA1 positioned on the optical path of the first exposure light EL1, the control apparatus 100 can obtain the quantity of light of the first exposure light EL1 incident on the projection optical system PL (the first optical system 11) from the first illumination system IL1, via the first pattern PA1, based on the detection result of the detection device 108, and the stored information of the storage device 102 (e.g., the information related to the optical characteristics of the combining optical element 20). Similarly, in the case where only the second branch light EL2' is incident on the detection surface 9 of the detection device 108 in a condition with the second mask M2 held on the second mask stage 2, and the second pattern PA2 positioned on the optical path of the second exposure light EL2, the control apparatus 100 can obtain the quantity of light of the second exposure light EL2 incident on the projection optical system PL (the second optical system 12) from the second illumination system IL2, via the second pattern PA2, based on the detection result of the detection device 108, and the stored information of the storage device 102. Moreover, in the case where the first and second branch lights EL1' and EL2' are respectively incident on the detection surface 9 of the detection device 108 in a condition with the first and second masks M1 and M2 respectively held on the first and second mask stages 1 and 2, and the first and second patterns PA1 and PA2 positioned on the respective optical paths of the first and second exposure lights EL1 and EL2, the control apparatus 100 can obtain the sum of the quantity of light of the first and second exposure lights EL1 and EL2 incident on the projection optical system PL from the first and second illumination systems IL1 and IL2, via the first and second patterns PA1 and PA2, based on the detection result of the detection device 108, and the stored information of the storage device 102.

Furthermore, the control apparatus 100 can obtain the pattern density of the first pattern PA1 (or the transmittance with respect to the first exposure light EL1 of the first pattern PA1) formed on the first mask M1, based on the measurement result of the measuring instrument 46 provided in the first illumination system IL1, and the detection result of the detection device 108 provided in the projection optical system PL, for when the first exposure light EL1 is emitted from the first illumination system IL1 in a condition with the first mask M1 held in the first mask stage 1 and the first pattern PA1 positioned on the optical path of the first exposure light EL1. Similarly, the control apparatus 100 can obtain the pattern density of the second pattern PA2 (or the transmittance with respect to the second exposure light EL2 of the second pattern PA2) formed on the second mask M2, based on the measurement result of the measuring instrument 46 provided in the second illumination system IL2, and the detection result of the detection device 108 provided in the projection optical system PL, for when the second exposure light EL2 is emitted from the second illumination system IL2 in a condition with the second mask M2 held in the second mask stage 2 and the second pattern PA2 positioned on the optical path of the second exposure light EL2.

Moreover, in the storage device 102 is pre-stored information and the like related to the reflectance and transmittance of the combining optical element 20, and information related to the optical characteristics of the combining optical element 20. Consequently, the control apparatus 100 can obtain the quantity of light of the first and second exposure lights EL1 and EL2 directed towards the first and second exposure fields AR1 and AR2 from the combining optical element 20, based on the detection result of the detection device 108, and the stored information of the storage device 102. That is to say, in the case where only the first branch light EL1' is incident on the detection surface 9 of the detection device 108, the control apparatus 100 can obtain the quantity of light of the first exposure light EL1 directed towards the first exposure field AR1 from the combining optical element 20, based on the detection result of the detection device 108, and the stored information of the storage device 102 (the information related to the optical characteristics of the combining optical element 20). Similarly, in the case where only the second branch light EL2' is incident on the detection surface 9 of the detection device 108, the control apparatus 100 can obtain the quantity of light of the second exposure light EL2 directed towards the second exposure field AR2 from the combining optical element 20, based on the detection result of the detection device 108, and the stored information of the storage device 102. Furthermore, in the case where the first and second branch lights EL1' and EL2' are respectively incident on the detection surface 9 of the detection device 108, the control apparatus 100 can obtain the sum of the quantity of light of the first and second exposure lights EL1 and EL2 directed towards the first and second exposure fields AR1 and AR2 from the combining optical element 20, based on the detection result of the detection device 108 and the stored information of the storage device 102.

Next is a description of the method of exposing the substrate P using the exposure apparatus EX having the above construction.

Once adjustment and the like of the positional relationship of the first pattern PA1 of the first mask M1, the second pattern PA2 of the second mask M2, and the shot field S on the substrate P, and predetermined processing has been completed, the control apparatus 100 starts exposure of the shot field S of the substrate P.

In the present embodiment, the control apparatus 100, while synchronously moving the first mask M1 and the second mask M2 by the first mask stage 1 and the second mask stage 2 in the respective scanning directions (Y axis direction and Z axis direction), and moving the substrate P by means of the substrate stage 4 in the scanning direction (Y axis direction), illuminates the respective first pattern PA1 of the first mask M1 and the second pattern PA2 of the second mask M2 with the first exposure light EL1 and the second exposure light EL2, and irradiates the first exposure light EL1 and the second exposure light EL2 on the respective first exposure field AR1 and second exposure field AR2 on the substrate P to multiply expose the shot field S of the substrate P.

The control apparatus 100, while synchronously moving the substrate P in the Y axis direction with respect to the first and second exposure fields AR1 and AR2, moving the first mask M1 in the Y axis direction with respect to the first illumination field IA1, and moving the second mask M2 in the Z axis direction with respect to the second illumination field IA2, respectively illuminates the first exposure field AR1 and the second exposure field AR2 with the first exposure light EL1 and the second exposure light EL2, and multiply exposes the shot field S on the substrate P. In the present embodiment, during exposure of the substrate P, in the case where the first mask M1 is moved for example in the +Y direction, the second mask M2 is moved in the +Z direction, and the substrate P is moved in the +Y direction.

Figure 7:
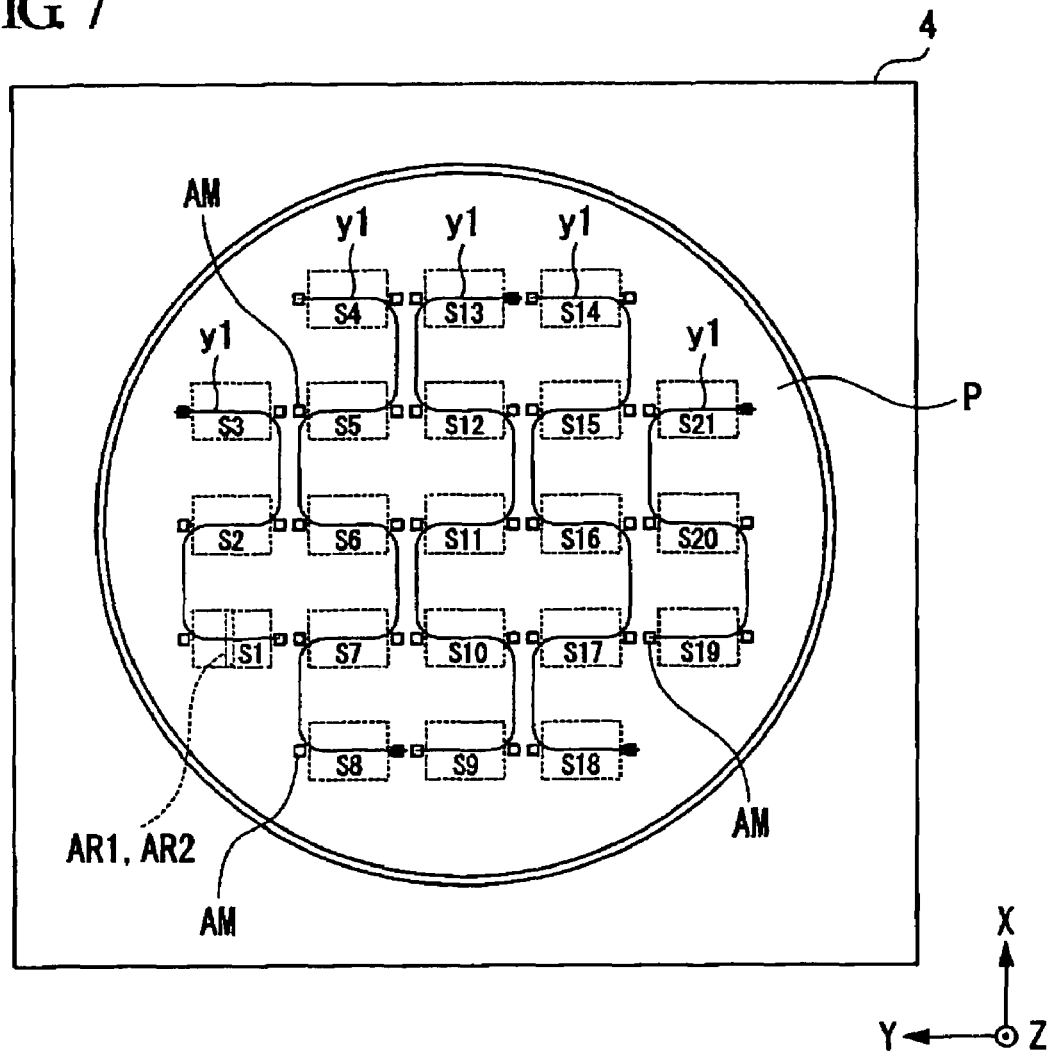
FIG. 7 is a view of a substrate stage as seen from above for illustrating an example of an exposure operation.

FIG. 7 is a plan view of the substrate stage 4 holding the substrate P. As shown in FIG. 7, a plurality of shot fields S1 through S21 serving as exposure target fields, are provided in matrix form on the substrate P, and a plurality of alignment marks AM are provided so as to respectively correspond to the shot fields S1 through S21. When the respective shot fields S1 through S21 of the substrate P are exposed, the control apparatus 100 irradiates the first and second exposure lights EL1 and EL2 on the substrate P by irradiating the first and second exposure lights EL1 and EL2 on the first and second exposure fields AR1 and AR2 while relatively moving the first and second exposure fields AR1 and AR2 and the substrate P as shown for example by the arrows y1 in FIG. 7. The control apparatus 100 controls the operation of the substrate stage 4 so that the first and second exposure fields AR1 and AR2 move along the arrows y1 with respect to the substrate P. The control apparatus 100 sequentially multiply exposes the plurality of shot fields S1 through S21 on the substrate P in step and scan method, by repeating the scanning operation in the −Y direction of the substrate P and the scanning operation in the +Y direction.

In the present embodiment, in one round of the scanning operation, one shot field S on the substrate P can be multiply exposed (double exposed) by the image of the first pattern PA1 and the image of the second pattern PA2. The photosensitive material layer of the shot field S on the substrate P is multiply exposed (double exposed) by the first exposure light EL1 irradiated onto the first exposure field AR1, and the second exposure light EL2 irradiated onto the second exposure field AR2.

In the present embodiment, the control apparatus 100 executes the detection operation of the first branch light EL1' and the second branch light EL2' by the detection device 108, in parallel with the exposure operation with respect to the substrate P. That is to say, during exposure of the substrate P, the control apparatus 100 detects the quantity of light of the first and second branch lights EL1' and EL2' using the detection device 108, and in turn the quantity of light of the first and second exposure lights EL1 and EL2 incident on the projection optical system PL via the first and second patterns PA1 and PA2 (the sum of the quantities of light of the first and second exposure lights EL1 and EL2).

In the storage device 102 is previously stored information related to the tolerance value (the tolerance range) of the quantity of light of the first and second exposure lights EL1 and EL2 which are incident on the projection optical system PL via the first and second patterns PA1 and PA2. That is to say, in order to expose the substrate P in a desired state, a tolerance value (tolerance range) related to the quantity of light of the first and second exposure lights EL1 and EL2 determined for example from the characteristics of the photoresist which is applied to the substrate P is stored. This tolerance value (tolerance range) of the quantity of light can be previously obtained for example by experiment or by simulation.

The control apparatus 100 can control at least one of the irradiation conditions of the first exposure light EL1 and the second exposure light EL2 during exposure of the substrate P, based on the detection result of the detection device 108. More specifically, the control apparatus 100 can adjust the amount of light of at least one of the first exposure light EL1 and the second exposure light EL2 during exposure of the substrate P, so that the quantity of light of the first and second exposure lights EL1 and EL2 is kept within the tolerance range, based on the detection result of the detection device 108.

In order to adjust the quantity of light of the first exposure light EL1 incident on the projection optical system PL, the control apparatus 100 controls the energy adjuster 43 provided for example in the first illumination system IL1, as described with reference to FIG. 2, to thereby be able to adjust the quantity of light of the first exposure light EL1 emitted from the first illumination system IL1, and in turn the quantity of light of the first illumination system IL1 incident on the projection optical system PL. Similarly, in order to adjust the quantity of light of the second exposure light EL2 incident on the projection optical system PL, the control apparatus 100 controls the energy adjuster 43 provided in the second illumination system IL2, to thereby be able to adjust the quantity of light of the second exposure light EL2 emitted from the second illumination system IL2, and in turn the quantity of light of the second illumination system IL2 incident on the projection optical system PL.

Furthermore, during exposure of the substrate P, in the case where, based on the detection result of the detection device 108, the quantity of light of the first and second exposure lights EL1 and EL2 is determined to be abnormal, the control apparatus 100 can give for example an alarm using the annunciator 104. As described above, the annunciator 104 includes a display, an enunciation device, a light emitting device, and so forth, and gives an alarm by a predetermined method. As a result, by means of this alarm, the annunciator 104 can incite execution of appropriate processing by an operator or the like. Furthermore, in the case where, based on the detection result of the detection device 108, the quantity of light of the first and second exposure lights EL1 and EL2 is determined to be abnormal, the control apparatus 100 can stop irradiation of the first and second exposure lights EL1 and EL2. As a result, a condition where the exposure operation continues with an abnormal quantity of light can be avoided.

Furthermore, as described above, the exposure apparatus EX sequentially exposes each of the plurality of shot fields S1 through S21 provided on the substrate P. However the control apparatus 100 can associate the detection result of the detection device 108 with the shot fields S1 through S21, and store this in the storage device 102. By so doing, a cause of generation of a deficiency occurring on the shot fields S1 through S21, for example after exposure of the substrate, can be avoided by using the memory information of the storage device 102. That is to say, in a shot field S which is exposed when the quantity of light of the first and second exposure lights EL1 and EL2 is abnormal, there is concern of generation of a deficiency such as deterioration of the exposure accuracy of the shot field S. However in this case, the cause of generation of the deficiency can be specified using the above-mentioned memory information. Then appropriate processing corresponding to the cause of generation of the specified deficiency can be quickly implemented.

Furthermore, based on the analysis results using the memory information of the storage device 102, the control apparatus 100 can remove a shot field S where there is the possibility of occurrence of faulty pattern transfer caused by an abnormality of the quantity of light of the first and second exposure lights EL1 and EL2, or can implement processing such as not exposing at the time of the next superposition exposure. Moreover, in the case where the shot field S is inspected and there is no abnormality in the formed pattern, the shot field S is not removed, and device fabrication using that shot field S is continued. Alternatively, the control apparatus 100 may make an association with that shot field S, and when that shot field S is exposed, give a signal by the annunciator 104 to the effect that the quantity of light of the first and second exposure lights EL1 and EL2 is abnormal. Furthermore, the control apparatus 100 can also display the detection result of the detection device 108 on a display of the annunciator 104 in real time as the monitor information. Moreover, the detection result of the detection device 108 which is associated with the shot field S and stored, can also be displayed on the display of the annunciator 104.

As described above, in the present embodiment, by irradiating the respective first exposure light EL1 and second exposure light EL2 on the respective first exposure field AR1 and second exposure field AR2, and moving the substrate P in the Y axis direction so that the shot field S on the substrate P passes through the first exposure field AR1 and the second exposure field AR2, the shot field S on the substrate P can be multiply exposed with good efficiency. In the present embodiment, when the shot field S on the substrate P is multiply exposed (double exposed), in one round of the scanning operation, one shot field S can be exposed by the image of the first pattern PA1 and the image of the second pattern PA2, and the throughput can be improved. Moreover, by repeating the scanning operation in the −Y direction on the substrate P and the scanning operation in the +Y direction, the plurality of shot fields S on the substrate P can be multiply exposed with good efficiency. Furthermore, as shown in FIG. 7, one shot field S can be multiply exposed in one round of the scanning operation. Therefore the image of the first pattern PA1 and the image of the second pattern PA2 within the respective shot fields S can be formed with a desired positional relationship.

Furthermore, in the present embodiment, by detecting the quantity of light of the first and second branch lights EL1' and EL2' from the combining optical element 20 with the detection device 108, information related to the quantity of light of the first and second exposure lights EL1 and EL2 incident from the first and second illumination systems EL1 and IL2 on the projection optical system PL, or the quantity of light of the first and second exposure lights EL1 and EL2 from the combining optical element 20 directed towards the first and second exposure fields AR1 and AR2, or the change in the quantity of light (change in the exposure dose) of the first and second exposure lights EL1 and EL2 irradiated onto the substrate P can be obtained. Moreover, based on the detection result of the detection device 108, a way can be devised for appropriate processing in order to favorably expose the substrate P.

Furthermore, during exposure of the substrate P, by detecting the quantity of light of the first and second exposure lights EL1 and EL2 using the detection device 108, adjustment of the quantity of light of the first and second exposure lights EL1 and EL2 during exposure of the substrate P can be performed based for example on the detection result of the detection device 108, and the substrate P can be exposed with a desired quantity of light. Furthermore, by storing the detection result of the detection device 108 associated with the shot fields S1 through S21 on the substrate P, then after exposure of the substrate P, the results can be analyzed using the memory information of the storage device 102.

In the present embodiment, as the combining optical element 20, a branching optical element (half mirror) which branches the respective optical paths of the first exposure light EL1 and the second exposure light EL2 is used. This branching optical element can favorably branch the exposure light even if for example the exposure light which is used is random polarized light.

Figure 8:
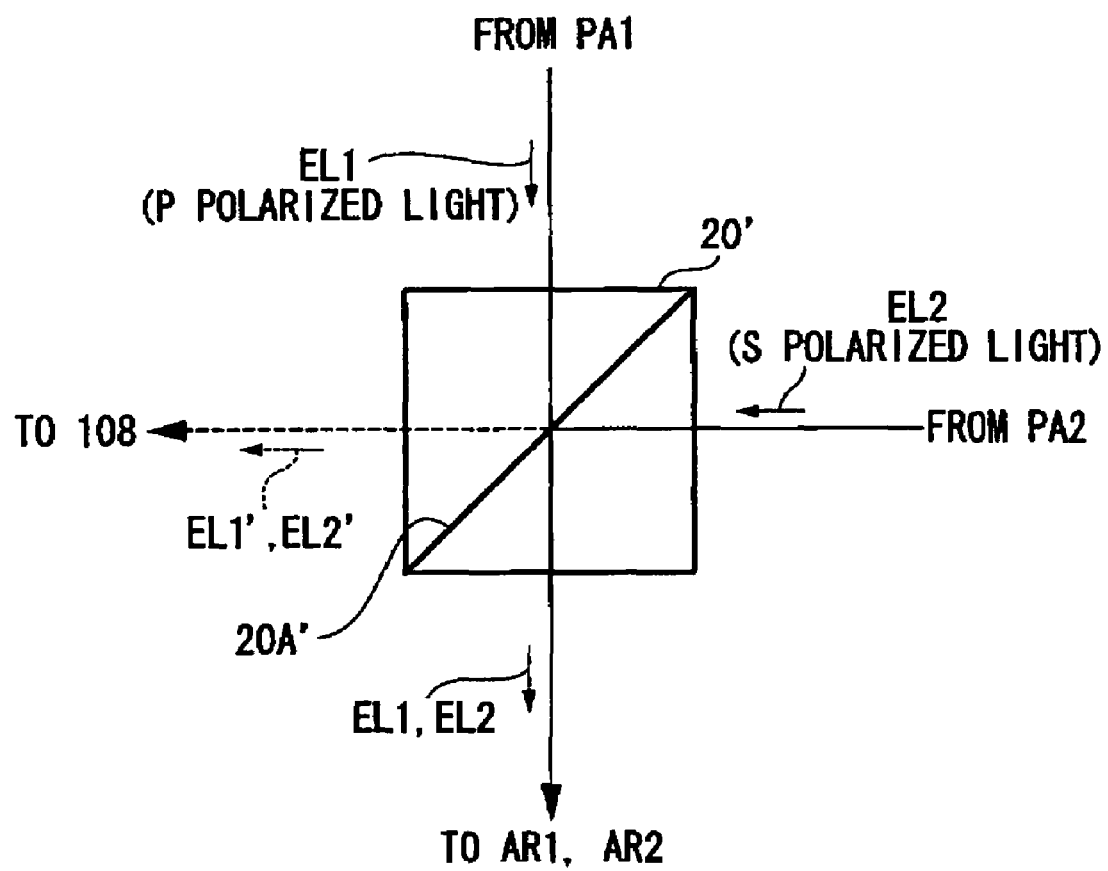
FIG. 8 shows another example of a combining optical element.

As in the schematic diagram shown in FIG. 8, as the combining optical element 20', a polarization dissociation optical element (for example optical beam splitter) that dissociates the respective first exposure light EL1 and the second exposure light EL2 into exposure light of a first polarization (for example P polarized light), and exposure light of a second polarization (for example S polarized light) may be used. For example, in the case where the first illumination system IL1 illuminates the first pattern PA1 with the first exposure light EL1 of the P polarized light condition, and the second illumination system IL2 illuminates the second pattern PA2 with the second exposure light EL2 of the S polarized light condition, then with respect to the combining optical element (optical beam splitter) 20', the first exposure light EL1 of the P polarized light from the first pattern PA1 is incident thereon, and the second exposure light EL2 of the S polarized light condition from the second pattern PA2 is incident thereon. In the case where a predetermined surface (polarization dissociation surface) 20A' of the combining optical element 20' is formed so as to reflect the exposure light of the S polarized light condition, and pass the exposure light of the P polled light condition, then most of the first and second exposure lights EL1 and EL2 from the combining optical element 20' is irradiated onto the first and second exposure fields AR1 and AR2 on the substrate P. However a part of the first and second exposure lights EL1 and EL2 may become the first and second branch lights EL1' and EL2'. In this case also, in the case where the optical characteristics such as the degree of polarization of the combining optical element (polarization beam splitter) 20' are previously know, the control apparatus 100 can obtain the quantity of light of the first and second exposure lights EL1 and EL2 based on the detection result of the detection device 108.

In the present embodiment the control apparatus 100 performs adjustment of the quantity of light of the first and second exposure lights EL1 and EL2 during exposure of the substrate P, based on the detection result of the detection device 108. Of course, when exposure of the substrate P is not being performed, the control apparatus 100 can use the detection device 108 to detect the quantity of light of the first and second exposure lights EL1 and EL2, or based on the detection result thereof, can adjust the quantity of light of the first and second exposure lights EL1 and EL2 emitted from the first and second illumination systems IL1 and IL2. For example, before starting exposure of the substrate P, in a condition with the emission of the second exposure light EL2 from the second illumination system IL2 stopped, the first exposure light EL1 is emitted by the first illumination system IL1, and the quantity of light of the first exposure light EL1 (the first branch light EL1') is detected. Then, based on the detection result of the detection device 108, the control apparatus 100 uses the energy adjuster 43 or the like of the first illumination system IL1 so as to obtain the first exposure light EL1 of a desired quantity of light, and adjusts the quantity of light of the first exposure light EL1. Similarly, regarding the control apparatus 100, before starting exposure of the substrate P, in a condition with the emission of the first exposure light EL1 from the first illumination system IL1 stopped, the second exposure light EL2 is emitted by the second illumination system IL2, and the quantity of light of the second exposure light EL2 (the second branch light EL2') is detected. The control apparatus 100, based on the detection result of the detection device 108, uses the energy adjuster 43 or the like of the second illumination system IL2 so as to obtain the second exposure light EL2 of a desired quantity of light, and can adjust the quantity of light of the second exposure light EL2. By so doing, the substrate P can be exposed with the first and second exposure lights EL1 and EL2 having an optimized quantity of light. In the present embodiment, the first exposure field AR1 and the second exposure field AR2 are disposed on the substrate P so as to be superimposed (be coincident with each other), however only a part of the first exposure field AR1 and a part of the second exposure field AR2 may be superimposed to be disposed.

Second Embodiment

A second embodiment is described. In the following description, components the same as or similar to the above-mentioned first embodiment are denoted by the same reference symbols, and their description is simplified or omitted.

Figure 9:
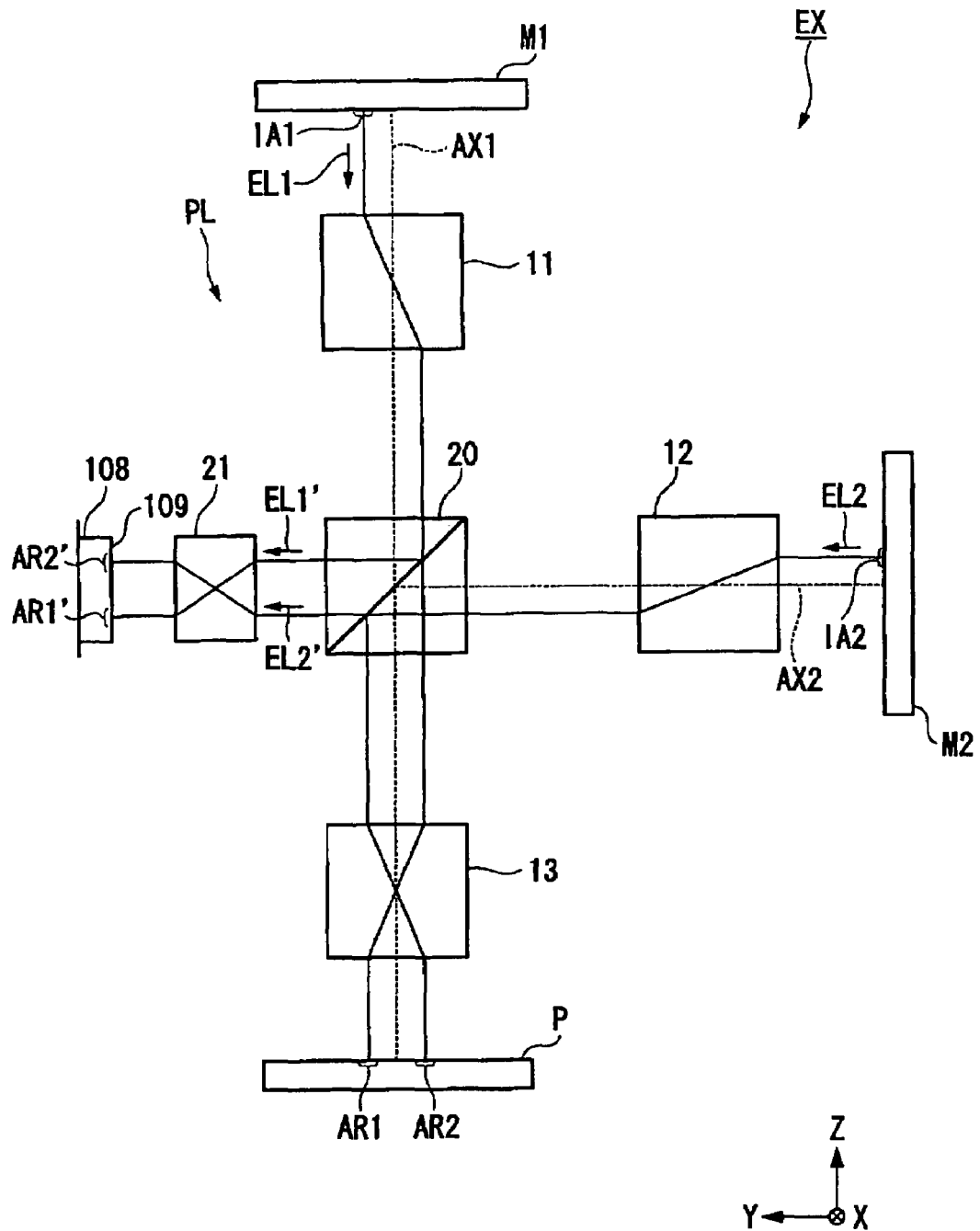
FIG. 9 shows an exposure apparatus according to a second embodiment.
Figure 10:
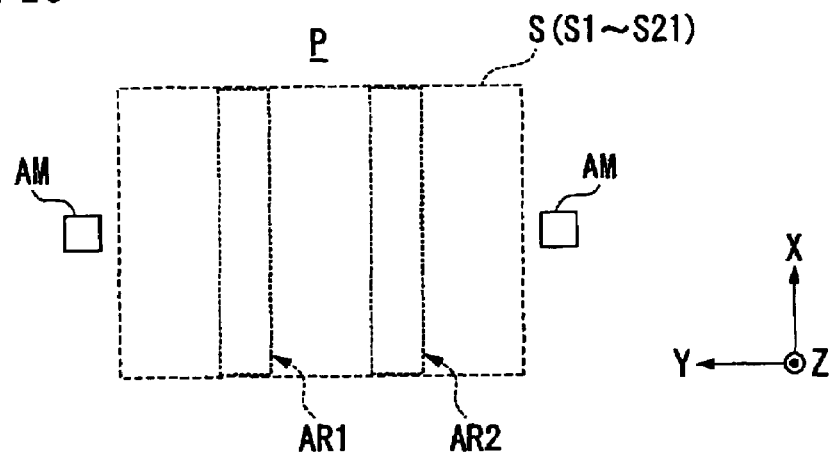
FIG. 10 is a schematic diagram showing a relationship between a shot field of a substrate and first and second exposure fields, according to the second embodiment.

FIG. 9 is a schematic block diagram showing an exposure apparatus EX according to the second embodiment, and FIG. 10 is a schematic diagram showing the positional relationship of the shot field S and the first and second exposure fields AR1 and AR2, on the substrate P according to the second embodiment. As shown in FIG. 9, the exposure apparatus EX of this embodiment, has a first illumination field IA1 on a first mask M1, and an optical axis AX1 of a first optical system 11 displaced, and has a second illumination field IA2 on a second mask M2, and an optical axis AX2 of a second optical system 12 displaced. In this case, as shown in FIG. 10, the first exposure field AR1 and the second exposure field AR2 are set in different positions within the field of the projection optical system PL. More specifically, the first exposure field AR1 and the second exposure field AR2 are arranged separated for example in relation to the Y axis direction (the scanning direction of the substrate P). Furthermore, the first exposure field AR1 and the second exposure field AR2 can be simultaneously positioned on a single shot field S. That is to say, in the present embodiment, the distance in the Y axis direction between the first exposure field AR1 (center of the first exposure field AR1) and the second exposure field AR2 (center of the second exposure field AR2) is smaller than the width in the Y axis direction of the single shot field S on the substrate P.

Figure 11:
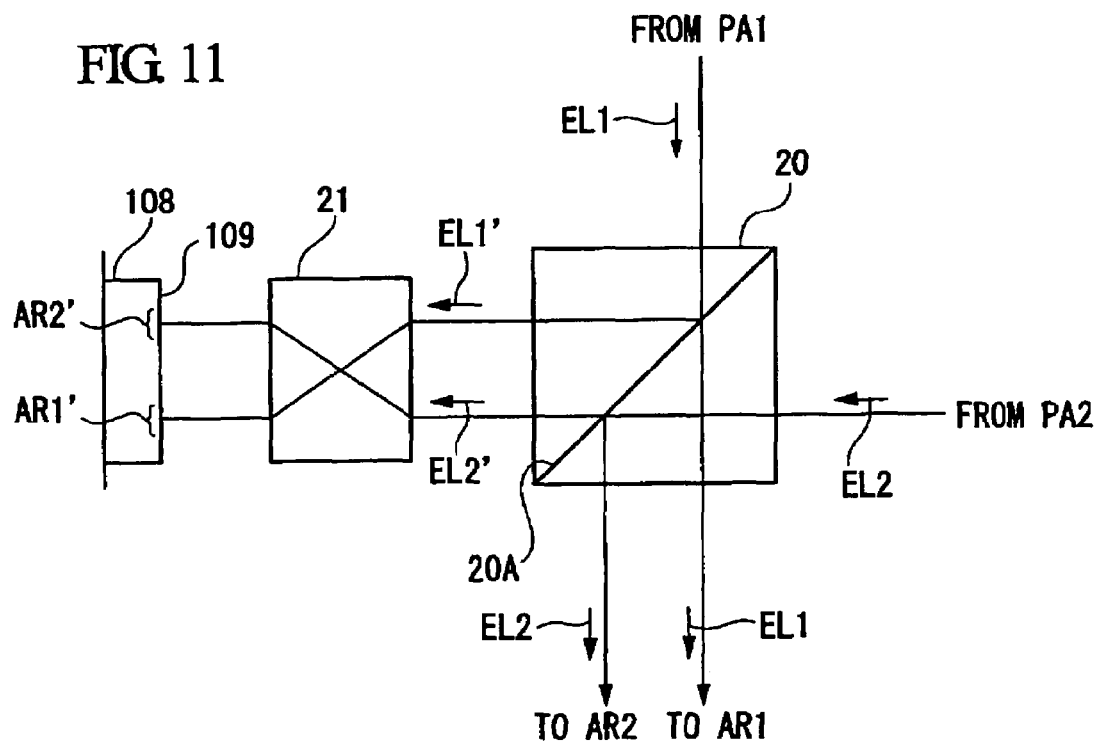
FIG. 11 shows a detection device according to the second embodiment.
Figure 12:
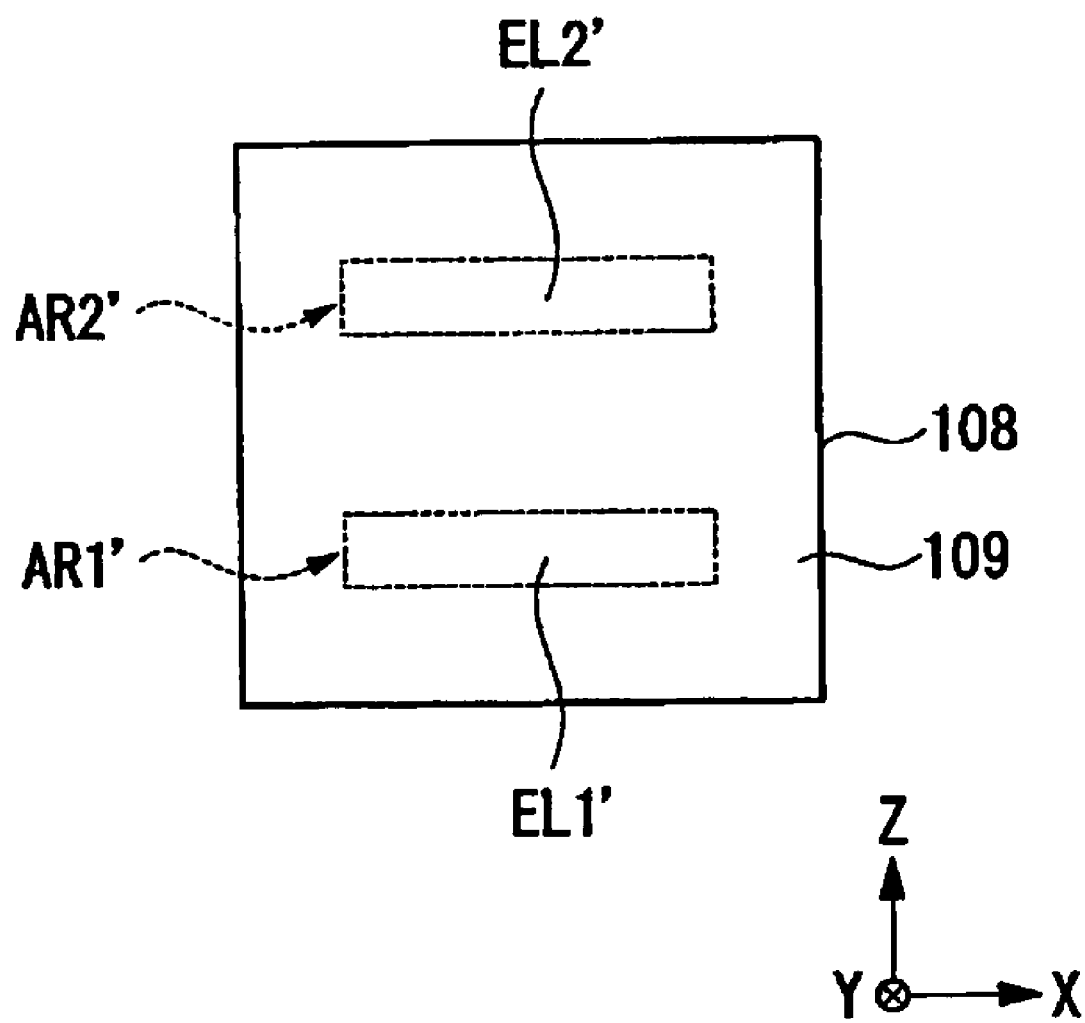
FIG. 12 shows a detection surface of the detection device according to the second embodiment

FIG. 11 shows the vicinity of a detection device 108 according to the second embodiment, and FIG. 12 shows the detection surface of the detection device 108. As shown in FIG. 11, in the present embodiment, an image forming optical system 21 is disposed between a combining optical element 20 and the detection surface 9. In this embodiment also, the detection surface 9 of the detection device 108 is arranged at an optically conjugate position (or the vicinity thereof) to the surface of the substrate P. Consequently, the first exposure light EL1 and the second exposure light EL2 are incident onto a position of the detection surface 9 of the detection device 108, corresponding to the positional relationship of the first exposure field AR1 and the second exposure field AR2 set on the image plane side of the projection optical system PL. As shown in FIG. 10, in the present embodiment, the projection optical system PL sets the first exposure field AR1 and the second exposure field AR2 respectively on the substrate P so that the first exposure field AR1 and the second exposure field AR2 are separated in the Y axis direction. Consequently the first branch light EL1' and the second branch light EL2' are respectively incident on the first branch light field AR1' and the second branch light field AR2' of the detection surface 9 of the detection device 108 arranged at the optically conjugate position to the surface of the substrate P, which are set at two different positions to each other corresponding to the positional relationship between the first exposure field AR1 and the second exposure field AR2.

Forming two branch light fields on the detection surface 9 of one detection device 108 is not limiting, and each of the first branch light field AR1' and the second branch light field AR2' may be formed on the detection surface of two detection devices.

In the present embodiment, the first branch light field AR1' and the second branch light field AR2' are set at different positions to each other on the detection surface 9. The detection device 108 can detect the quantity of light of the first exposure light EL1 (first branch light EL1') and the quantity of light of the second exposure light EL2 (second branch light EL2') separately. That is to say, in the aforementioned first embodiment, since the first branch light field AR1' and the second branch light field AR2' were superimposed, then in order to detect the quantity of light of the first exposure light EL1 (first branch light EL1') it was necessary to stop irradiation of second exposure light EL2, and in order to detect the quantity of light of the second exposure light EL2 (second branch light EL2') it was necessary to stop irradiation of first exposure light EL1. However in the present embodiment, detection of the quantity of light of the first exposure light EL1 (first branch light EL1') and detection of the quantity of light of the second exposure light EL2 (second branch light EL2') can be performed at substantially the same time.

Furthermore, the control apparatus 100 can execute adjustment of the quantity of light of the first exposure light EL1, and adjustment of the quantity of light of the second exposure light EL2, based on the detection result of the detection device 108, for example during exposure of the substrate P. Of course, the control apparatus 100 can also execute adjustment of the quantity of light of the first exposure light EL1, and adjustment of the quantity of light of the second exposure light EL2 before exposure of the substrate P, based on the detection result of the detection device 108.

In the second embodiment, in the case where the first exposure light EL1 and the second exposure light EL2 pass through different positions of the pupil plane of the projection optical system PL, the quantity of light of the first exposure light EL1 and the second exposure light EL2 on this pupil plane may also be detected.

In the abovementioned first and second embodiments, the exposure light emitted from one light source device is branched into the first exposure light EL1 and the second exposure light EL2 by the branching optical element, and the first pattern PA1 and the second pattern PA2 may be illuminated by these first exposure light EL1 and second exposure light EL2. In this case, by arranging a light quantity adjusting member that is capable of adjusting the quantity of light, for example a neutral density filter (ND filter) on the light path of each of the first and second exposure lights EL1 and EL2, the quantity of light of each of the first and second exposure lights EL1 and EL2 can be adjusted.

In the first and second embodiments, the adjustment of the quantity of light of exposure lights (EL1, EL2) is executed by means of at least one of the light source and the energy adjuster 43 based on the detection result of the detection device 108. However, instead of the adjustment of the exposure lights, or in combination with the adjustment, other operation for example a control of the amount of exposure on the substrate and/or an adjustment of the imaging state of the pattern image on the substrate (including the imaging characteristic of the projection optical system PL) or the like can be executed. In the control of the exposure amount, for example, an intensity of the exposure light within the exposure field (AR1, AR2) and an intensity of the exposure light detected by the detection device 108 are associated with each other.

Then in the exposure operation, based on the association (e.g., intensity ratio) and the detection result of the detection device 108, at least one of the intensity of the exposure light, the oscillating frequency, the width of the exposure field in scanning direction, and scanning speed for the substrate can be adjusted by using the light source, the energy adjuster 43, the blind device 45, and substrate stage 4. Furthermore, in the adjustment of the pattern image, for example, the imaging characteristics (including for example, aberration, magnification, focus position) of the projection optical system PL is determined based on the detection results of the detection device 108, and then at least one of the light source and an imaging characteristic adjusting apparatus which is not shown in figures is controlled. In this case, the light source adjusts the wavelength characteristic (including for example, center wavelength and spectrum width) of the exposure light. The imaging characteristic adjusting apparatus moves at least one of the optical elements of the projection optical system PL to adjust the imaging characteristics of the projection optical system PL, as disclosed in for example, U.S. Pat. No. 6,235,438, and U.S. Patent Application, Publication No. 2005/0206850.

Furthermore, in the above described first and second embodiments, the detection device 108 detects the amount of light of for example the exposure light. However, the target characteristic of the detection is not limited to the amount of light, and can include other characteristics, for example, a polarized state of the exposure light, a wavelength characteristic, a transmissivity of the projection optical system PL, a imaging characteristic of the pattern image, a positional relationship between the first and the second patterns PA1 and PA2, and position information (including projection position) of the first and second patterns PA1 and PA2. In this case, the detection device 108 can include one sensor or a plurality of sensors which corresponds to the target characteristic of the detection. The detection result from the detection device 108 is used for an operation (e.g., alignment operation) in association with the target characteristic of the detection.

Third Embodiment

A third embodiment is described with reference to FIG. 13 to FIG. 15. In the following description, components the same as or similar to the abovementioned embodiments are denoted by the same reference symbols, and their description is simplified or omitted.

Figure 13:
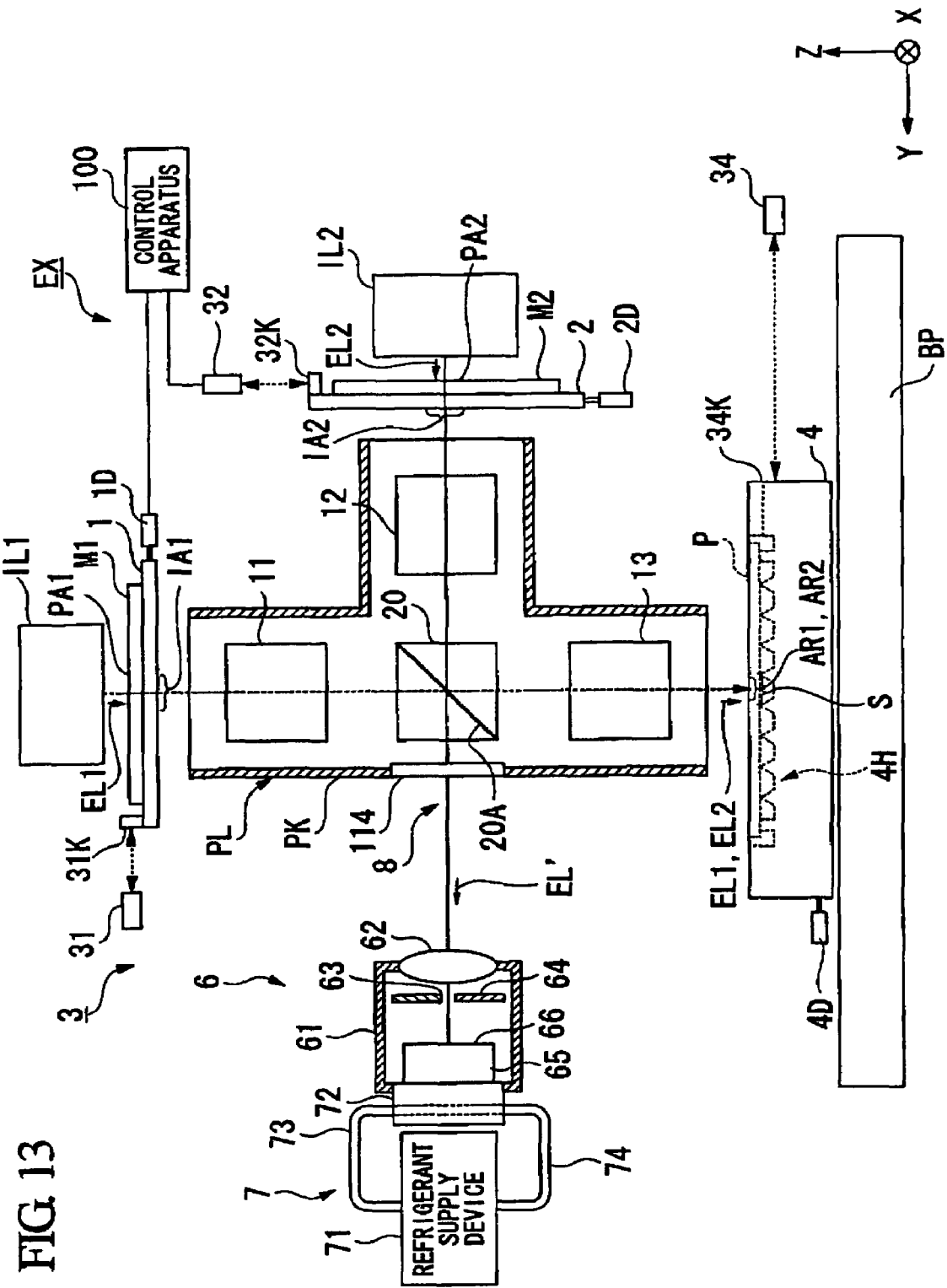
FIG. 13 is a schematic block diagram showing an exposure apparatus according to a third embodiment.

In FIG. 13, the exposure apparatus EX of this embodiment comprises a processing device 6 that processes at least one of the first exposure light EL1 and the second exposure light EL2 other than that directed towards the first exposure field AR1 and the second exposure field AR2, from the combining optical element 20. The combining optical element 20 of the present embodiment includes a branching optical element (e.g., half mirror) that branches the respective optical paths of the first exposure light EL1 from the first pawn PA1 and the second exposure light EL2 from the second pattern PA2. The projection optical system PL irradiates a part of the first exposure light EL1 from the first pattern PA1 which is branched by the combining optical element (branching optical element) 20, and a part of the second exposure light EL2 from the second pattern PA2 which is branched by the combining optical element (branching optical element) 20 towards the first exposure field AR1 and the second exposure field AR2. Furthermore, from the combining optical element 20 is also generated a first exposure light EL1 which is not directed towards the first exposure field AR1 and a second exposure light EL2 which is not directed towards the second exposure field AR2. However the processing device 6 processes the first exposure light EL1 and the second exposure light EL2 other than that directed towards the first exposure field AR1 and the second exposure field AR2, from the combining optical element 20.

The first exposure light EL1 from the first pattern PA1 of the first mask M1 is incident onto the combining optical element 20 via the first optical system 11. As mentioned above, the combining optical element 20 includes a branching optical element (e.g., half mirror). A part of the first exposure light EL1 from the first pattern PA1 passes through a predetermined surface 20A of the combining optical element 20 (branching optical element), and is guided to the first exposure field AR1 by the third optical system 13. On the other hand, the remaining part of the first exposure light EL1 from the first pattern PA1 is reflected by the predetermined surface 20A of the combining optical element 20 (branching optical element), and optically guided to the outside of the projection optical system PL by a guidance optical system 8 including a later mentioned transmission member 114. Moreover, a part of the second exposure light EL2 from the second pattern PA2 is reflected by the predetermined surface 20A of the combining optical element 20 (branching optical element) and guided to the second exposure field AR2 by the third optical system 13. On the other hand, the remaining part of the second exposure light EL2 from the second pattern PA2 is passed through the predetermined surface 20A of the combining optical element 20 (branching optical element) and optically guided to the outside of the projection optical system PL by the guidance optical system 8.

In the vicinity of the combining optical element 20 at the lens barrel PK of the projection optical system PL, is provided a transmission member (transmission window) 114 that is capable of passing the first and second exposure lights EL1 and EL2. The transmission member 114 is for example, a plane parallel plate formed from quartz, and that is capable of passing the first and second exposure lights EL1 and EL2. The first exposure light EL1 from the first pattern PA1 reflected by the predetermined surface 20A of the combining optical element 20 is optically guided to the outside of the lens barrel PK of the projection optical system PL by the guidance optical system 8 including the transmission member 114. Furthermore, the second exposure light EL2 from the second pattern PA2 which has passed through the predetermined surface 20A of the combining optical element 20 is optically guided to the outside of the lens barrel PK of the projection optical system PL by the guidance optical system 8 including the transmission member 114.

Figure 14:
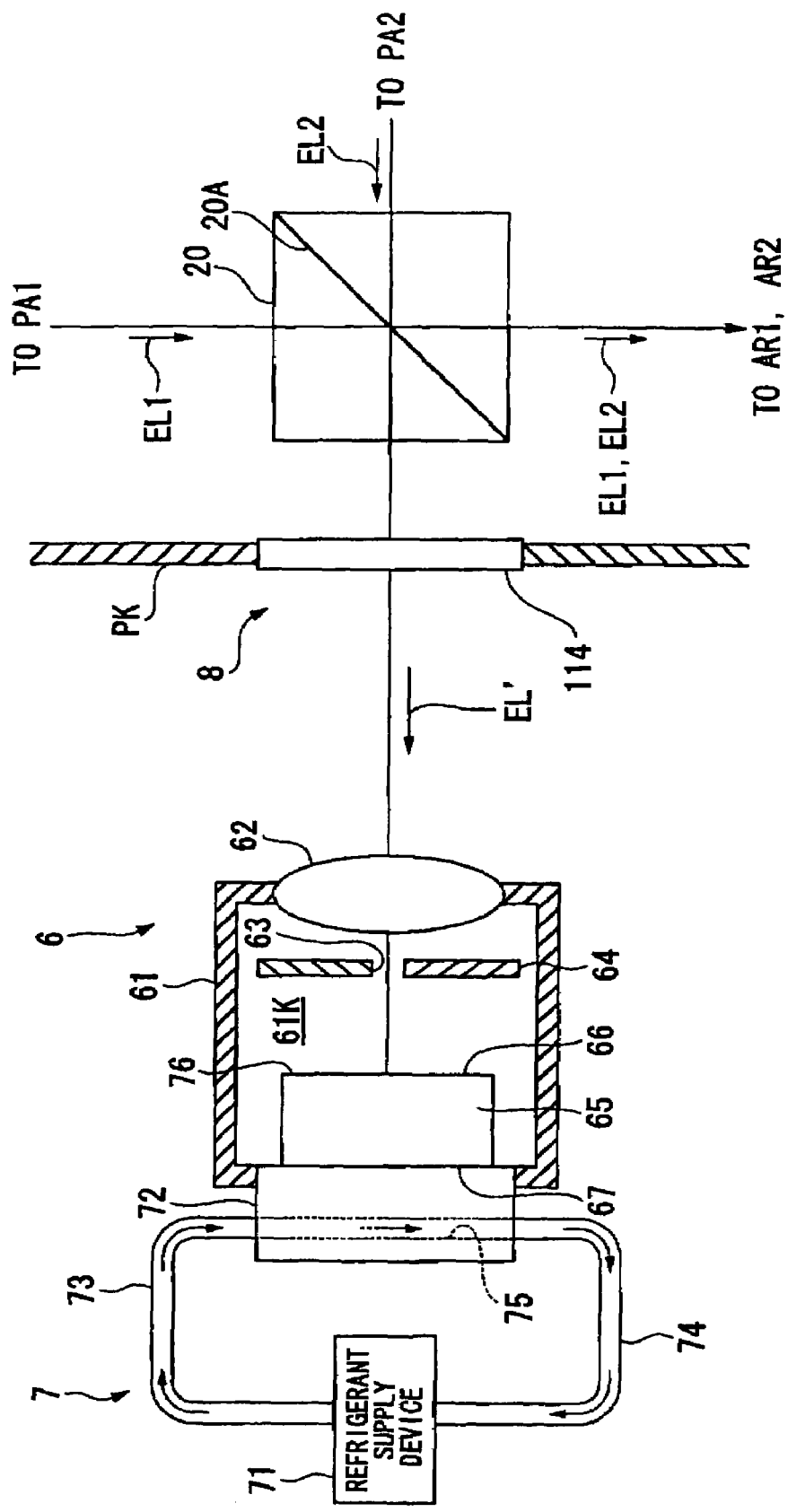
FIG. 14 shows a processing device according to the third embodiment.

FIG. 14 is a diagram for explaining the processing device 6. The processing device 6 is for processing the first exposure light EL1 and the second exposure light EL2 other than that directed towards the first exposure field AR1 and the second exposure field AR2, from the combining optical element 20. As described above, in the present embodiment, a part of the first and second exposure lights EL1 and EL2 from the combining optical element 20 is directed towards the first and second exposure fields AR1 and AR2 on the substrate P, and the remaining part is not directed towards the first and second exposure fields AR1 and AR2. If the first and second exposure lights EL1 and EL2 which are not directed towards the first and second exposure fields AR1 and AR2 are neglected, these are likely to have an influence on the exposure accuracy. For example, the first and second exposure lights EL1 and EL2 which are not directed towards the first and second exposure fields AR1 and AR2 are irradiated onto a predetermined portion of the lens barrel PK, this may give rise to a temperature change of the lens barrel PK, so that the lens barrel PK is thermally deformed, and the positions of the optical elements held in the lens barrel PK changes, and the optical characteristics of the projection optical system PL are changed. Furthermore, the first and second exposure lights EL1 and EL2 which are not directed towards the first and second exposure fields AR1 and AR2 gives rise to a temperature change or refractive index change of the optical path of the first and second exposure lights EL1 and EL2 directed towards the first and second exposure fields AR1 and AR2, so that there is a possibility of a change in the optical characteristics of the projection optical system PL, and deterioration of the image of the pattern projected on the substrate P. Furthermore, there is the possibility that the first and second exposure lights EL1 and EL2 which are not directed towards the first and second exposure fields AR1 and AR2 are reflected by the inner wall or the like of the lens barrel PK and incident on the substrate P as unwanted exposure light (flare). Moreover, there is the possibility that the first and second exposure lights EL1 and EL2 which are not directed towards the first and second exposure fields AR1 and AR2, will illuminate for example various sensors arranged at predetermined positions, or will give rise to a temperature change of the environment in which these sensors are placed. In this case, there is the possibility of the occurrence of erroneous detection results for the sensor, and also the possibility of a deterioration in the accuracy of exposure performed based on the detection results.

Therefore, in the present embodiment, so as to suppress the influence on the exposure accuracy due to at least one of the first exposure light EL1 and the second exposure light EL2 other than that directed towards the first exposure field AR1 and the second exposure field AR2, from the combining optical element 20, more specifically so as to suppress fluctuations in the optical characteristics of the projection optical system PL, or a deterioration in the detection accuracy of the respective sensors, the processing device 6 processes the first exposure light EL1 and the second exposure light EL2 other than that dieted towards the first exposure field AR1 and the second exposure field AR2, from the combining optical element 20.

In the following description, at least one of the first exposure light EL1 and the second exposure light EL2 other than that directed towards the first exposure field AR1 and the second exposure field AR2, from the combining optical element 20, is appropriately called leakage exposure light EL'.

As shown in FIG. 14, the processing device 6 is for processing the leakage exposure light EL', and comprises a guidance optical system 8 that optically guides the first exposure light EL1, to the outside of the lens barrel PK of the projection optical system PL, and an absorption member 65 that is capable of absorbing the leakage exposure light EL', arranged on the outside of the lens barrel PK of the projection optical system PL. The guidance optical system 8 includes a transmission member 114 provided in the vicinity of the combining optical element 20 of the lens barrel PK, and the leakage exposure light EL' is guided to the outside of the projection optical system PL via the transmission member 114. For the guidance optical system 8, a predetermined optical element may be arranged for example between the combining optical element 20 and the transmission member 114, or in the vicinity of the transmission member 114 on the outside of the lens barrel PK. For example, as the predetermined optical element, an optical element (including a reflection element) which does not irradiate the leakage exposure light EL' from the combining optical element 20 on the inner wall or the like of the lens barrel PK, and which favorably guides the first branch light EL1' generated from the combining optical element 20 to the transmission member 114, may be arranged on the outside of the lens barrel PK.

In the present embodiment, the processing device 6 guides the leakage exposure light EL', which is guided to the outside of the projection optical system PL by the guidance optical system 8, to the absorption member 65 arranged on the outside of the projection optical system PL. The absorption member 65 comprises an absorption surface 66, and the leakage exposure light EL' is absorbed by the absorption surface 66. The absorption member 65 is formed from for example chrome or the like, and has a function for converting the absorbed light (the leakage exposure light EL') into heat and retaining this heat.

Furthermore, the processing device 6 has a convergent optical system 62 provided on the outside of the lens barrel PK, that focuses the leakage exposure light EL' that has passed through the transmission member 114, onto the absorption surface 66 of the absorption member 65. The convergent optical system 62 is arranged between the absorption surface 66 of the absorption member 65, and the transmission member 114. That is to say, the absorption surface 66 of the absorption member 65 is directed to the outside of the convergent optical system 62. The leakage exposure light EL' which is guided to the outside of the projection optical system PL via the transmission member 114 by means of the convergent optical system 62, is efficiently absorbed in the absorption member 65 without diffusing to the surroundings.

Furthermore, the processing device 6 comprises a holding member 61 that holds the convergent optical system 62. A space 61K is formed on the inside of the holding member 61, and in the present embodiment, the absorption member 65 is arranged in the space 61K of the holding member 61. That is to say, in the present embodiment, the absorption member 65 is surrounded by the holding member 61. The holding member 61 has an insulation function. That is to say, for example on the outside face (or the inside face) of the holding member 61 there is provided an insulation material. As mentioned above, the absorption member 65 converts the absorbed light (leakage exposure light ELL) into heat, and retains this heat. However, there is the possibility of a temperature rise due to the retained heat (heating value). By enclosing the absorption member 65 in the holding member 61 having the insulation function, then for example even if there is a temperature rise of the absorption member 65, the heat of the absorption member 65 can be prevented from having an influence on the surrounding environment.

The processing device 6 is provided between the convergent optical system 62 and the absorption surface 66 of the absorption member 65, and is furnished with a pin hole member 64 having a pin hole 63 that passes the leakage exposure light EL'. The pin hole member 64 is arranged in the space 61K of the holding member 61. The leakage exposure light EL' which is guided to the outside of the projection optical system PL via the transmission member 114, is focused by the convergent optical system 62, and then irradiated onto the absorption surface 66 of the absorption member 65 via the pin hole 63 of the pin hole member 64. Even if the leakage exposure light EL' which is focused by the convergent optical system 62 and irradiated onto the absorption surface 66 of the absorption member 65 is reflected by the absorption surface 66, reflected leakage exposure light EL' can be prevented from returning to the projection optical system PL side, by the pin hole member 64. Instead of the provision of the pin hole member 64, or in combination with the provision, for example, an antireflection film may be formed on the absorption surface 66, or a light trap member onto which the leakage exposure light EL' reflected from the absorption surface 66 is incident may be provided. Furthermore, the guidance optical system 8 is not limited to the above configuration. In addition, the guidance optical system 8 can be omitted according to for example the constitution and/or the arrangement of the processing device 6. In the embodiment, at least a part of the processing device 6 is provided at other member from the lens barrel PK, for example at the above mentioned measurement frame. However, the at least the part may be provided on the lens barrel PK. Furthermore, the processing device 6 is not limited to the above mentioned constitution. For example, only the absorption member 65 or the light trap member and the like alternatively may be provided on the lens barrel PK instead of the transmission member 114, according to the amount of light of the leakage exposure light EL'.

Furthermore, the processing device 6 is provided with a heat processing device 7 that draws the heat from the absorption member 65. As described above, the absorption member 65 which has absorbed the leakage exposure light EL' retains the heat and is likely to have a temperature rise. However the heat processing device 7 has a function for capturing the heat of the absorption member 65.

In the present embodiment, the heat processing device 7 has a function of a cooling device that cools the absorption member 65. The heat processing device 7 comprises; a heat absorption member 72 having a contact surface 76 that connects to a surface 67 of the absorption member 65, on the opposite side to the absorption surface 66, an internal flow path 75 formed inside of the absorption member 72, and a refrigerant supply device 71 that supplies refrigerant to the internal flow path 75 via a supply pipe 73. The supply pipe 73 is connected to one part of the internal flow path 75, and a recovery pipe 74 that recovers the refrigerant that has flowed through the internal flow path 75 is connected to another part of the internal flow path 75. The refrigeration which is recovered by the recovery pipe 74 is returned to the refrigerant supply device 71.

The heat processing device 7 can cool the heat absorption member 72 by supplying refrigerant to the internal flow path 75 via the supply pipe 73. The contact surface 76 of the heat absorption member 72 is connected to the surface 67 of the absorption member, and the heat absorption member 72 can absorb (recover) the heat of the absorption member 65 via the surface 67 of the absorption member, and the contact surface 76. That is to say, the heat processing device 7 can suppress the temperature rise of the absorption member 65, by exchanging heat via the surface 67 and the contact surface 76, between the heat absorption member 72 which is cooled by the refrigerant, and the absorption member 65 which is heated by irradiation of the leakage exposure light EL'. Furthermore, the heat processing device 7 flows the refrigerant in the circulatory system including the supply pipe 73, the internal flow path 75, and the recovery pipe 74 to thereby absorb the heat quantity which is moved from the absorption member 65 to the heat absorption member 72, in the refrigerant, and can store this in the refrigerant supply device 71. That is to say, the heat processing device 7 can always recover the heat of the absorption member 65 by continually flowing the refrigerant in the circulatory system including the supply pipe 73, the internal flow path 75, and the recovery pipe 74 and can always continually cool the absorption member 65.

In this manner, by using the heat processing device 7 to cool the absorption member 65, the temperature rise of the absorption member 65 can be suppressed, and the influence of the heat of the absorption member 65 on the environment of the surroundings can be suppressed. It should be noted that the heat processing device 7 is not limited to the above mentioned constitution, and can apply other constitution. For example, Peltier elements or the like can be furnished. Furthermore, a part (e.g., refrigerant supply apparatus and the like) of the heat processing device 7 may be disposed outside the exposure apparatus EX. In addition, another part (e.g., projection optical system PL) may be constituted for a part of the heat processing device 7. There is a case that the heat influence from the absorption member 65 is negligible small according to the arrangement position of the processing device 6. In this case, the heat processing device 7 may be omitted.

Next is a description of the method of exposing the substrate P using the exposure apparatus EX having the above configuration. Also in the preset embodiment, in one round of the scanning operation, one shot field S on the substrate P can be multiply exposed (double exposed) by the image of the first pattern PA1 and the image of the second pattern PA2. The photosensitive material layer of the shot field S on the substrate P is multiply exposed (double exposed), without going through the development steps and the like, by the first exposure light EL1 irradiated onto the first exposure field AR1, and the second exposure light EL2 irradiated onto the second exposure field AR2.

In the present embodiment, the leakage exposure light EL' from the combining optical element 20 is guided to the outside of the projection optical system PL by the guidance optical system 8, and focused by the convergent optical system 62, and is then irradiated onto the absorption surface 66 of the absorption member 65 provided at a position separated from the projection optical system PL, via the pin hole 63 of the pin hole member 64. Since the leakage exposure light EL' is absorbed in the absorption member 65 provided at a position separated from the projection optical system PL, influence on the exposure accuracy due to the leakage exposure light EL' can be suppressed.

Furthermore, in the present embodiment, since the leakage exposure light EL' is optically guided to the outside of the projection optical system PL by the guidance optical system 8 of the processing device 6, a deterioration in the exposure accuracy due to the leakage exposure light EL' can be suppressed. Furthermore, by absorbing the leakage exposure light EL' guided to the outside of the projection optical system PL, with the absorption member 65 provided at a position separated to the outside of the projection optical system PL, the deterioration in the exposure accuracy due to the leakage exposure light EL' can be suppressed.

In the present embodiment also, as the combining optical element 20, a branching optical element (for example, half mirror) which branches the respective optical paths of the first exposure light EL1 and the second exposure light EL2 is used. This branching optical element can favorably branch the exposure light even if for example the exposure light which is used is random polarized light. On the other hand, the branching optical element (for example, half mirror) is capable of making approximately half of the incident first and second exposure lights EL1 and EL2 into the leakage exposure light EL'. If this leakage exposure light EL' is neglected, this can give rise to a temperature rise of the lens barrel PK, or a change in the optical characteristics of the projection optical system PL and the like, and a deterioration in exposure accuracy. In the present embodiment, by processing the leakage exposure light EL' in the processing device 6 so as to suppress the influence due to the leakage exposure light EL', the deterioration in exposure accuracy can be suppressed.

Figure 15:
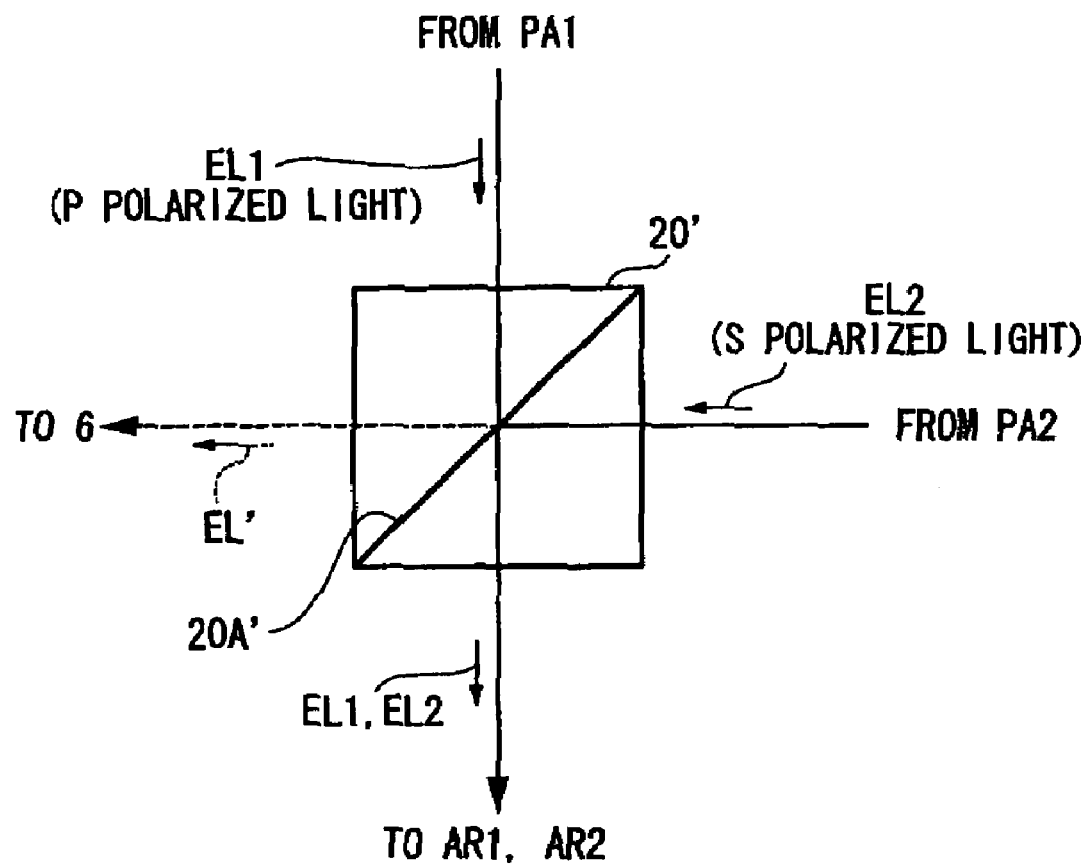
FIG. 15 shows another example of a combining optical element.

As in the schematic diagram shown in FIG. 15, as the combining optical element 20', a polarization dissociation optical element (for example optical beam splitter) that dissociates the respective first exposure light EL1 and the second exposure light EL2 into exposure light of a first polarization (for example P polarized light), and exposure light of a second polarization (for example S polarized light) may be used. For example, in the case where the first illumination system IL1 illuminates the first pattern PA1 with the first exposure light EL1 of the P polarize light condition, and the second illumination system IL2 illuminates the second pattern PA2 with the second exposure light EL2 of the S polarized light condition, then with respect to the combining optical element (for example optical beam splitter) 20', the first exposure light EL1 of the P polarized light from the first pattern PA1 is incident thereon, and the second exposure light EL2 of the S polarized light condition from the second pattern PA2 is incident thereon. In the case where a predetermined surface 20A' of the combining optical element 20' is formed so as to reflect the exposure light of the S polarized light condition, and pass the exposure light of the P polarized light condition, then most of the first and second exposure lights EL1 and EL2 from the combining optical element 20' is irradiated onto the first and second exposure fields AR1 and AR2. However a part of the first and second exposure lights EL1 and EL2 may become the leakage exposure light EL'. Even with such leakage exposure light EL', this can processed with the processing device 6 of the present embodiment. In this case, because the leakage exposure light EL' is minimal the processing device 6 and/or the heat processing device 7 can be simplified than that shown in FIG. 14. For example, the heat processing device 7 may be omitted, or only the absorption member 65 may be provided. A part of the internal surface of the lens barrel PK, for example which opposes to one surface of the combining optical element 20 from which the leakage exposure light EL' is emitted, may be used as an absorption surface, or an antireflection film may be merely formed on a part of the internal surface of the lens barrel PK.

Fourth Embodiment

A fourth embodiment is described with reference to FIG. 16. In the following description, components the same as or similar to the abovementioned embodiments are denoted by the same reference symbols, and their description is simplified or omitted.

Figure 16:
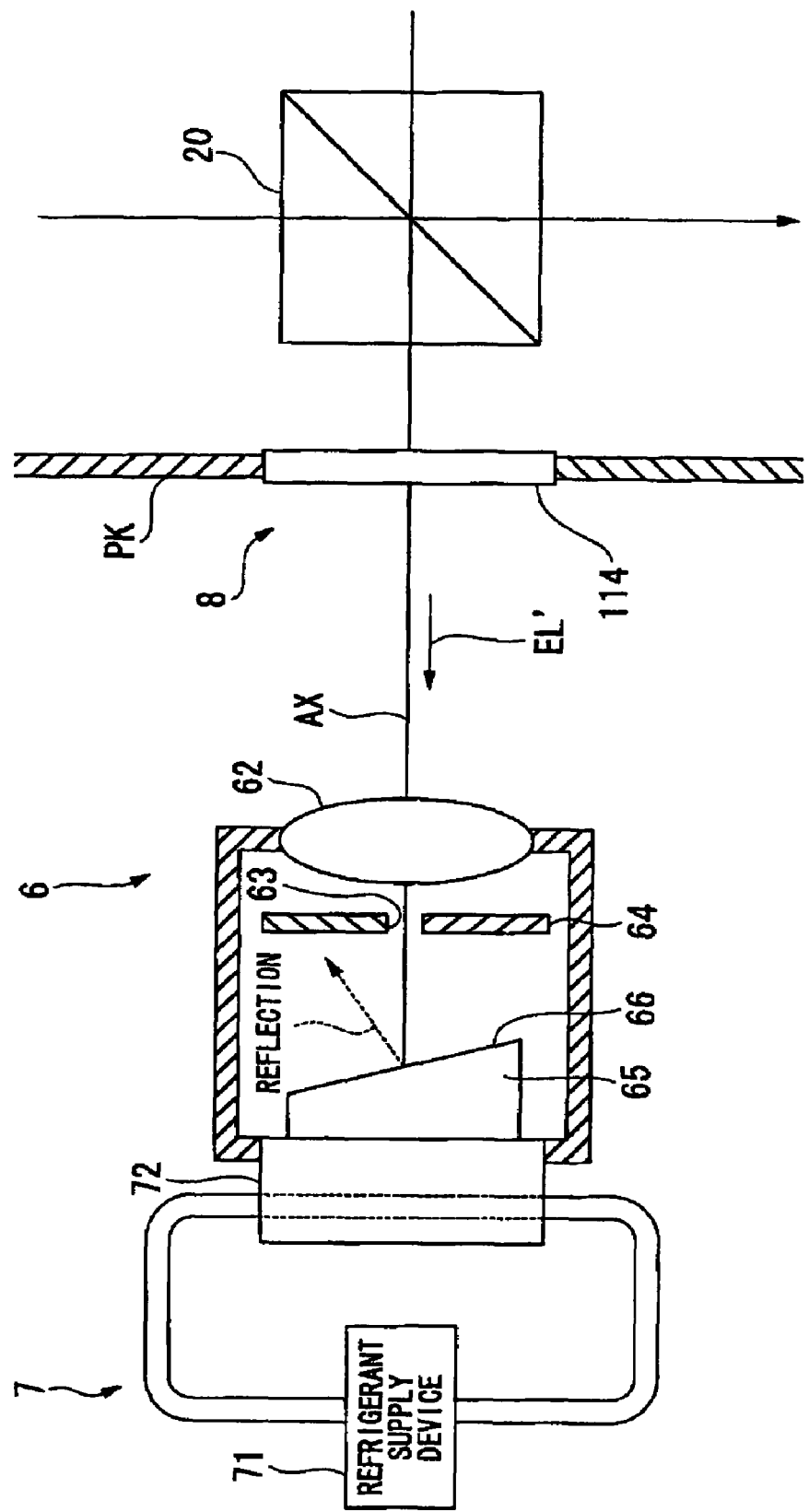
FIG. 16 shows a processing device according to a fourth embodiment.

FIG. 16 shows a processing device 6 according to the fourth embodiment. As shown in FIG. 16, an absorption surface 66 of an absorption member 65 of the processing device 6 according to the fourth embodiment is arranged at an incline with respect to the optical axis AX of the convergent optical system 62. By so doing, even if the leakage exposure light EL' which is focused by the convergent optical system 62, and irradiated onto the absorption surface 66 of the absorption member 65 is reflected by the absorption surface 66, the reflected leakage exposure light EL' can be even more prevented from returning to the projection optical system PL side. It should be noted that formation of an antireflection film on the absorption surface 66, or installation of a pin hole member or a light trap member may be applied concomitantly.

Fifth Embodiment

A fifth embodiment is described with reference to FIG. 17. In the following description, components the same as or similar to the abovementioned embodiments are denoted by the same reference symbols, and their description is simplified or omitted.

Figure 17:
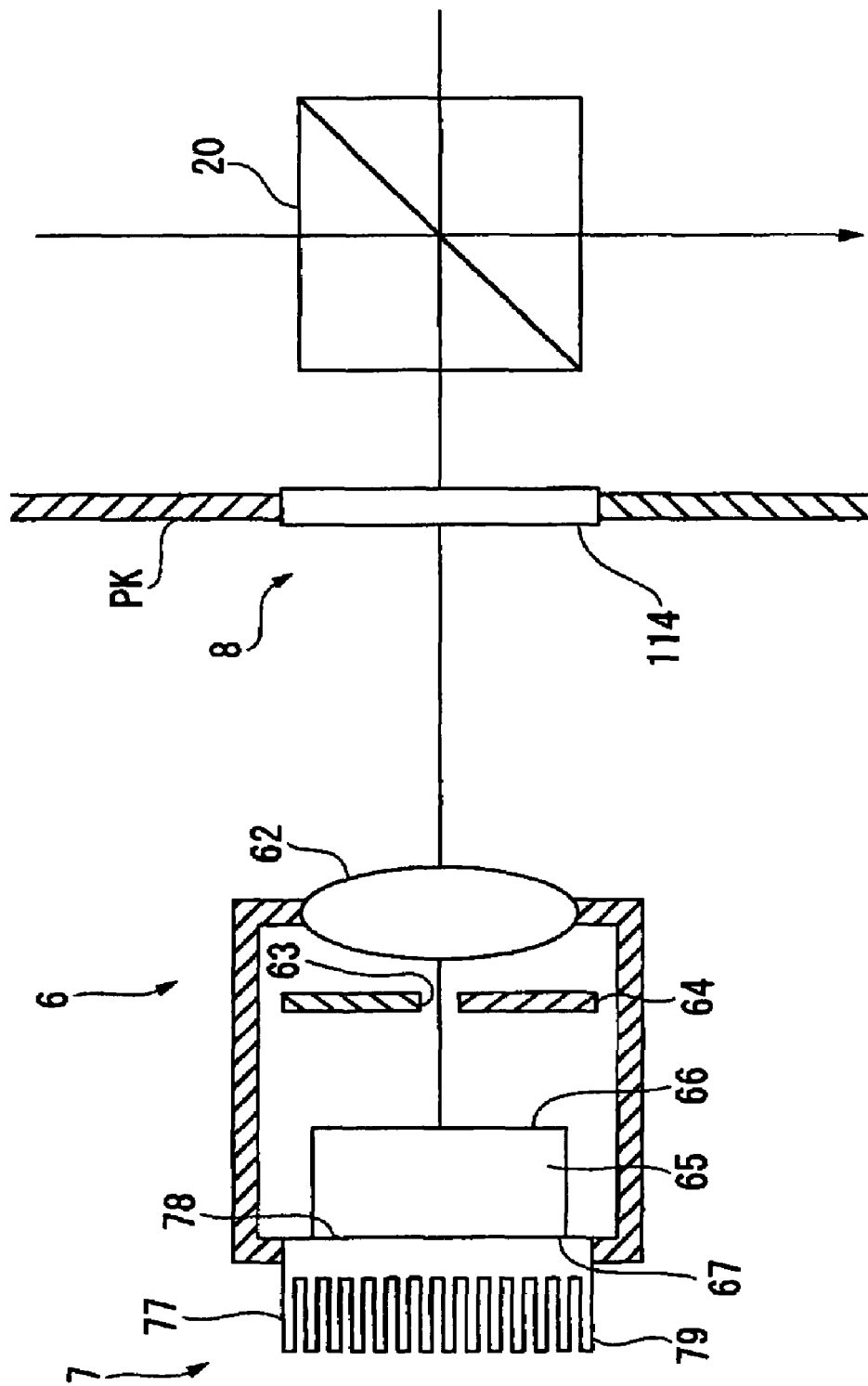
FIG. 17 shows a processing device according to a fifth embodiment.

FIG. 17 shows a heat processing device 7 according to the fifth embodiment. As shown in FIG. 17, the heat processing device 7 according to the fifth embodiment includes a radiation member 77 connected to the absorption member 65. The radiation member 77 comprises fins (radiation fins) 79. The radiation member 77 has a connection surface 78 connected to a surface 67 of the absorption member 65. The radiation member 77 can absorb (recover) the heat of the absorption member 65 via the surface 67 of the absorption member, and the connection surface 78. The radiation member 77 including the fins 79 can radiate the heat of the absorption member 65. In this manner, the radiation member 77 can also be used as the heat processing device 7.

In the abovementioned third through fifth embodiments, the absorption member 65 may be omitted. That is to say, by means of the guidance optical system 8, even by only guiding out the leakage exposure light EL' to the outside of the projection optical system PL, a deterioration in exposure accuracy due to the leakage exposure light EL' can be suppressed.

Sixth Embodiment

Figure 18:
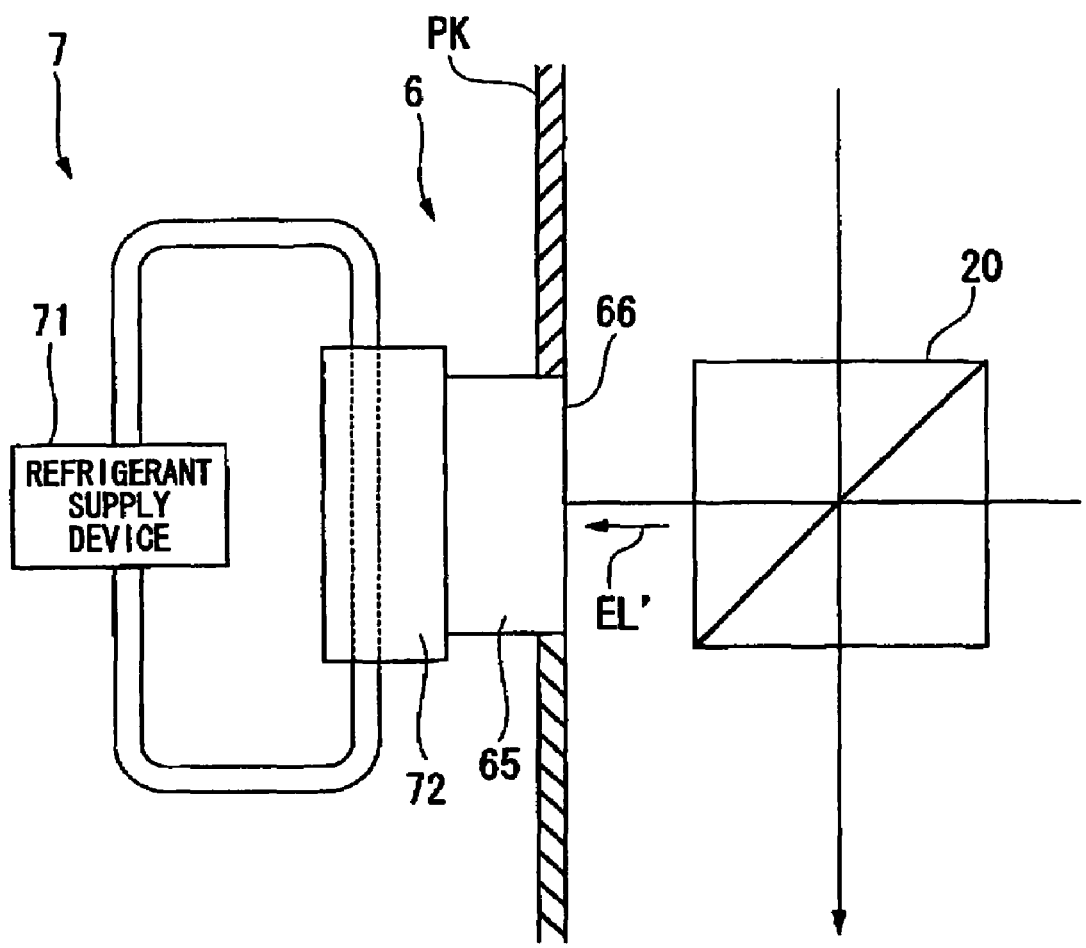
FIG. 18 shows a processing device according to a sixth embodiment.

A sixth embodiment is described with reference to FIG. 18. In the following description, components the same as or similar to the abovementioned embodiments are denoted by the same reference symbols, and their description is simplified or omitted.

In the abovementioned third through fifth embodiments, the processing device 6 has the guidance optical system 8, and the leakage exposure light EL' is guided out to the outside of the projection optical system PL using the guidance optical system 8, and the leakage exposure light EL' is absorbed by the absorption member 65 provided on the outside of the projection optical system PL. However in the present embodiment as shown in FIG. 18, the absorption member 65 may be attached to the lens barrel PK of the projection optical system PL, and the leakage exposure light EL' may be absorbed by the absorption member 65, rather than the leakage exposure light EL' being guided out to the outside of the projection optical system PL. While it is possible for the absorption member 65 to increase in temperature by absorbing the leakage exposure light EL', by providing the heat processing device 7 which functions as a cooling device as shown in FIG. 18, the temperature rise of the absorption member 65, and in turn the temperature rise of the projection optical system PL, can be suppressed.

In the abovementioned third through fifth embodiments, the processing device 6 is positioned away from the lens barrel PK, while in the abovementioned sixth embodiment, the processing device 6 is arranged in a condition attached to the lens barrel PK. That is, in all of the embodiments, the processing device 6 is provided with the sole object of processing the leakage exposure light EL'. However, the processing device 6 is not limited to this. For example, various sensors or electric circuits are arranged on the exposure apparatus, and amongst these there may be some which must be arranged adjacent to the projection optical system. Also due the influence of such a heat source, the optical characteristics of the projection optical system are changed. Therefore, to deal with this heat, it is considered to provide for example a refrigerant circulation path (pipework) surrounding the lens barrel PK in a spiral form, and circulate refrigerant. In this case, in the lens barrel portion in which the influence due to the exposure light other than that directed towards the first and second exposure fields, from the combining optical system, that is to say the leakage exposure light EL', is particularly easily received, by making the space (the pitch of the spiral) of the arrangement of the refrigerant circulation path (the pipework) a window, it is also possible to deal with the influence due to the leakage exposure light EL'. In this manner, instead of separately providing the processing device 6 for solely processing the leakage exposure light EL' as in the abovementioned third through sixth embodiments, a part of the structure arranged on the overall lens barrel for maintaining the optical characteristics of the projection optical system can be changed so that the leakage exposure light EL' can be dealt with. Furthermore, only a part of the lens barrel PK that is especially susceptible to the leakage exposure light EL' may be refrigerated as other process than for the projection optical system PL.

In the abovementioned third through sixth embodiments, as shown in FIG. 4, the first exposure field AR1 and the second exposure field AR2 are superimposed (coincident with each other). However, for example, only a part of the first exposure field AR1 and a part of the second exposure field AR2 may be superimposed, or the first exposure field AR1 and the second exposure field AR2 may be arranged separated in relation to the Y axis direction (the scanning direction of the substrate P). Furthermore, the first exposure field AR1 and the second exposure field AR2 need not necessarily be able to be arranged simultaneously on one shot field S, and the first exposure field AR1 and the second exposure field AR2 can be optionally set.

Furthermore, in the abovementioned third through sixth embodiments, the detection device 108 described in the abovementioned first and second embodiments can be provided in the exposure apparatus EX. For example, a part of the first exposure light EL1 and the second exposure light EL2 other than that directed towards the first exposure field AR1 and the second exposure field AR2, from the combining optical element 20, may be detected by the detection device 108, and the remaining part may be as processed as for the abovementioned third through sixth embodiments.

Moreover, in the abovementioned respective embodiments, at least one of the size and shape of the first exposure field AR1 and the second exposure field AR2 may be different. For example, the width in the X axis direction and/or the width in the Y axis direction of the first exposure field AR1 and the second exposure field AR2 may be different. In the case where the width in the X axis direction is different, only the field of part of inside the shot field S is multiply (double) exposed corresponding to one scanning operation. The shapes of the first and second exposure fields AR1 and AR2 (and/or the first and second illumination field IA1 and IA2) are not limited to the rectangular shape, and can have the other shape for example a circular arc shape, a trapezoid shape, or a parallelogram shape.

Furthermore, in the abovementioned respective embodiments, irradiation of the exposure lights EL1 and EL2 on each of the first exposure field AR1 and the second exposure field AR2 while the shot field S1 is passing through the first exposure field AR1 and the second exposure field AR2 is continuous. However in at least one of the exposure fields, the exposure light may be irradiated in a part of the period of time while the shot field S is passing. That is to say, only a part of inside the shot field S may be multiply (double) exposed.

Furthermore, the abovementioned respective embodiments may also be applied to a multistage type exposure apparatus provided with a plurality of substrate stages as disclosed for example in Japanese Unexamined Patent Application, First Publication Nos. 1163099 and 10-214783 (corresponding U.S. Pat. Nos. 6,341,007, 6,400,441, 6,549,269, and 6,590,634), and Published Japanese translation No. 2000-505958 of PCT International Publication (corresponding U.S. Pat. No. 5,969,441) or the like.

Seventh Embodiment

A seventh embodiment is described. In the following description, components the same as or similar to the abovementioned embodiments are denoted by the same reference symbols, and their description is simplified or omitted.

FIG. 19 is a schematic block diagram showing an exposure apparatus EX according to the seventh embodiment. In FIG. 19, the exposure apparatus EX includes; a first mask stage 1 that is capable of holding and moving a first mask M1 having a first pattern PA1, a second mask stage 2 that is capable of holding and moving a second mask M2 having a second pattern PA2, a first substrate stage 4 that is capable of holding and moving a first substrate P1, a second substrate stage 5 that is capable of holding and moving a second substrate P2, a measurement system 3 that is capable of measuring position information of the respective stages, a first illumination system IL1 that illuminates the first pattern PA1 of the first mask M1 with first exposure light EL1, a second illumination system IL2 that illuminates the second pattern PA2 of the second mask M2 with second exposure light EL2, a projection optical system PL that projects respectively an image of the first pattern PA1 illuminated by the first exposure light EL1 and an image of the second pattern PA2 illuminated by the second exposure light EL2 on to the first substrate P1 and the second substrate P2, and a control apparatus 100 that controls the operation of the overall exposure apparatus EX. The first substrate stage 4 and the second substrate stage 5 are capable of moving on a base member BP on the light emission side of the projection optical system PL, that is, the image plane side of the projection optical system PL. Furthermore, a storage device 102 that stores various information related to the exposure, is connected to the control apparatus 100.

The projection optical system PL of the present embodiment has a combining optical element 20 on which is incident the first exposure light EL1 from the first pattern PA1 and the second exposure light EL2 from the second pattern PA2. The combining optical element 20 branches each of the first exposure light EL1 and the second exposure fight EL2, and combines one of the branched exposure lights EL1 and one of the branched second exposure lights EL2, and combines the other of the first exposure lights EL1 and the other of the second exposure lights EL2. Moreover, the projection optical system PL of the present embodiment sets the first exposure field AR1 and the second exposure field AR2 in a predetermined positional relationship on the image side thereof, and sets a third exposure field AR3 and a fourth exposure field AR4 in a predetermined positional relationship. Furthermore, the projection optical system PL is capable of irradiating one of the first exposure lights EL1 and one of the second exposure lights EL2, from the combining optical element 20, onto the first exposure field AR1 and the second exposure field AR2, and is capable of irradiating the other of the first exposure lights EL1 and the other of the second exposure lights EL2, from the combining optical element 20, onto the third exposure field AR3 and the fourth exposure field AR4. Moreover, the projection optical system PL is capable of forming an image of the first pattern PA1 on the first exposure field AR1, and is capable of forming an image of the second pattern PA2 on the second exposure field AR2, and is capable of forming an image of the first pattern PA1 on the third exposure field AR3, and is capable of forming an image of the second pattern PA2 on the fourth exposure field AR4.

The exposure apparatus EX of the present embodiment multiply exposes (double exposes) a shot field S on the first substrate P1 with one of the first exposure lights EL1 irradiated onto the first exposure field AR1, and one of the second exposure lights EL2 irradiated onto the second exposure field AR2, via the projection optical system PL, and multiply exposes (double exposes) a shot field S on the second substrate P2 with the other of the first exposure lights EL1 irradiated onto the third exposure field AR3, and the other of the second exposure lights EL2 irradiated onto the fourth exposure field AR4.

More specifically, the exposure apparatus EX is capable of forming an image of the first pattern PA1 on the first exposure field AR1 by means of the first exposure light EL1 emitted from the first illumination system IL1 and irradiated onto the first exposure field AR1 via the first pattern PA1 and the projection optical system PL, and is capable of forming an image of the second pattern PA2 on the second exposure field AR2 by means of the second exposure light EL2 emitted from the second illumination system IL2 and irradiated onto the second exposure field AR2 via the second pattern PA2 and the projection optical system PL, and it multiply exposes the shot field S on the first substrate P1 with the image of the first pattern PA1 and the image of the second pattern PA2. Furthermore, the exposure apparatus EX is capable of forming an image of the first pattern PA1 on the third exposure field AR3 by means of the first exposure light EL1 emitted from the first illumination system IL1 and irradiated onto the third exposure field AR3 via the first pattern PA1 and the projection optical system PL, and is capable of forming an image of the second pattern PA2 on the fourth exposure field AR4 by means of the second exposure light EL2 emitted from the second illumination system IL2 and irradiated onto the fourth exposure field AR4 via the second pattern PA2 and the projection optical system PL, and it multiply exposes the shot field S on the second substrate P2 with the image of the first pattern PA1 and the image of the second pattern PA2.

Furthermore, the exposure apparatus EX of the present embodiment is a scanning type exposure apparatus (a so called scanning stepper) that projects the image of the first pattern PA1 of the first mask M1 and the image of the second pattern PA2 of the second mask M2 onto the first and second substrates P1 and P2, while the first mask M1 and the second mask M2, and the first substrate P1 and the second substrate P2 are simultaneously moved in a predetermined scanning direction. In the present embodiment, the scanning direction (the simultaneous movement direction) of the first substrate P1 and the second substrate P2 is the Y axis direction.

The exposure apparatus EX, while moving the shot field S of the first substrate P1 in the Y axis direction with respect to the first exposure field AR1 and the second exposure field AR2, respectively irradiates the first exposure light EL1 and the second exposure light EL2 onto the first exposure field AR1 and the second exposure field AR2 via the projection optical system PL, to thereby multiply expose the shot field S on the first substrate P1 with the image of the first pattern PA1 formed on the first exposure field AR1, and the image of the second pattern PA2 formed on the second exposure field AR2. Similarly, the exposure apparatus EX, while moving the shot field S of the second substrate 2 in the Y axis direction with respect to the third exposure field AR3 and the fourth exposure field AR4, respectively irradiates the first exposure light EL1 and the second exposure light EL2 onto the third exposure field AR3 and the fourth exposure field AR4 via the projection optical system PL, to thereby multiply expose the shot field S on the second substrate P2 with the image of the first pattern PA1 formed on the third exposure field AR3, and the image of the second pattern PA2 formed on the fourth exposure field AR4.

Furthermore, the exposure apparatus EX of the present embodiment, in synchronous with the movement in the Y axis direction of the first substrate P1 and the second substrate P2, moves the first mask M1 in the Y axis direction, and moves the second mask M2 in the Z axis direction. That is, in the present embodiment, the scanning direction (synchronous movement direction) of the first mask M1 is the Y axis direction, and the scanning direction (synchronous movement direction) of the second mask M2 is the Z axis direction.

The combining optical element 20 of the present embodiment includes a branching optical element (for example half mirror) that branches the respective optical paths of the first exposure light EL1 from the first pattern PA1 and the second exposure light EL2 from the second pattern PA2. The projection optical system PL irradiates one of the first exposure lights EL1 from the first pattern PA1 which is branched by the combining optical element (branching optical element) 20, and one of the second exposure lights EL2 from the second pattern PA2 which is branched by the combining optical element (branching optical element) 20 onto the first exposure field AR1 and the second exposure field AR2, and irradiates the other of the first exposure lights EL1 from the first pattern PA1 which is branched by the combining optical element (branching optical element) 20, and the other of the second exposure lights EL2 from the second pattern PA2 which is branched by the combining optical element (branching optical element) 20 onto the third exposure field AR3 and the fourth exposure field AR4.

Next is a description of the first mask stage 1. The first mask stage 1 is moveable by drive of a first mask stage drive device 1D which includes for example an actuator such as a linear motor, in the X axis, the Y axis, and the θZ directions in a condition with the first mask M1 held. The first mask stage 1 holds the first mask M1 so that a first pattern forming surface formed with a first pattern PA1 of the first mask M1 is substantially parallel with the XY plane. Position information of the first mask stage 1 (and in turn the first mask M1) is measured by a laser interferometer 31 of a measurement system 3. The laser interferometer 31 measures the position information of the first mask stage 1 using a reflecting surface 31K of a moving mirror provided on the first mask stage 1. The control apparatus 100 drives the first mask stage drive device 1D based on the measurement result of the laser interferometer 31, to perform position control of the first mask M1 which is held on the first mask stage 1.

Next is a description of the second mask stage 2. The second mask stage 2 is moveable by drive of a second mask stage drive device 2D which includes for example an actuator such as a linear motor, in directions of 6 degrees of freedom of the X axis, the Y axis, the Z axis, the θX, the θY, and the θZ directions, in a condition with the second mask M2 held. The second mask stage 2 holds the second mask M2 so that a second pattern forming surface formed with a second pattern PA2 of the second mask M2 is substantially parallel with the XZ plane. Position information of the second mask stage 2 (and in turn the second mask M2) is measured by a laser interferometer 32 of the measurement system 3. The laser interferometer 32 measures the position information of the second mask stage 2 using a reflecting surface 32K of a moving mirror provided on the second mask stage 2. The control apparatus 100 drives the second mask stage drive device 2D based on the measurement result of the laser interferometer 32, to perform position control of the second mask M2 which is held on the second mask stage 2.

Figure 20A:
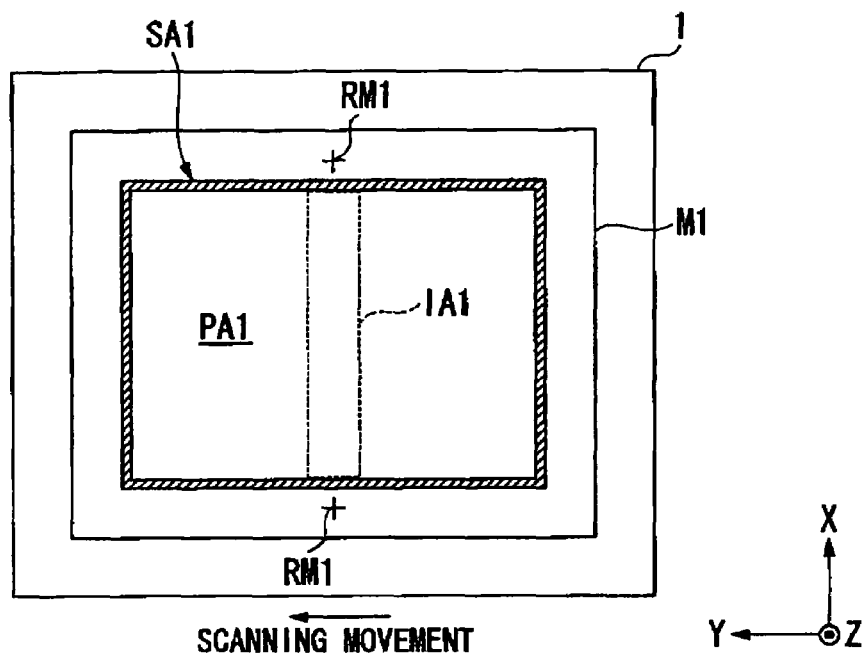
FIG. 20A shows an example of a first mask which is held in a first mask holder.
Figure 20B:
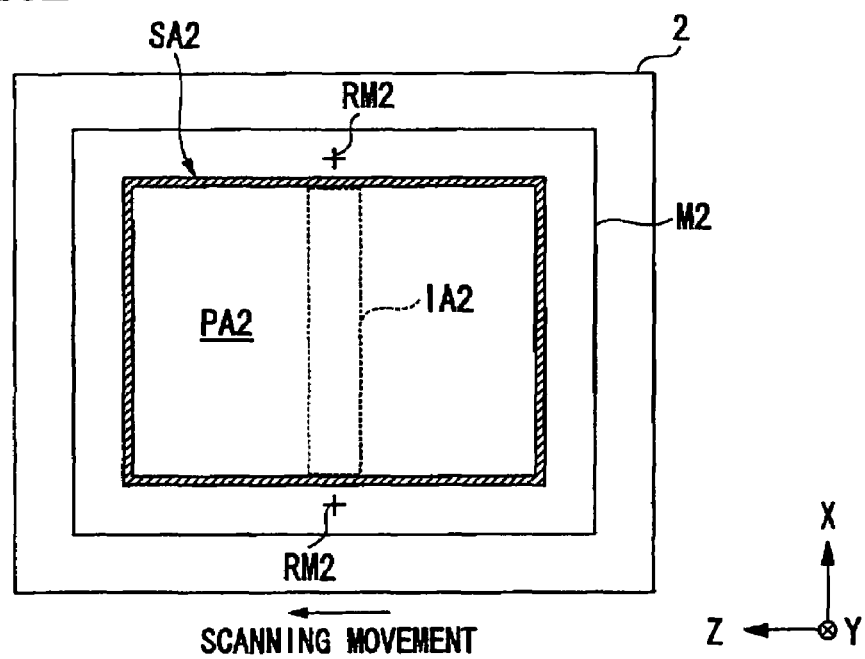
FIG. 20B shows an example of a second mask which is held in a second mask holder.

FIG. 20A is a plan view showing the first mask M1 held on the first mask stage 1. FIG. 20B is a plan view showing the second mask M2 held on the second mask stage 2. As shown in FIG. 20A and FIG. 20B, the first mask M1 is held so that the first pattern forming surface of the first mask M1 is substantially parallel with the XY plane, and the second mask M2 is held so that the second pattern forming surface of the second mask M2 is substantially parallel with the XZ plane. The first illumination field IA1 for the first exposure light EL1 on the first mask M1 is set in a rectangular shape (slit shape) with the X axis direction as the longitudinal direction. The second illumination field IA2 for the second exposure light EL2 on the second mask M2 is also set in a rectangular shape (slit shape) with the X axis direction as the longitudinal direction.

The first mask stage 1 is capable of moving the first mask M1 having the first pattern PA1 in the Y axis direction with respect to the first exposure light EL1. Furthermore, the second mask stage 2 is capable of moving the second mask M2 having the second pattern PA2 in the Z axis direction with respect to the second exposure light EL2. The control apparatus 100, when exposing the first and second substrates P1 and P2, controls the first mask stage 1 so that a first pattern forming field SA1 of the first mask M1 in which is formed at least the first pattern PA1 passes through the first illumination field IA1 for the first exposure light EL1, and moves the first mask M1 in the Y axis direction. Furthermore, the control apparatus 100, when exposing the first and second substrates P1 and P2, controls the second mask stage 2 so that a second pattern forming field SA2 of the second mask M2 in which is formed at least the second pattern PA2 passes through the second illumination field IA2 for the second exposure light EL2, and moves the second mask M2 in the Z axis direction.

Moreover, the first mask M1 is provided with a first alignment mark RM1 formed with a predetermined positional relationship to the first pattern PA1, and the second mask M2 is provided with a second alignment mark RM2 formed with a predetermined positional relationship to the second pattern PA2. In the present embodiment, each of the first and second alignment marks has a two dimensional mark, for example a cross mark. In the present embodiment, each of the first and second alignment marks has a two dimensional mark, for example cross mark. In FIGS. 20A and 20B, the first and second alignment marks RM1 and RM2 are formed on the masks M1 and M2 at outside the first and second pattern forming fields SA1 and SA2. However, the first and second alignment marks RM1 and RM2 may be formed within the first and second pattern forming fields SA1 and SA2. In the explanations below, the first and second alignment marks RM1 and RM2 are assumed to be formed within the first and second pattern forming fields SA1 and SA2. In the present embodiment, the fit and second alignment marks RM1 and RM2 are arranged within the first and second illumination fields IA1 and IA2 by means of the first and second mask stages 1 and 2, and are illuminated with the first and second exposure lights EL1 and EL2 by means of the first and second illumination systems IL1 and IL2. The images of the alignment marks RM1 and RM2 are detected by an optical sensor 170 (shown in FIG. 22) of the first and second substrate stages 4 and 5. The number or layout of the alignment marks RM1 and RM2 is not limited to that shown in FIGS. 20A and 20B. For example, a plurality of the first or second alignment marks RM1 or RM2 may be provided on the first or second mask M1 or M2 in a row along the Y axis direction.

Next is a description of the projection optical system PL, with reference to FIG. 19. The projection optical system PL projects an image of the first pattern PA1 of the first mask M1 which is illuminated by the first exposure light EL1, and an image of the second pattern PA2 of the second mask M2 which is illuminated by the second exposure light EL2, onto each of the first substrate P1 and the second substrate P2 at a predetermined projection magnification. In the projection optical system PL of the present embodiment, the projection magnification is for example a reduction system of for example ¼, ⅕, or ⅛. The plurality of optical elements of the projection optical system PL are held by a lens barrel (not shown in the drawing).

The projection optical system PL of the present embodiment includes; a first optical system 11 that guides the first exposure light EL1 from the first pattern PA1 to the combining optical element 20, a second optical system 12 that guides the second exposure light EL2 from the second pattern PA2 to the combining optical element 20, a third optical system 13 that respectively guides the first exposure light EL1 and the second exposure light EL2 firm the combining optical element 20 to the first exposure field AR1 and the second exposure field AR2, and a fourth optical system 14 that respectively guides the first exposure light EL1 and the second exposure light EL2 from the combining optical element 20 to the third exposure field AR3 and the fourth exposure field AR4.

The first exposure light EL1 is incident on the combining optical element 20 via the first mask M1 and the first optical system 11, and the second exposure light EL2 is incident on the combining optical element 20 via the second mask M2 and the second optical system 12. As described above, the combining optical element 20 includes a branching optical element (for example half mirror), and has a predetermined reflectance and transmittance. The combining optical element 20 passes a part of the first exposure light EL1 incident via the first mask M1 and the first optical system 11, and reflects the remaining part, and reflects a part of the second exposure light EL2 incident via the second mask M2 and the second optical system 12, and passes the remaining part, and combines the passed first exposure light EL1 and the reflected second exposure light EL2, and combines the reflected first exposure light EL1 and the passed second exposure light EL2.

More specifically, a part of the first exposure light EL1 from the first pattern PA1 passes through a predetermined surface 20A of the combining optical element (branching optical element) 20 and is guided to the first exposure field AR1 by the third optical system 13. On the other hand, a part of the remaining first exposure light EL1 from the first pattern PA1 is reflected by the predetermined surface 20A of the combining optical element (branching optical element) 20, and after being reflected by a reflecting surface 15 of a reflection member, is guided to the third exposure field AR3 by the fourth optical system 14. Furthermore, a part of the second exposure light EL2 from the second pattern PA2 is reflected by the predetermined surface 20A of the combining optical element (branching optical element) 20 and is guided to the second exposure field AR2 by the third optical system 13. On the other hand, a part of the remaining second exposure light EL2 from the second pattern PA2 passes through the predetermined surface 20A of the combining optical element (branching optical element) 20, and after being reflected by the reflecting surface 15 of the reflection member, is guided to the fourth exposure field AR4 by the fourth optical system 14.

Furthermore, the projection optical system PL, by irradiating the first exposure light EL1 via the first pattern PA1 and the second exposure light EL2 via the second pattern PA2 onto the first exposure field AR1 and the second exposure field AR2, is capable of forming an image of the first pattern PA1 and an image of the second pattern PA2 on the first exposure field AR1 and the second exposure field AR2, and by irradiating the first exposure light EL1 via the first pattern PA1 and the second exposure light EL2 via the second pattern PA2 onto the third exposure field AR3 and the fourth exposure field AR4, is capable of forming an image of the first pattern PA1 and an image of the second pattern PA2 on the third exposure field AR3 and the fourth exposure field AR4.

Furthermore, in the projection optical system PL of the present embodiment, there is provided a first imaging characteristic adjusting device LC1 and a second imaging characteristic adjusting device LC2 that is capable of independently adjusting each of the imaging characteristics (imaging conditions) of the image of the first pattern PA1 and the image of the second pattern PA2, due to the projection optical system PL. The first and second imaging characteristic adjusting devices LC1 and LC2 include an optical element drive function that is capable of driving at least one of the plurality of optical elements of the projection optical system PL.

The first imaging characteristic adjusting device LC1 can move at least one specific optical element of the first optical system 11 in Z axis direction parallel to the optical axis of the first optical system 11 and in directions (X axis direction and Y axis direction) orthogonal to the optical axis, and can incline the optical element with respect to a XY plane orthogonal to the optical axis (that is, rotating in θX direction and θY direction). The first exposure light EL1 from the first pattern PA1 is incident on the first exposure field AR1 via the first optical system 11, the optical element 20, and the third optical system 13, and is incident on the third exposure field AR3 via the first optical system 11, the optical element 20 an the fourth optical system 14. The first imaging characteristic adjusting device LC1 is capable of moving the specific optical element of the first optical system 11 to thereby adjust the imaging characteristic of the image of the first pattern PA1 formed on the first exposure field AR1 and the third exposure field AR3.

The second imaging characteristic adjusting device LC2 can move at least one specific optical element of the second optical system 12 in Y axis direction parallel to the optical axis of the second optical system 12 and in directions (X axis direction and Z axis direction) orthogonal to the optical axis, and can incline the optical element with respect to a XY plane orthogonal to the optical axis (that is, rotating in θX direction and θZ direction). The second exposure light EL2 from the second pattern PA2 is incident on the second exposure field AR2 via the second optical system 12, the optical element 20, and the third optical system 13, and is incident on the fourth exposure field AR4 via the second optical system 12, the optical element 20 an the fourth optical system 14. The second imaging characteristic adjusting device LC2 is capable of moving the specific optical element of the second optical system 12 to thereby adjust the imaging characteristic of the image of the second pattern PAZ formed on the second exposure field AR2 and the fourth exposure field AR4.

The two imaging characteristic adjusting devices LC1 and LC2 are controlled by the control apparatus 100. The control apparatus 100 can adjust the imaging characteristics including various aberrations (for example, distortion, astigmatism, spherical aberration, wave front aberration, and the like), projection magnification, and image position (focal position), of the projection optical system PL, by moving the specific optical element of the projection optical system PL (the first and second optical element 11 and 12) using the first and second imaging characteristic adjusting devices LC1 and LC2.

Furthermore, the control apparatus 100 can also perform position adjustment (i.e., shift adjustment, and/or rotation adjustment) in the XY direction and/or the θZ direction of the image of the first and second patterns PA1 and PA2, using the first and second imaging characteristic adjusting devices LC1 and LC2.

That is to say, the control apparatus 100 can use the first and second image characteristic adjusting devices LC1 and LC2 to perform adjustment of the respective images (the size, the distortion etc.) of the first and second patterns PA1 and PA2, position adjustment in the Z axis direction of the image plane of the projection optical system PL formed with the respective images of the first and second patterns PA1 and PA2, inclination adjustment in the θX direction and the θY direction, and position adjustment of the respective images of the first and second patterns PA1 and PA2 in the X axis direction, the Y axis direction and the θZ direction.

In the present embodiment, at least one optical element of the first and second optical systems 11 and 12 which is moved by the first or second image characteristic adjusting device LC1 or LC2 is not limited to a lens, and can alternatively be another optical element, for example a parallel plane plate or a reflective element. Furthermore, in the present embodiment, two image characteristic adjusting devices (LC1 and LC2) are provided. However, only one image characteristic adjusting device may alternatively be provided, or three or more image characteristic adjusting devices may alternatively be provided. For example, a image chat c adjusting device that is capable of moving at least one optical element of the third optical system 13 in the Z axis direction parallel to the optical axis of the third optical system 13 and in the X axis and Y axis directions, and that is capable of rotating the at least one element in the θX and θY directions, and/or another image characteristic adjusting device that is capable of moving at least one optical element of the fourth optical system 14 in the Z axis direction parallel to the optical axis of the fourth optical system 14 and in the X axis and Y axis directions, and that is capable of rotating at least one element in the θX and θY directions, may be provided. Furthermore, in the present embodiment, the image characteristic adjusting device LC1 moves optical element in directions of 5 degrees of freedom of the X axis, the Y axis, the Z axis, the θX and the θY directions, and the image characteristic adjusting device LC2 moves optical element in directions of 5 degrees of freedom of the X axis, the Y axis, the Z axis, the θX and the θZ directions. However, the moving directions of the optical element are not limited to the directions of 5 degrees of freedom. Furthermore, in the present embodiment, a method in which the image characteristic adjusting device moves the optical element is applied. However, another method may alternatively be used or additionally be used. For example, for the first and second imaging characteristic adjusting devices LC1 and LC2, a pressure adjusting mechanism that adjusts the pressure of a gas in a space between optical element pairs of one part held inside the lens barrel may be used. For example, for the first and second imaging characteristic adjusting devices LC1 and LC2, a pressure adjusting mechanism that adjusts the pressure of a gas in a space between optical element pairs of one part held inside the lens barrel may be used.

An exposure apparatus equipped with an imaging characteristic adjustment device that is capable of adjusting the imaging characteristics of the image of the pattern by the projection optical system, is disclosed for example in Japanese Unexamined Patent Application, First Publication Nos. S60-78454 (corresponding U.S. Pat. No. 4,666,273), and H11-195602 (corresponding U.S. Pat. No. 6,235,438), and in PCT International Publication No. WO2003/65428 (corresponding U.S. Patent Application, Publication No. 2005/0206850).

Next is a description of the first substrate stage 4. The first substrate stage 4 is capable of holding and moving the first substrate P1 within a predetermined field including the first exposure field AR1 and the second exposure field AR2 which are irradiated by the first exposure light EL1 and the second exposure light EL2. The first substrate stage 4 comprises; a stage body 4B, a first substrate table 4T mounted on the stage body 4B, and a substrate holder 4H provided on the first substrate table 4T that holds the first substrate P1. The substrate holder 4H holds the first substrate P1 so that the surface of the first substrate P1 and the XY plane are substantially parallel.

The exposure apparatus EX comprises a first substrate stage drive device 4D that drives the first substrate stage 4. The first substrate stage drive device 4D comprises; a first drive system 4DH that is capable of moving the stage body 4B on the base member BP in the X axis direction, the Y axis direction and the θZ direction, to thereby move the first substrate table 4T mounted on the stage body 4B in the X axis direction, the Y axis direction and the θZ direction, and a second drive system 4DV that is capable of moving the first substrate table 4T with respect to the stage body 4B in the Z axis direction, the θX direction, and the θY direction. As shown in FIG. 19, the stage body 4B of the first substrate stage 4 is supported without contact on the upper surface (guide surface) of the base member BP, by an air bearing 4A. The upper surface of the base member BP is substantially parallel with the XY plane, and the first substrate stage 4 is capable of moving on the base member BP along the XY plane.

The first drive system 4DH of the first substrate stage drive device 4D includes for example an actuator such as a linear motor, and is capable of moving the stage body 4B in the X axis, the Y axis, and the θZ directions. Furthermore, the second drive system 4DV of the first substrate stage drive device 4D includes an actuator 4V such as a voice coil motor, provided between the stage body 4B and the first substrate table 4T, and a measuring device (encoder or the like) (not shown in the figure) that measures the drive amount of the respective actuators. As shown in FIG. 19, the first substrate table 4T is supported on the stage body 4B by at least three actuators 4V. Each of the actuators 4V is capable of moving the first substrate table 4T with respect to the stage body 4B independently in the Z axis direction. The control apparatus 100 controls the drive amount of each of the three actuators 4V to thereby move the first substrate table 4T with respect to the stage body 4B, in the Z axis direction, the θX direction, and the θY direction.

In the above manner, the first substrate stage drive device 4D including the first and second drive systems 4DH and 4DV is capable of moving the first substrate table 4T of the first substrate stage 4 in directions of 6 degrees of freedom of the X axis, the Y axis, the Z axis, the θX, the θY and the θZ directions. The control apparatus 100, by controlling the first substrate stage drive device 4D, is capable of controlling the position of the surface of the first substrate P1 held on the substrate holder 4H of the first substrate table 4T, in relation to the directions of 6 degrees of freedom of the X axis, the Y axis, the Z axis, the θX, the θY and the θZ directions.

Next is a description of the second substrate stage 5. The second substrate stage 5 has substantially the same construction as the first substrate stage 4, and comprises; a stage body 5B, a second substrate table 5T mounted on the stage body 5B, and a substrate holder 5H provided on the second substrate table 5T that holds the second substrate P2. The stage body 5B is supported without contact on the upper surface (guide surface) of the base member BP, by an air bearing 5A. The substrate holder 5H supports the second substrate n so that the surface of the second substrate P and the XY plane are substantially parallel. The second substrate stage 5 is capable of holding and moving the second substrate P2 within a predetermined field including the third exposure field AR3 and the fourth exposure field AR4 which are irradiated by the first exposure light EL1 and the second exposure light EL2.

The second substrate stage 5 is driven by a second substrate stage drive device 5D. The second substrate stage drive device 5D has substantially the same construction as the first substrate stage drive device 4D, and comprises; a first drive system 5DH that is capable of moving the stage body 5B in the X axis direction, the Y axis direction and the θZ direction, and a second drive system 5DV that is capable of moving the second substrate table 5T with respect to the stage body 5B in the Z axis direction, the θX direction, and the θY direction. The second drive system 5DV of the second substrate stage drive device 5D includes an actuator 5V such as a voice coil motor, provided between the stage body 5B and the second substrate table 5T, and a measuring device (encoder or the like) (not shown in the figure) that measures the drive amount of the respective actuators.

The second substrate stage drive device 5D including the first and second drive systems 5DH and 5DV is capable of moving the second substrate table 5T of the second substrate stage 5 in directions of 6 degrees of freedom of the X axis, the Y axis, the Z axis, the θX, the θY and the θZ directions. The control apparatus 100, by controlling the second substrate stage drive device 5D, is capable of controlling the position of the surface of the second substrate P2 held on the substrate holder 5H of the second substrate table 5T, in relation to the directions of 6 degrees of freedom of the X axis, the Y axis, the Z axis, the θX, the θY and the θZ directions.

The position information of the first substrate stage 4 (and in turn the first substrate P1) and the second substrate stage 5 (and in turn the second substrate P2) is measured by laser interferometers 34, 36, 35 and 37 of a measurement system 3. The measurement system 3 uses reflecting surfaces 34K, 36K, 35K and 37K provided on predetermined positions of the first and second substrate tables 4T and 5T of the fit and second substrate stages 4 and 5, to be capable of measuring the position information of the first and second substrate tables 4T and 5T in relation to the directions of 6 degrees of freedom of the X axis, the Y axis the Z axis, the θX, the θY and the θZ directions.

The laser interferometers 34 and 36 of the measurement system 3, measure the position information of the first substrate stage 4 (first substrate table 4T) and the laser interferometers 35 and 37 measure the position information of the second substrate stage 5 (second substrate table 5T).

The laser interferometer 34 is capable of irradiating a plurality of measurement lights with the X axis direction as the measurement axis, and a plurality of measurement lights with the Y axis direction as the measurement axis, onto the reflecting surface 34K, and measures the position of the first substrate table 4T in relation to the X axis, the Y axis and the θZ directions.

The laser interferometer 36 is capable of irradiating a plurality of measurement lights with the Z axis direction as the measurement axis, onto the reflecting surface 36K, and measures the position of the first substrate table 4T in relation to the Z axis, the θX and the θY directions. The reflecting surface 36K is inclined at a predetermined angle (for example 45 degrees) with respect to the XY plane, and the measurement light emitted from the laser interferometer 36 and irradiated onto the reflecting sure 36K of the first substrate table 4T is reflected by the reflecting surface 36K and irradiated onto a reflecting surface 38K provided on a predetermined support member (for example, the abovementioned measurement frame). Furthermore, the measurement light reflected by the reflecting surface 38K is received in the laser interferometer 36 via the reflecting surface 36K of the fast substrate table 4T. The laser interferometer 36 is capable of using this received measurement light to measure the position information of the first substrate table 4T in relation to the Z axis, the θX and the θY directions.

Moreover, the laser interferometer 35 is capable of irradiating a plurality of measurement lights with the X axis direction as the measurement axis, and a plurality of measurement lights with the Y axis direction as the measurement axis, onto the reflecting surface 35K, and measures the position of the second substrate table 5T in relation to the X axis, the Y axis, and the θZ directions.

The laser interferometer 37 is capable of irradiating a plurality of measurement lights with the Z axis direction as the measurement axis, onto the reflecting surface 37K, and measures the position of the second substrate table 5T in relation to the Z axis, the θX and the θY directions. The reflecting surface 37K is inclined at a predetermined angle (for example 45 degrees) with respect to the XY plane, and the measurement light emitted from the laser interferometer 37 and irradiated onto the reflecting surface 37K of the second substrate table 5T is reflected by the reflecting surface 37K and irradiated onto a reflecting surface 39K provided on a predetermined support member (for example, the abovementioned measurement frame). Furthermore, the measurement light reflected by the reflecting surface 39K is received in the laser interferometer 37 via the reflecting surface 37K of the second substrate table 5T. The laser interferometer 37 is capable of using this received measurement light to measure the position information of the second substrate table 5T in relation to the Z axis, the θX and the θY directions.

The technology related to the laser interferometer (Z interferometer) that is capable of measuring the position information of the substrate table (substrate stage) in the Z axis direction is disclosed for example in Japanese Unexamined Patent Application, First Publication Nos. 2000-323404 (corresponding U.S. Pat. No. 7,116,401), and Published Japanese translation No. 2001-513267 of PCT International Publication (corresponding U.S. Pat. No. 6,208,407).

Furthermore, the control apparatus 100 moves the first and second substrate stage drive devices 4D and 5D based on the measurement results of the measurement system 3, and performs position control of the first and second substrate tables 4T and 5T of the first and second substrate stages 4 and 5, and in turn position control of the first and second substrates P1 and P2 held in the substrate holders 4H and 5H of the first and second substrate tables 4T and 5T.

Figure 21A:
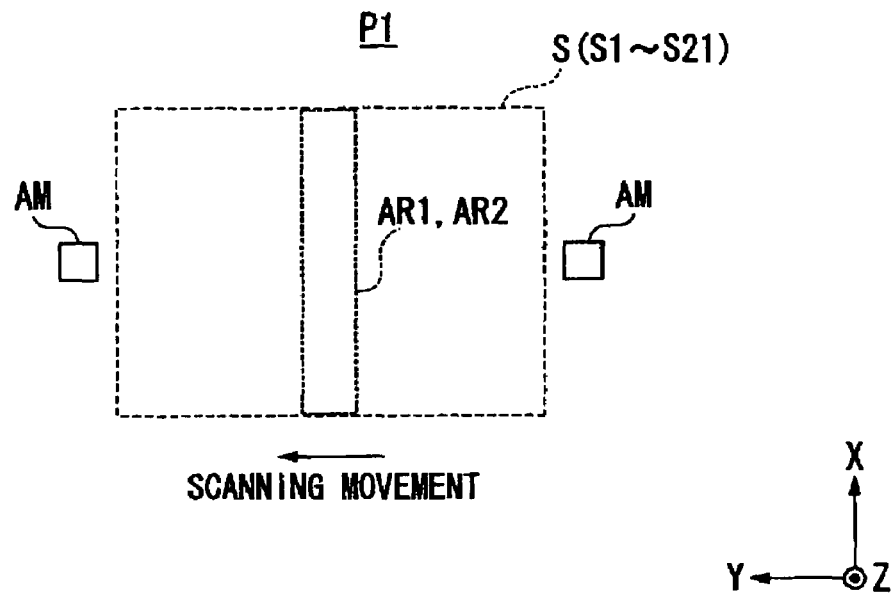
FIG. 21A is a schematic diagram showing a relationship between a shot field of a first substrate and a first and second exposure field, according to the seventh embodiment.
Figure 21B:
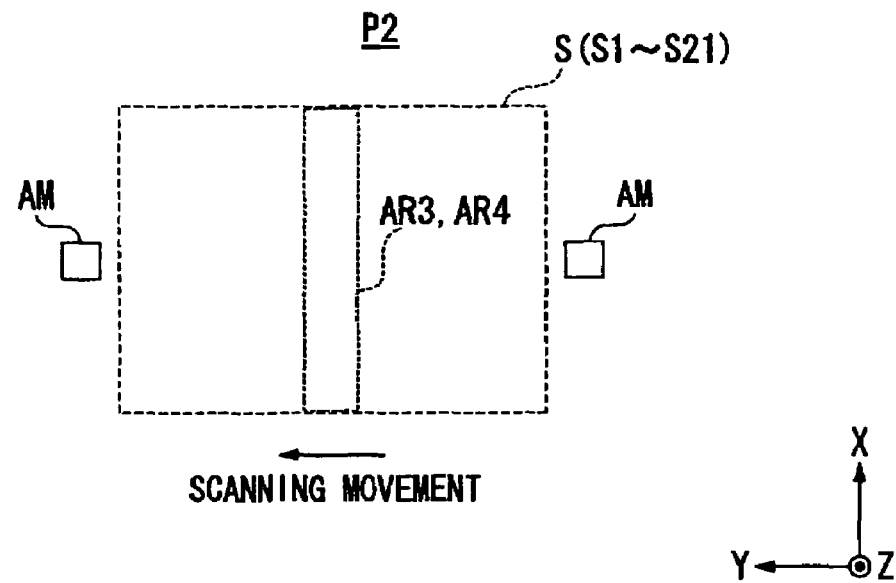
FIG. 21B is a schematic diagram showing a relationship between a shot field of a second substrate and a third and fourth exposure field, according to the seventh embodiment.

FIG. 21A is a schematic diagram showing the positional relationship between the shot field S on the first substrate P1, and the first and second exposure fields AR1 and AR2, and FIG. 21B is a schematic diagram showing the positional relationship between the shot field S on the second substrate P2, and the third and fourth exposure fields AR3 and AR4. In FIG. 21A and FIG. 21B is also shown arm alignment mark AM for detecting the position information of the shot field S on the first and second substrates P1 and P2. In the embodiment, the alignment marks AM are formed on both sides in the Y axis direction of the shot field S, however, the number and position of the alignment marks AM is not limited thereto.

As shown in FIG. 21A, the first exposure field AR1 for the first exposure light EL1 on the first substrate P1 is set in a rectangular shape (slit shape) with the X axis direction as the longitudinal direction, and also the second exposure field AR2 for the second exposure light EL2 on the first substrate P1 is set in a rectangular shape (slit shape) with the X axis direction as the longitudinal direction. In the present embodiment, the first exposure field AR1 which the first exposure light EL1 irradiates, and the second exposure field AR2 which the second exposure light EL2 irradiates, are the projection fields of the projection optical system PL. Furthermore, in the present embodiment, the first exposure field AR1 and the second exposure field AR2 are overlapped (coincidence).

Moreover, as shown in FIG. 21B, the third exposure field AR3 for the first exposure light EL1 on the second substrate P2 is set in a rectangular shape (slit shape) with the X axis direction as the longitudinal direction, and also the fourth exposure field AR4 for the second exposure light EL2 on the second substrate P2 is set in a rectangular shape (slit shape) with the X axis direction as the longitudinal direction. The third exposure field AR3 which the first exposure light EL1 irradiates, and the fourth exposure field AR4 which the second exposure light EL2 irradiates, are the projection fields of the projection optical system PL. Furthermore, in the present embodiment, the third exposure field AR3 and the fourth exposure field AR4 are overlapped (coincidence).

The first substrate stage 4 is capable of moving the shot field S on the first substrate P1 in the Y axis direction with respect to the first exposure field AR1 and the second exposure field AR2. The control apparatus 100 controls the first substrate stage 4 and moves the first substrate P1 in the Y axis direction so that the shot field S on the first substrate P1 passes through the first and second exposure fields AR1 and AR2 for the first and second exposure lights EL1 and EL2.

The second substrate stage 5 is capable of moving the shot field S on the second substrate P2 in the Y axis direction with respect to the third exposure field AR3 and the fourth exposure field AR4. The control apparatus 100 controls the second substrate stage 5 and moves the second substrate P2 in the Y axis direction so that the shot field S on the second substrate P2 passes through the third and fourth exposure fields AR3 and AR4 for the first and second exposure lights EL1 and EL2.

Figure 22:
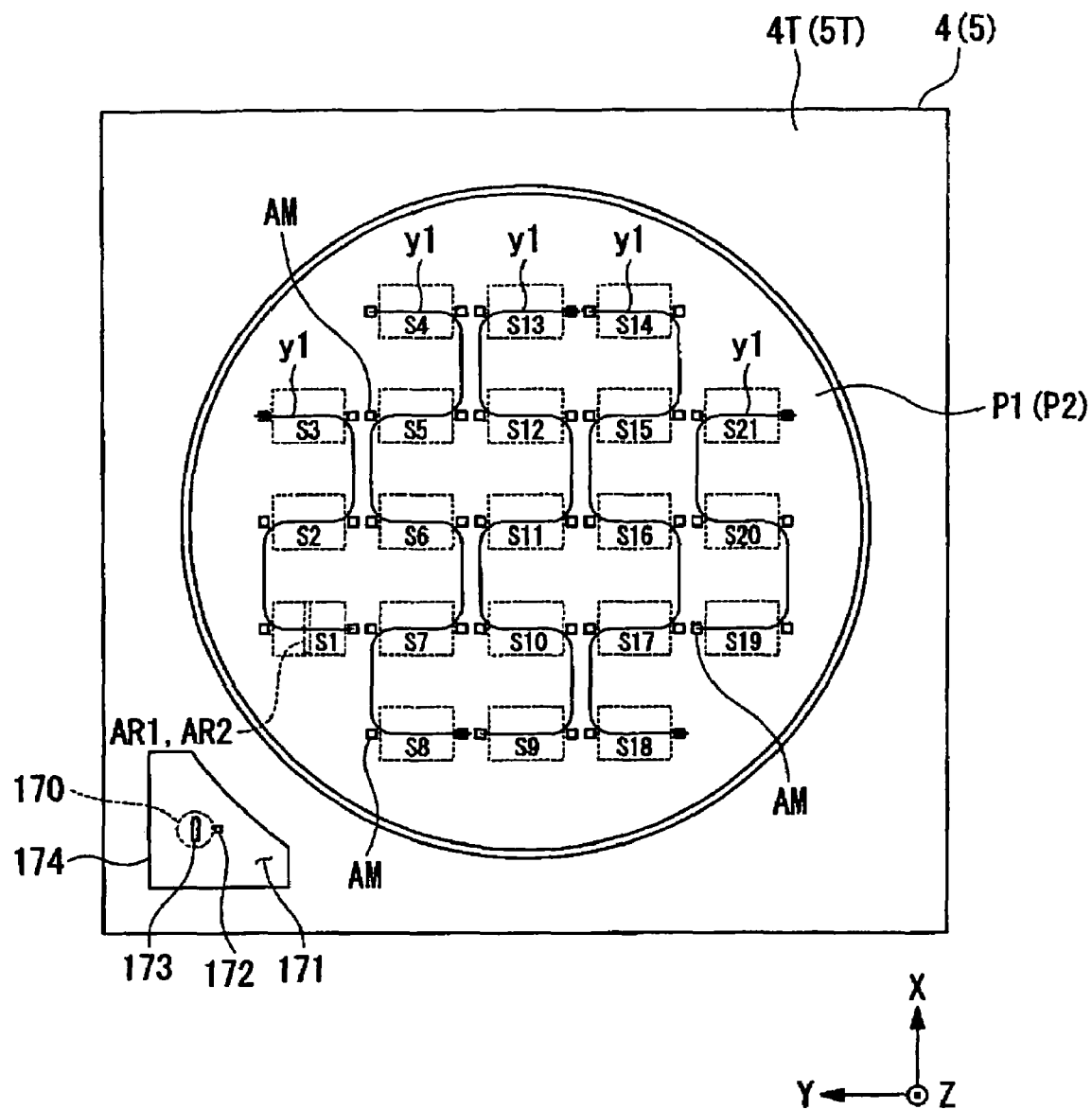
FIG. 22 is a view of a substrate stage as seen from above.

FIG. 22 is a plan view of the first substrate stage 4 (first substrate table 4T) holding the first substrate P1, as seen from above. As shown in FIG. 22, a plurality of shot fields S1 through S21 serving as exposure target fields, are provided in matrix form on the first substrate P1, and a plurality of alignment marks AM are provided so as to respectively correspond to the shot fields S1 through S21. When the respective shot fields S1 through S21 of the first substrate P1 are exposed, the control apparatus 100 irradiates the first and second exposure lights EL1 and EL2 on the first substrate P1 by irradiating the first and second exposure lights EL1 and EL2 on the first and second exposure fields AR1 and AR2 while relatively moving the first and second exposure fields AR1 and AR2 and the first substrate P1 as shown for example by the arrows y1 in FIG. 22. The control apparatus 100 controls the operation of the first substrate stage 4 so that the first and second exposure fields AR1 and AR2 move along the arrows y1 with respect to the substrate P. The control apparatus 100 sequentially multiply exposes the plurality of shot fields S1 through S21 on the first substrate P1 in step and scan method, by repeating the scanning operation in the −Y direction of the substrate P and the scanning operation in the +Y direction.

Furthermore, as shown in FIG. 22, on the first substrate table 4T of the substrate stage 4 there is provided a measurement field 174 that is capable of facing the third optical system 13 of the projection optical system PL, which performs measurement related to exposure. The measurement field 174 is provided at a predetermined position on the first substrate table 4T of the first substrate stage 4. On the measurement field 174 on the first substrate table 4T is provided a reference surface 171, a reference mark 172 and an aperture 173, and on the bottom of the aperture 173 (the inside of the first substrate table 4T) there is provided an optical sensor 170 that is capable of receiving light which has passed through the aperture 173. The optical sensor 170 includes for example an aerial image measuring instrument such as disclosed for example in Japanese Unexamined Patent Application, First Publication No. 2002-14005 (corresponding to U.S. Patent Application Publication No. 2002/0041377). The control apparatus 100 can use the optical sensor 170 to acquire at least one of position information of the image of the first pattern PA1 formed on the first exposure field AR1, and position information of the image of the second pattern PA2 formed on the second exposure field AR2. Furthermore, the control apparatus 100 can use the optical sensor 170 to acquire at least one of the position information of the image plane on which the image of the first pattern PA1 is formed by the projection optical system PL, and the position information of the image plane on which the image of the second pattern PA2 is formed.

In the above, the first substrate stage 4 (the first substrate table 4T) and the first substrate P1 on the first substrate stage 4 have been described with reference to FIG. 22, however the second substrate stage 5 (the second substrate table 5T) and the second substrate P2 on the second substrate stage 5 also have substantially the same construction. Furthermore, on the second substrate table 5T also is formed a measurement field 174 that is capable of facing the fourth optical system 14 of the projection optical system PL, and in this measurement field 174 is provided a reference surface 171, a reference mark 172, and an aperture 173. On the bottom of the aperture 173 (the inside of the second substrate table 5T) there is provided an optical sensor 170 that is capable of receiving light which has passed through the aperture 173. The control apparatus 100 can use the optical sensor 170 to acquire at least one of position information of the image of the first pattern PA1 formed on the third exposure field AR3, and position information of the image of the second pattern PA2 formed on the fourth exposure field AR4. Furthermore, the control apparatus 100 can use the optical sensor 170 to acquire at least one of the position information of the image-plane on which the image of the first pattern PA1 is formed by the projection optical system PL, and the position information of the image plane on which the image of the second pattern PA2 is formed. In the present embodiment, since the optical sensors 170 of the first and second substrate tables 4T and 5T detect at least one of images of the first alignment marks RM1 of the first mask M1 formed at the first and third exposure fields AR1 and AR3 and images of the second alignment marks RM2 of the second mask M2 formed on the second and fourth exposure fields, at least one projection position of the first and second patterns PA1 and PA2 in the X axis and the Y axis directions. It should be noted that the optical sensor 170 may be constituted by only light-sensitive element, or by a plurality of optical members including light-sensitive element. In the latter case, not all of the optical members may be provided in the substrate table (substrate stage). In the present embodiment since the optical sensor 170 includes the aerial image measuring instrument, optical members, such as at least a part of them is provided in the substrate table (4T, 5T) and remaining parts including the light-sensitive element are disposed at outside the substrate stage, are furnished.

Furthermore, as shown in FIG. 19, the exposure apparatus EX of the present embodiment is provided with a first and second focus leveling detection system 81 and 82 that detects the surface position information (tip surface position information related to the Z axis, the θX and the θY directions) of the surface of the first and second substrate P1 and P2 held in the first and second substrate stages 4 and 5. The first focus leveling detection system 81 comprises a projection system 81A that irradiates detection light from an incline direction onto the surface of the first substrate P1, and a reception system 81B capable receiving the detection light irradiated onto the surface of the first substrate P1 and reflected by the surface of the first substrate P1. Similarly, the second focus leveling detection system 82 comprises a projection system 82A that inmates detection light from an incline direction onto the surface of the second substrate P2, and a reception system 82B capable receiving the detection light irradiated onto the surface of the second substrate P2 and reflected by the surface of the second substrate P2. The first and second focus leveling detection systems 81, 82 can have a multipoint position detection system that measures the position information of the substrate in the Z-axis direction at a plurality of measurement points respectively, as disclosed for example in U.S. Pat. No. 6,608,681.

Moreover, the exposure apparatus EX comprises a first alignment system 91 that detects a reference mark 172 provided on the first substrate table 4T, and an alignment mark AM provided on the first substrate P1, and a second alignment system 92 that detects a reference mark 172 provided on the second substrate table 5T, and an alignment mark AM provided on the second subsume 2. Each of the first and second alignment systems 91 and 92 are alignment systems of an off axis method respectively provided in the vicinity of the third and fourth optical systems 13 and 14 of the projection optical system PL, and are alignment systems of the FIA (Field Image Alignment) method such as disclosed for example in Japanese Unexamined Patent Application, First Publication No. H04-65603 (corresponding to U.S. Pat. No. 5,493,403) and U.S. Pat. No. 5,646,413, that measure the position of a marker by irradiating a broad band detection beam which does not sensitize the photosensitive material on the first and second substrates P1 and P2, onto a target mark (alignment mark AM, and reference mark 172 etc.), and capturing the image of the target mark formed on the reception surface by reflection light from this target mark, and the image of an index (an index mark on an index plate provided in the alignment system) using an imager (CCD or the like), and image process these imaging signals. The index is one that stipulates a detection reference position of the first and second alignment systems 91 and 92 in a X axis and a Y axis directions within a XYZ coordinate system defined by the measurement system 3. The control apparatus 100 detects the position (coordinate value) of the detection target mark in the X axis and the Y axis directions based on a positional relationship (amount of displacement) between an image of the detection target mark detected by the alignment systems (91 and 92) and an image of the index mar, and based on a position information of the substrate stages (4 and 5) obtained from the measurement system 3 when the detection of mark using the alignment system. The baseline value of the alignment system (91, 92), that is a distance between the detection reference position of the alignment system (91, 92) and the projection position of at least one of the first and second pattern PA1 and PA2, is obtained by the detection of at least one of images of the alignment marks RM1 and RM2 of the first and second masks M1 and M2 by using the optical sensor 170, and by the detection of the reference mark 172 by using the alignment system (91, 92), and then the baseline value is stored in the storage device 102. In the present embodiment, each of the alignment mark AM and the reference mark 172 has a two dimensional mark, including for example two periodic marks periodically arranged along the X axis direction and the Y axis direction respectively. Furthermore, in the embodiment, the first substrate stage 4 and the first substrate table 4T are moved within a XYZ coordinate system defined by the measurement system 3 and the laser interferometers 34 and 36, and the second substrate stage 5 and the second table 5T are moved within a XYZ coordinate system defined by the measurement system 3 and the laser interferometers 35 and 37.

Figure 23:
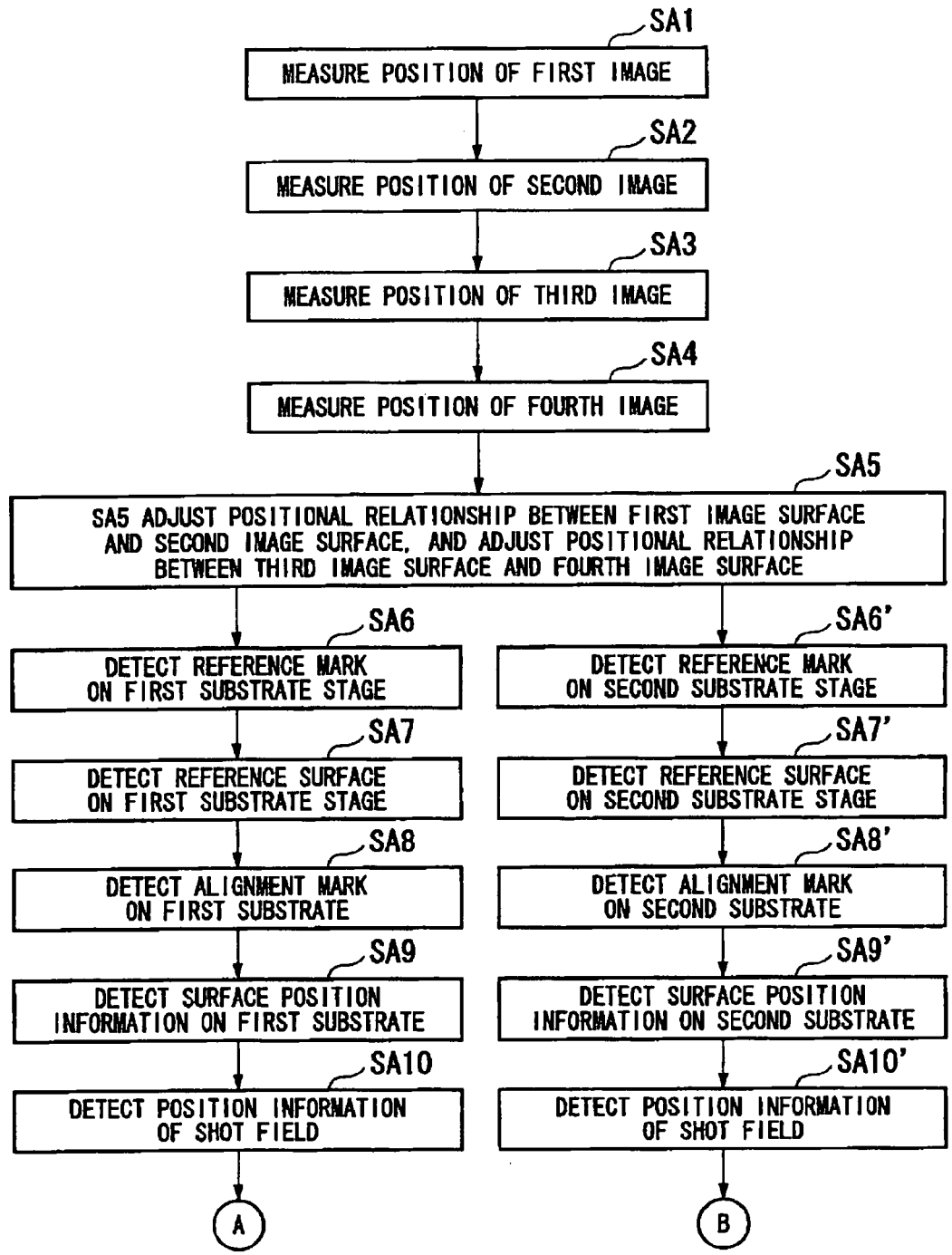
FIG. 23 is a flow chart for explaining an exposure method according to the seventh embodiment.
Figure 24:
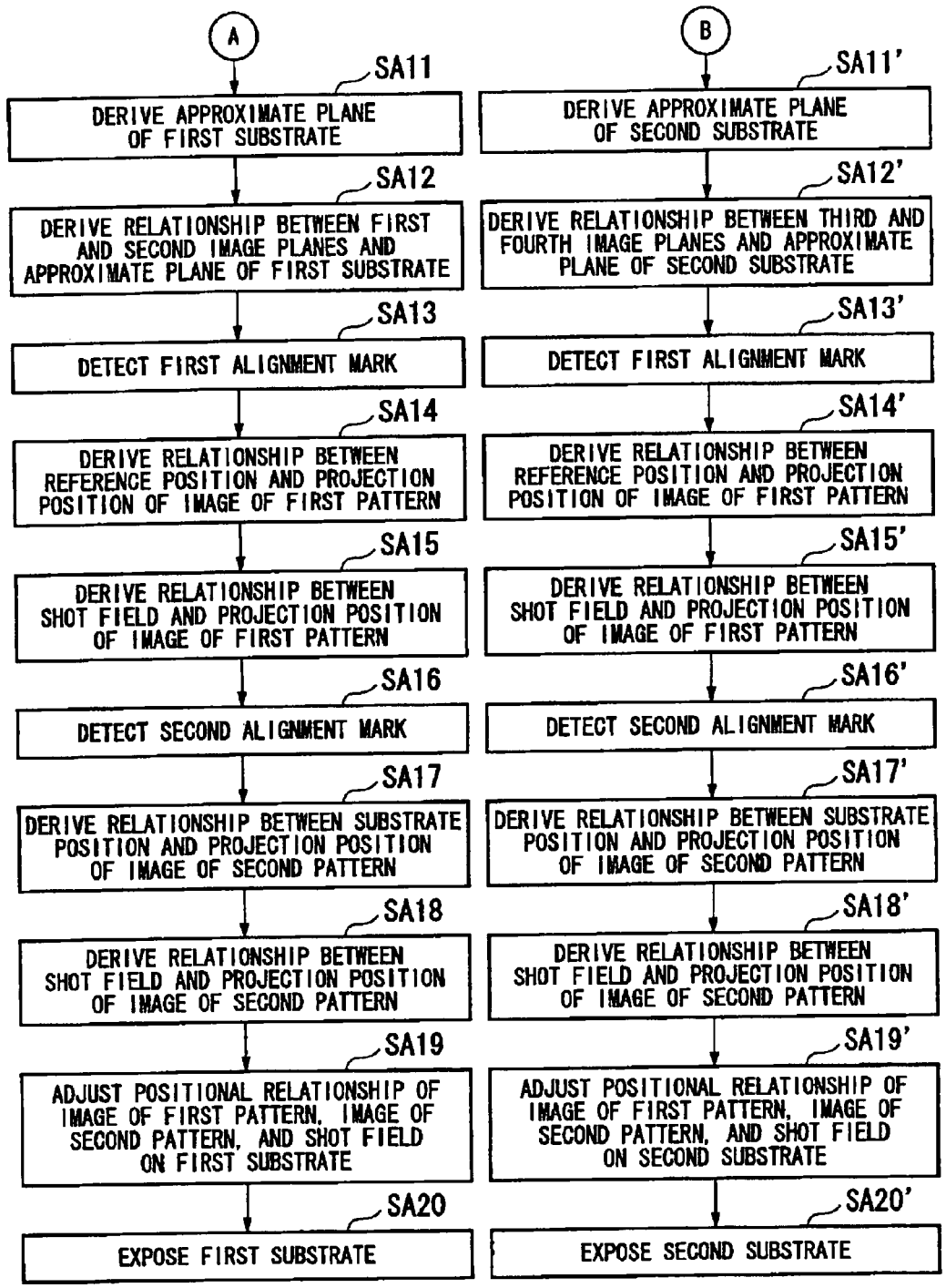
FIG. 24 is a flow chart for explaining an exposure method according to the seventh embodiment.

Next is a description of a method of exposing the first and second substrates P1 and P2 using the exposure apparatus EX having the above construction, with reference to the flow chart of FIG. 23 and FIG. 24.

After the first mask M1 is loaded on the first mask stage 1, and the second mask M2 is loaded on the second mask stage 2, the control apparatus 100 uses the optical sensor 170 to measure the position (the position of the Z axis, and the θX and θY directions) of the image plane formed with the image of the first pattern in the first exposure field AR1 (step SA1). Here in the following description, the image plane formed with the image of the first pattern PA1 in the first exposure field AR1 is appropriately called the first image plane.

In the case of measuring the position (the position of the Z axis, and the θX and θY directions) of the first image plane, the control apparatus 100 adjusts the position of the XY directions of the first substrate stage 4 using the first substrate stage drive device 4D while measuring the position information of the first substrate stage 4 with the laser interferometer 34 of the measurement system 3, and positions the aperture 173 on the first exposure field AR1. Then, the control apparatus 100 adjusts the position of the first mask stage 1 so that the first pattern PA1 of the first mask M1 is positioned on the optical axis of the first exposure light EL1. Furthermore, the control apparatus 100 controls the first mask stage 1 so that the pattern forming surface of the first mask M1 is positioned at a predetermined position in relation to the Z axis direction. Then the control apparatus 100 irradiates the first exposure light EL1 onto the first mask M1 by the first illumination system IL1. At this time, the irradiation of the second exposure light EL2 is stopped. On the bottom surface (the first pattern forming surface) of the first mask M1 is formed the measuring mark, and by irradiating the first exposure light EL1 on the first mask M1 an aerial image (projected image) of the measuring mark is formed on the first exposure field AR1 via the projection optical system PL. Here, the measurement mark is arranged at a position within the first illumination field IA1 corresponding to one measurement point so as to the aerial image is formed at the one measurement point among a plurality of measurement points that are used for measuring the position of the image plane within the first exposure field AR1. The aperture 173 is positioned on the first exposure field AR1. The control apparatus 100 moves the first substrate stage 4 in the X axis and the Y axis directions to execute a relatively scanning between the aerial image of the measurement mark formed on the one measurement point and the aperture 173. While the relatively scanning, the first exposure light EL1 which has passed through the aperture 173 is received on the optical sensor 170. That is to say, the aerial image of the measuring mark is measured by the optical sensor 170. The control apparatus 100 can obtain the position information (focus information) of the first image plane based on the reception result of the optical sensor 170.

When performing measurement of the position of the first image plane using the optical sensor 170, the control apparatus 100 uses the second drive system 4DV of the first substrate stage drive device 4D to move the first substrate table 4T (the reference surface 171 in which the aperture 173 is arranged) in the Z axis direction at a predetermined pitch, and while doing this performs measurement of the aerial image of the measurement mark in a plurality of repetitions, and stores the optical power signal (photoelectric conversion signal) each time. Then the control apparatus 100 obtains the contrast for each of the plurality of light intensity signals obtained by the plurality of measurements. Then the control apparatus 100 obtains the position of the Z axis direction of the first substrate table 4T (the reference surface 171) corresponding to the light intensity signal with the maximum contrast, and determines that position as the position where the first image plane is formed, that is as the best focus position for the projection optical system PL among the measurement points within the first exposure field AR1. Here the control apparatus 100 moves the first substrate table 4T in the Z axis direction at a predetermined pitch while measuring the position of the first substrate table 4T using the laser interferometer 36, and measures the aerial image. As a result, the control apparatus 100 can obtain the position of the Z axis direction of the first substrate table 4T (the reference surface 171) based on the measurement information of the laser interferometer 36. Consequently, the control apparatus 100 can obtain the position in the Z axis direction of the first image plane based on the measurement results of the optical sensor 170, and the measurement result of the laser interferometer 36. Furthermore, a plurality of measurement marks are provided on the first pattern forming surface of the first mask M1, and the measurement marks are respectively arranged at a plurality of positions in the first illumination field IA1 corresponding to the plurality of measurement points in the first exposure field AR1. Therefore, in similar with the abovementioned case, the control apparatus 100 can obtain the position in the Z axis direction of the first image plane at each of the measurement points in the first exposure field AR1 by detecting the aerial image of the respective measurement marks with the optical sensor 170. As a result, the position (the inclination) in the θX and θY directions of the first image plane can be measured.

Next, the control apparatus 100 measures the position (the position of the Z axis, and the θX and θY directions) of the image plane formed with the image of the second pattern PA2 in the second exposure field AR2 (step SA2). Here in the following description, the image plane formed with the image of the second pattern PA2 in the second exposure field AR2 is appropriately called the second image plane.

In the case of measuring the position (the position of the Z axis, and the θX and θY directions) of the second image plane, the control apparatus 100 adjusts the position of the XY directions of the first substrate stage 4 using the first substrate stage drive device 4D while measuring the position information of the first substrate stage 4 with the laser interferometer 34 of the measurement system 3, and positions the aperture 173 on the second exposure field AR2. Then, the control apparatus 100 adjusts the position of the second mask stage 2 so that the second pattern PA2 of the second mask M2 is positioned on the optical axis of the second exposure light EL2. Furthermore, the control apparatus 100 controls the second mask stage 2 so that the pattern forming surface of the second mask M2 is positioned at a predetermined position in relation to the Y axis direction. Then the control apparatus 100 irradiates the second exposure light EL2 onto the second mask M2 by the second illumination system IL2. At this time, the irradiation of the first exposure light EL1 is stopped. On the bottom surface (the pattern forming surface) of the second mask M2 is formed the measuring mark, and by irradiating the second exposure light EL2 on the second mask M2 an aerial image of the measuring mark is formed on the second exposure field AR2 via the projection optical system PL. Here, the measurement mark is arranged at a position within the second illumination field IA2 corresponding to one measurement point so as to the aerial image is formed at the one measurement point among a plurality of measurement points that are used for measuring the position of the image plane within the second exposure field AR2. The aperture 173 is arranged at the second exposure field AR2. The control apparatus 100 moves the first substrate stage 4 in the X axis and the Y axis directions to execute a relatively scanning between the aerial image of the measurement mark formed on the one measurement point and the aperture 173. While the relatively scanning, the second exposure light EL2 which has passed through the aperture 173 is received on the optical sensor 170. That is to say, the aerial image of the measuring mark formed by the second exposure light EL2 is measured by the optical sensor 170. The control apparatus 100 can obtain the position information (focus information) of the second image plane based on the reception result of the optical sensor 170. Similarly to the aforementioned step SA1, the control apparatus 100 moves the first substrate table 4T (the reference surface 171 in which the aperture 173 is arranged) in the Z axis direction at a predetermined pitch, and while doing this performs measurement of the aerial image of the measurement mark in a plurality of repetitions. The control apparatus 100 can obtain the position information in the Z axis direction of the second image plane based on the measurement results of the optical sensor 170, and the measurement result of the laser interferometer 36. Furthermore, a plurality of measurement marks are provided on the second pattern forming surface of the second mask M2, and the measurement marks are respectively arranged at a plurality of positions in the second illumination field IA2 corresponding to the plurality of measurement points in the second exposure field AR2. Therefore, in similar with the abovementioned case, the control apparatus 100 can obtain the position (i.e., best focus position for the projection optical system PL) in the Z axis direction of the second image plane at each of the measurement points in the second exposure field AR2 by detecting the aerial image of the respective measurement marks with the optical sensor 170. As a result, the position (the inclination) in the θX and θY directions of the second image plane can be measured.

Next, the control apparatus 100 measures the position (the position of the Z axis, and the θX and θY directions) of the image plane formed with the image of the first pattern PA1 in the third exposure field AR3 (step SA3). Here in the following description, the image plane formed with the image of the first pattern PA1 in the third exposure field AR3 is appropriately called the third image plane.

In the case of measuring the position (the position of the Z axis, and the θX and θY directions) of the third image plane, the control apparatus 100 adjusts the position of the XY directions of the second substrate stage 5 using the second substrate stage drive device 5D while measuring the position information of the second substrate stage 5 with the laser interferometer 35 of the measurement system 3, and positions the aperture 173 on the third exposure field AR3. Then, the control apparatus 100 adjusts the position of the first mask stage 1 so that the first pattern PA1 of the first mask M1 is positioned on the optical axis of the first exposure light EL1. Furthermore, the control apparatus 100 controls the first mask stage 1 so that the pattern forming surface of the first mask M1 is positioned at a predetermined position in relation to the Z axis direction. Then the control apparatus 100 irradiate the first exposure light EL1 onto the first mask M1 by the first illumination system IL1. At this time, the irradiation of the second exposure light EL2 is stopped. On the bottom surface (the first pattern forming surface) of the first mask M1 is formed the measuring mark, and by irradiating the first exposure light EL1 on the first mask M1 an aerial image of the measuring mark is formed on the third exposure field AR3 via the projection optical system PL. The aperture 173 is arranged at the third exposure field AR3. The control apparatus 100 moves the second substrate stage 5 in the X axis and the Y as directions to execute a relatively scanning between the aerial image of the measurement mark formed on one measurement point among a plurality of measurement points within the third exposure field AR3, and the aperture 173. While the relatively scanning, the first exposure light EL1 which has passed through the aperture 173 is received on the optical sensor 170. That is to say, the aerial image of the measuring mark is measured by the optical sensor 170. The control apparatus 100 can obtain the position information (focus information) of the third image plane based on the reception result of the optical sensor 170. Similarly to the aforementioned steps SA1 and SA2, the control apparatus 100 moves the second substrate table 5T (the reference surface 171 in which the aperture 173 is arranged) in the Z axis direction at a predetermined pitch, and while doing this performs measurement of the aerial image of the measurement mark in a plurality of repetitions. The control apparatus 100 can obtain the position information of the third image plane in the Z axis direction based on the measurement results of the optical sensor 170 and the measurement result of the laser interferometer 37. Furthermore, in similar with the abovementioned case, the control apparatus 100 can obtain the position (i.e., best focus position for the projection optical system PL) in the Z axis direction of the third image plane at each of the measurement points in the third exposure field AR3 by detecting the aerial image of the respective measurement mars at the measurement points in the third exposure field AR3 with the optical sensor 170. As a result, the position (the inclination) in the θX and θY directions of the third image plane can be measured. In the abovementioned measurement process of the first image plane (step SA1), when the measurement mark of the first mask M1 is illuminated with the first exposure light EL1, the image of the measurement mark is formed not only on the first exposure field AR1 but also on the third exposure field AR3. Therefore, at least a part of the measurement process of the third image plane (step SA3) may be performed along with the measurement press of the first image plane (step SA1).

Next, the control apparatus 100 measures the position (the position of the Z axis, and the θX and θY directions) of the image plane formed with the image of the second pattern PA2 in the fourth exposure field AR4 (step SA4). Here in the following description, the image plane formed with the image of the second pattern PA2 in the fourth exposure field AR4 is appropriately called the fourth image plane.

In the case of measuring the position (the position of the Z axis, and the θX and θY directions) of the fourth image plane, the control apparatus 100 adjusts the position of the XY directions of the second substrate stage 5 using the second substrate stage drive device 5D, while measuring the position information of the second substrate stage 5 with the laser interferometer 35 of the measurement system 3, and positions the aperture 173 on the fourth exposure field AR4. Then, the control apparatus 100 adjusts the position of the second mask stage 2 so that the second pattern PA2 of the second mask M2 is positioned on the optical axis of the second exposure light EL2. Furthermore, the control apparatus 100 controls the second mask stage 2 so that the pattern forming surface of the second mask M2 is positioned at a predetermined position in relation to the Y axis direction. Then the control apparatus 100 irradiates the second exposure light EL2 onto the second mask M2 by the second illumination system IL2. At this time, the irradiation of the first exposure light EL1 is stopped. On the bottom surface (the pattern forming surface) of the second mask M2 is formed the measuring mark, and by irradiating the second exposure light EL2 on the second mask M an aerial image of the measuring mark is formed on the fourth exposure field AR4 via the projection optical system PL. The aperture 173 is arranged at the fourth exposure field AR4. The control apparatus 100 moves the second substrate stage 5 in the X axis and the Y axis directions to execute a relatively scanning between the aerial image of the measurement mark formed on one measurement point among a plurality of measurement points for measuring the position of the image plane in the fourth exposure field AR4, and the aperture 173. While the relatively scanning, the second exposure light EL2 which has passed through the aperture 173 is received on the optical sensor 170. That is to say, the aerial image of the measuring mark is measured by the optical sensor 170. The control apparatus 100 can obtain the position information (focus information) of the fourth image plane based on the reception result of the optical sensor 170. Similarly to the aforementioned steps SA1 through SA3, the control apparatus 100 moves the second substrate table 5T (the reference surface 171 in which the aperture 173 is arranged) in the Z axis direction at a predetermined pitch, and while doing this performs measurement of the aerial image of the measurement mark in a plurality of repetitions. The control apparatus 100 can obtain the position information of the fourth image plane in the Z direction based on the measurement results of the optical sensor 170 and the measurement result of the laser interferometer 37. Furthermore, in similar with the abovementioned case, the control apparatus 100 can obtain the position (i.e., best focus position for the projection optical-system PL) in the Z axis direction of the fourth image plane at each of the measurement points in the fourth exposure field AR4 by detecting the aerial image of the respective measurement marks at the measurement points in the fourth exposure field AR4 with the optical sensor 170. As a result, the position (the inclination) in the θX and θY directions of the fourth image plane can be measured. In the abovementioned measurement process of the second image plane (step SA2), when the measurement mark of the second mask M2 is illuminated with the second exposure light EL2, the image of the measurement mark is formed not only on the second exposure field AR2 but also on the fourth exposure field AR4. Therefore, at least a part of the measurement process of the fourth image plane (step SA4) may be performed along with the measurement process of the second image plane (step SA2).

Next, the control apparatus 100 adjusts the positional relationship of the first image plane and the second image plane, and adjusts the positional relationship of the third image plane and the fourth image plane, based on the detection result obtained in the aforementioned steps SA1 through SA4 (step SA5).

The control apparatus 100 uses at least one of the first mask stage 1 and the second mask stage 2, and controls the position of at least one of the first pattern forming surface of the first mask M1, and the second pattern forming surface of the second mask M2, and adjusts the positional relationship of the first image plane and the second image plane, and the positional relationship of the third image plane and the fourth image plane. Here the position adjustment of the first pattern forming surface of the first mask M1 involves positional adjustment in relation to the Z axis direction (the direction parallel to the optical axis AX1 of the first optical system 11), and the θX and the θY directions (the incline direction with respect to a plane perpendicular to the optical axis AX1, for example the object plane of the projection optical system PL), and the position adjustment of the second pattern forming surface of the second mask M2 involves positional adjustment in relation to the Y axis direction (the direction parallel to the optical axis AX2 of the second optical system 12), and the θX and the θZ directions (the incline direction with respect to a plane perpendicular to the optical axis AX2, for example the object surface of the projection optical system PL).

FIG. 25 is a schematic diagram for illustrating a relationship between the position of a first pattern forming surface K1 of the first mask M1, and the position of a first image plane IS1 and a third image plane IS3 formed with the image of the first pattern PA1 by means of the projection optical system PL. In the case where, as in FIG. 25, the first pattern forming surface K1 of the first mask M1 is positioned at a first position Z1 in relation to the Z axis direction, and the first image plane IS1 and the third image plane IS3 formed with the image of the first pattern PA1 of the first pattern forming surface K1 are formed in a second position Z2 in relation to the Z axis direction, then in the case where the first pattern forming surface K1 is displaced by only ΔZK from the first position Z1 in the Z direction and positioned at a third position Z3, the first image plane IS1 and the third image plane IS3 also are formed at a fourth position Z4 displaced by only ΔZ1 in the −Z direction corresponding to the value ΔZK. In this manner, if the first pattern forming surface K1 moves in the −Z direction, then the first image plane IS1 and the third image plane IS3 also move in the −Z direction. Furthermore, if the first pattern forming surface K1 moves in the +Z direction, then the first image plane IS1 and the third image plane IS3 also move in the +Z direction. Moreover, if the first pattern forming surface K1 is inclined in the θX direction, then the first image plane IS1 and the third image plane IS3 also are inclined in the θX direction, and if the first pattern forming surface K1 is inclined in the θY direction, then the first image plane IS1 and the third image plane IS3 also are inclined in the θY direction.

As mentioned above, in the present embodiment, the first mask stage 1 is able to adjust the position of the held first mask M1 in the Z axis, the θX and the θY directions, and in turn, the position of the first pattern forming surface K1 in the Z axis, the θX and θY directions. Consequently, the control apparatus 100 can adjust the position of the first image plane IS1 and the third image plane IS3 by driving the first mask stage 1 with the first mask stage drive device 1D and adjusting the position of the first pattern forming surface K1 of the first mask M1.

The relationship of the position of the first pattern forming surface K1, and the positions of the first image plane IS 1 and the third image plane IS3 (for example, the relationship of the movement amount of the first pattern forming surface K1, and the variation amount of the first image plane IS1 and the third image plane IS3) is obtained beforehand using the aforementioned optical sensor (aerial image measuring instrument) 170, and is stored in the storage device 102. For example, the control apparatus 100 can obtain beforehand the position of the first image plane IS1 and the third image plane IS3 in the Z axis direction corresponding to the respective positions in the Z axis direction of the first pattern forming surface K1, by measuring the aerial image of the measuring mark of the first mask M1 using the optical sensor 170, while changing the position of the first pattern forming surface K1 of the first mask M1 in the Z axis direction at a predetermined pitch.

Similarly, if the second pattern forming surface K2 moves in the Y axis direction, then the second image plane and the fourth image plane also move in the Z axis direction. Moreover, if the second pattern forming surface K2 is inclined, then the second image plane and the fourth image plane also are inclined. The second mask stage 2 is able to adjust the position of the second mask M2 in the Y axis, the θX and the θZ directions, and in turn, the position of the second pattern forming surface K2 in the Y axis, the θX and θZ directions. Consequently, the control apparatus 100 can adjust the position of the second image plane and the fourth image plane by driving the second mask stage 2 with the second mask stage drive device 2D and adjusting the position of the second pattern forming surface K2 of the second mask M2.

Furthermore, the relationship of the position of the second pattern forming surface K2, and the positions of the second image plane and the fourth image plane (for example, the relationship of the movement amount of the second pattern forming surface K2, and the variation amount of the second image plane and the fourth image plane) is obtained beforehand using the optical sensor (aerial image measuring instrument) 170, and is stored in the storage device 102. For example, the control apparatus 100 can obtain beforehand the position of the second image plane and the fourth image plane in the Z axis direction corresponding to the respective positions in the Y axis direction of the second pattern forming surface K2, by measuring the aerial image of the measuring mark of the second mask M2 using the optical sensor 170, while changing the position of the second pattern forming surface K2 of the second mask M2 in the Y axis direction at a predetermined pitch. It should be noted that the positional relationship between the first pattern forming surface K1 and the first and third image planes IS1 and IS3, and the positional relationship between the second pattern forming surface K2 and the second and fourth image planes IS2 and IS4 can be obtained by using simulation or the like, based on for example the optical characteristic (imaging characteristic) of the projection optical system PL.

The control apparatus 100 controls at least one of the first mask stage 1 and the second mask stage 2 based on the information stored in the storage device 102, and adjusts the position of at least one of the first mask M1 and the second mask M2, and can thereby adjust the positional relationship of the first image plane and the second image plane, and the positional relationship of the third image plane and the fourth image plane.

In the present embodiment, the control apparatus 100 adjusts at least one of the position of the first image plane and the position of the second image plane so that the first image plane and the second image plane are substantially parallel with the XY plane, and so that the position in the Z axis direction is substantially the same, and adjusts at least one of the position of the third image plane and the position of the fourth image plane so that the third image plane and the fourth image plane are substantially parallel with the XY plane, and so that the position in the Z axis direction is substantially the same. That is to say, in the present embodiment, the control apparatus 100 controls the position of the first mask M1 and the second mask M2 so that the first image plane and the second image plane coincide, and so that the third image plane and the fourth image plane coincide.

The control apparatus 100 may adjust the positional relationship of the first image plane and the second image plane, and the positional relationship of the third image plane and the fourth image plane, using for example at least one of the first and second imaging characteristic adjusting devices LC1 and LC2, instead of the first and second mask drive devices 1D and 2D, or together with the first and second mask drive device 1D and 2D.

Furthermore, the control apparatus 100 stores in the storage device 102, the positions (position of the Z axis, and the θX and the θY directions) of the first image plane, the second image plane, the third image plane, and the fourth image plane after adjustment.

Next, the control apparatus 100 moves the first substrate stage 4 in the XY direction, and positions the measurement field 174 on the first substrate stage 4, in the detection field of the first alignment system 91. Then, the control apparatus 100, while measuring the position information for the X axis direction and the Y axis direction of the first substrate stage 4 with the laser interferometer 34, detects the reference mark 172 provided on the measurement field 174 on the first substrate stage 4, using the first alignment system 91 (step SA6). As a result, the control apparatus 100 can obtain a detection reference position of the first alignment system 91 (i.e., positional information of the detection center in the X axis and the Y axis directions) based on the detection result of the first alignment system 91 and the measurement result of the laser interferometer 34. The obtained detection reference position is stored in the storage device 102.

Moreover, the control apparatus 100, while measuring the position information for the Z axis direction of the first substrate stage 4 with the laser interferometer 36, detects the reference surface 171 provided on the measurement field 174 on the first substrate stage 4, using the first focus leveling detection system 81 (step SA7). As a result, the control apparatus 100 can obtain the surface position information related to the Z axis direction and the θX and the θY directions of the reference surface 171 on the measurement field 174. The surface position information of the reference surface 171 may be previously measured and stored in the storage device 102. In this case, step SA7 can be omitted.

Furthermore, the control apparatus 100 detects the alignment mark AM provided corresponding to at least a part of the plurality of shot fields S1 through S21 on the first substrate P1 with the laser interferometer 34, while measuring the position information in the X axis direction and the Y axis direction of the first substrate stage 4 holding the first substrate P1 using the first alignment system 91 (step SA8). As a result, the control apparatus 100 can obtain the position information related to the X axis direction and the Y axis direction of the respective alignment marks AM.

Moreover, the control apparatus 100, while measuring the position information for the Z axis direction of the first substrate stage 4 with the laser interferometer 36, detects the surface position information of the surface of the first substrate P1 held on the first substrate stage 4, using the first focus leveling detection system 81 (step SA9).

In the present embodiment, the control apparatus 100 controls the movement of the first substrate stage 4 with the laser interferometer 34, and detects the surface position in the Z axis direction of the surface of the first substrate P1 at a plurality of detection points using the first focus leveling detection system 81, while moving the first substrate stage 4 holding the first substrate P1, within the XY plane. As a result, the control apparatus 100 can obtain the surface position information for the surface of the first substrate P1. The detection results of the first focus leveling detection system 81 are stored in the storage device 102 corresponding to the position within the XY plane of the first substrate P1.

The control apparatus 100 obtains the position information of the respective plurality of shot fields S1 through S21 on the first substrate P1, with respect to the reference position of the first alignment system 91 obtained in step SA6, based on the position information of the respective alignment marks AM on the first substrate P1 obtained in step SA8, by means of arithmetic processing (step SA10).

In the embodiment, each position information (coordinate values in the X axis and the Y axis directions) of the shot regions on the first substrate P1 is derived by using a so-called EGA (enhanced global alignment) system disclosed in, for example, Japanese Unexamined Patent Application, First Publication No. S61-44429 (corresponding to U.S. Pat. No. 4,780,617).

Furthermore, the control apparatus 100 creates map data based on the position information for the plurality of detection points of the surface of the first substrate P1 detected in step SA9, and obtains the approximate plane (approximate spice) of the respective shot fields of the surface of the first substrate P1 with the reference surface 171 as a reference, based on the map data (step SA11). Then, the control apparatus 100 stores the approximate plane of the surface of the first substrate P1 in the storage device 102.

The control apparatus 100 moves the first substrate stage 4, and positions the measurement field 174 on the first substrate stage 4 so that the aperture 173 is positioned at in either the first or second exposure field AR1 or AR2 of the projection optical system PL, for example in the first exposure field AR1.

At this time, the control apparatus 100 controls the position and attitude of the first substrate table 4T, using the output of the laser interferometer 36, so that the first and second image planes and the reference surface 171 after adjustment in step SA5 substantially coincide. As a result, the control apparatus 100 can specify the relationship between the measurement value of the laser interferometer 36, the first and second image planes, and the reference surface 171, and can determine the relationship between the approximate plane of the surface of the first substrate P1 obtained in step SA11, the measurement value of the laser interferometer 36, and the first and second image planes (step SA12).

The control apparatus 100, while measuring the position information of the first substrate stage 4 with the measurement system 3, detects the aerial image of the first alignment mark RM1 provided on the first mask M1, using the optical sensor 170 (step SA13).

That is to say, the control apparatus 100 makes the third optical system 13 of the projection optical system PL and the measurement field 174 on the first substrate stage 4 face each other, and illuminates the first alignment mark RM1 of the first mask M1 with the first exposure light EL1. As a result, the aerial image of the first alignment mark RM1 is projected onto the measurement field 174 via the projection optical system PL, and the optical sensor 170 can detect the aerial image of the first alignment mark RM1 via the aperture 173 in the measurement field 174. The control apparatus 100 obtains the position information (projecting position) of the image of the alignment mark RM1 in the X axis and the Y axis directions based on the detection result of the optical sensor 170 and the measurement result of the measurement system 3. The first pattern PA1 of the first mask M1 and the first alignment mark RM1 have been formed with a predetermined positional relationship, and the positional relationship is already known. Therefore, the control apparatus 100 can obtain the position information (projection position) of the image of the first pattern PA1 in the X axis and the Y axis based on the known position relationship and on the projection position of the first alignment mark RM1.

Furthermore, the positional relationship for the reference mark 172 in the measurement field 174, and the aperture 173 (optical sensor 170) is already known. The control apparatus 100, based on the known positional relationship, the detection reference position of the first alignment system 91 obtained in step SA6, and the projection position of the first pattern PA1 obtained in step SA13, derives the relationship between the detection reference position of the first alignment system 91 and the projection position of the image of the first pattern PA1 of the first mask M1 (step SA14). That is, the control apparatus 100 can determine the baseline value of the first alignment system 91.

The control apparatus 100, based on the positional relationship obtained in step SA10 between the detection reference position of the first alignment system 91, and the respective shot fields on the first substrate P1 (i.e., the array information of the shot fields corresponding to the detection reference position), and the relationship (i.e., the abovementioned baseline value) obtained in step SA14 between the detection reference position of the first alignment system 91, and the projection position of the image of the first pattern PA1, derives the relationship between the respective shot fields S1 through S21 on the first substrate P1, and the projection position of the image of the first pattern PA1 (step SA15). That is, the positional relationship (the array information in the X axis and the Y axis directions) of the each shot field on the first substrate P1 which is to be exposed with the image of the first pattern PA1.

Furthermore, the control apparatus 100, while measuring the position information of the first substrate stage 4 with the measurement system 3, detects the aerial image of the second alignment mark RM2 provided on the second mask M2, using the optical sensor 170 (step SA16).

That is to say, the control apparatus 100 makes the third optical system 13 of the projection optical system PL and the measurement field 174 on the first substrate stage 4 face each other, and illuminates the second alignment mark RM2 of the second mask M2 with the second exposure light EL2. As a result, the aerial image of the second alignment mark RM2 is projected onto the measurement field 174 via the projection optical system PL, and the optical sensor 170 detects the image of the second alignment mark RM2 via the aperture 173 in the measurement field 174. The control apparatus 100 obtains the position information (projecting position) of the image of the alignment mark RM2 in the X axis and the Y axis directions based on the detection result of the optical sensor 170 and the measurement result of the measurement system 3. The second pattern PA2 of the second mask M2 and the second alignment mark RM2 have been formed with a predetermined positional relationship, and the positional relationship is already known. Therefore, the control apparatus 100 can obtain the position information (projection position) of the image of the second pattern PA2 in the X axis and the Y axis based on the known position relationship and on the projection position of the second alignment mark RM2.

Furthermore, the positional relationship for the reference mark 172 in the measurement field 174, and the aperture 173 (optical sensor 170) is already known. The control apparatus 100, based on the known positional relationship, the detection reference position of the first alignment system 91 obtained in step SA6, and the projection position of the second pattern PA2 obtained in step SA16, derives the relationship between the detection reference position of the first alignment system 91 and the projection position of the image of the second pattern PA2 of the second mask M2 (step SA17).

The control apparatus 100, based on the positional relationship obtained in step SA10 between the detection reference position of the first alignment system 91, and the respective shot fields on the first substrate P1 (i.e., the array information of the shot fields corresponding to the detection reference position), and the relationship obtained in step SA17 between the detection reference position of the first alignment system 91, and the projection position of the image of the second pattern PA2, derives the relationship between the respective shot fields S1 through S21 on the first substrate P1 within the coordinate system stipulated by the measurement system 3, and the projection position of the image of the second pattern PA2 (step SA18). That is, the positional relationship (the array information in the X axis and the Y axis directions) of the each shot field on the first substrate P1 which is to be exposed with the image of the second pattern PA2.

The control apparatus 100, based on the results obtained in step SA15 and step SA18, adjusts the positional relationship for the image of the first pattern PA1, the image of the second pattern PA2, and the shot field S on the first substrate P1 (step SA19). That is to say, the control apparatus 100 adjusts the position of the first mask stage 1 and the second mask stage 280 that the image of the first pattern PA1 and the image of the second pattern PA2 are formed on the desired position of the shot field S on the substrate P, and adjusts the positional relationship between the first mask M1 and the second mask M2. More specifically, the control apparatus 100 adjusts the position of the first pattern PA1 of the first mask M1 in the Y axis direction (scanning direction), and the position of the second pattern PA2 of the second mask M2 in the Z axis direction (scanning direction), and adjusts the position where the image of the first pattern PA1 and the image of the second pattern PA2 on the first substrate P1 are formed. The positional relationship between the shot field S on the substrate P, the image of the first pattern PA1, and the image of the second pattern PA2 may be adjusted using at least one of the first and second imaging characteristic adjustment devices LC1 and LC2.

Furthermore, the control apparatus 100 controls a second drive system 4DV based on a measurement value of a laser interferometer 36 which is associated with the approximate plane of the first subsume P1 obtained in step SA11 and the first and second image planes, and while adjusting the position of the surface (exposure surface) of the first substrate P1, controls the first drive system 4DH based on the relationship between the respective shot fields S1 through S21 on the first substrate P1, the projection position of the image of the first pattern PA1, and the projection position of the image of the second pattern PA2, obtained in steps SA15 and SA18, and controls the position of the first substrate P1 in the X axis direction, the Y axis direction, and the θZ direction, to sequentially expose the plurality of shot fields S1 through S21 on the first substrate P1 (step SA20).

In the embodiment, before the exposure process (step SA20), the positional relationship between the images of the first and second patterns PA1 and PA2, and the shot field S on the first substrate P1 is adjusted in step SA. However, step SA19 can be omitted and the positional relationship can be adjusted in step SA20. That is to say, the control apparatus 100 synchronously performs movement of the first and second masks M1 and M2 with respect to the first and second illumination fields IA1 and IA2 by means of the first and second mask stages 1 and 2, movement of the first substrate P1 with respect to the first and second exposure fields AR1 and AR2 by means of the first substrate stage 4, and movement of the second substrate P2 with respect to the third and fourth exposure fields AR3 and AR4 by means of the second substrate stage 5, based on the each position information obtained in step SA15 of the shot fields on the first substrate P1, and the positional relationship obtained from the projection positions obtained in steps SA13 and SA16 of the first and second patterns PA1 and PA2. As a result, in the each shot field on the first substrate P1, the image of the first pattern PA1 and the image of the second pattern PA2 are formed with desired positional relationship. In this case, steps SA17 and SA18 can be omitted. Furthermore, in the embodiment, the baseline value of the first alignment system 91 is determined in step SA14 using the projection position of the first pattern PA1, however, the baseline may be determined substitutional using or additional using the projection position of the second pattern PA2 obtained in step SA16. In the case where the baseline value of the first alignment system 91 is determined using only projection position of the second pattern PA2, steps SA14 and SA15 can be obtained by executing steps SA17 and SA18.

Furthermore, the processing of the abovementioned steps SA6 through SA20, that is to say, at least a part of the processing using the first substrate stage 4 holding the first substrate P1, and concurrently, the processing using the second substrate stage 5 holding the second substrate P2 is executed. That is to say, similarly to the abovementioned step SA6, the control apparatus 100, while measuring the position information of the second substrate stage 5 in the X axis direction and the Y axis direction with the laser interferometer 35, detects the reference mark 172 provided on the measurement field 174 on the second substrate stage 5 using the second alignment system 92 (step SA6'). As a result, the detection reference position of the second alignment system 92 is obtained. Furthermore, the control apparatus 100, while measuring the position information of the second substrate stage 5 in the Z axis direction with the laser interferometer 37, detects the reference surface 171 provided in the measurement field 174 on the second substrate stage 5 using the second focus leveling detection system 82 (step SA7').

Furthermore, the control apparatus 100, while measuring the position information for the X axis direction and the Y axis direction of the second mask stage 2, with the laser interferometer 35, detects the alignment mark AM which is associated with at least a portion of the plurality of shot fields S1 through S21 on the second substrate P2 using the second alignment system 92 (step SA8). Furthermore, the control apparatus 100, while measuring the position information of the second substrate stage 5 in the Z axis direction, with the laser interferometer 37, detects the surface position information of the sure of the second substrate P2 using the second focus leveling detection system 82 (step SA9'). The control apparatus 100 obtains the position information for the respective plurality of shot fields on the second substrate P2, with respect to the detection reference position obtained in step SA6' of the second alignment system 92, based on the position information for the respective alignment marks AM on the second substrate P2 obtained in step SA8', by means of EGA method (step SA10'). Furthermore, the control apparatus 100 creates map data based on the position information for the plurality of detection points of the surface of the second substrate P2 detected in step SA9', and obtains the approximate plane (approximate surface) of the respective shot fields of the surface of the second substrate P2 with the reference surface 171 as a reference, based on the map data (step SA11').

The control apparatus 100 moves the second substrate stage 5, and positions the measurement field 174 on the second substrate stage 5 so that the aperture 173 is positioned in the third or fourth projection field AR3 or AR4 of the projection optical system PL, for example in the third exposure field AR3. At this time, the control apparatus 100 controls the position and attitude of the second substrate table 5T, using the output of the laser interferometer 37, so that the third and fourth image planes and the reference surface 171 after adjustment in step SA5 substantially coincide. As a result, the control apparatus 100 can specify the relationship between the measurement value of the laser interferometer 37, the third and fourth image planes, and the reference surface 171, and can determine the relationship between the approximate plane of the surface of the second substrate P2 obtained in step SA11', the measurement value of the laser interferometer 37, and the third and fourth image planes (step SA12').

Then, the control apparatus 100, while measuring the position information of the second substrate stage 5 with the measurement at system 3, detects the aerial image of the first alignment mark RM1 of the first mask M1, using the optical sensor 170 (step SA13'). As a result, the projection position of the first pattern PA1 of the first mask M1 is obtained. The control apparatus 100 derives the relationship between the detection reference position obtained in step SA6' of the second alignment system 92, and the projection position obtained in step SA13' of the image of the first pattern PA1 (step SA14'). As a result, the baseline value of the second alignment system 92 is determined. The control apparatus 100, based on the positional relationship (i.e., the array information of the shot fields corresponding to the detection reference position) between the detection reference position obtained in step SA10' of the second alignment system 92 and the respective shot fields on the second substrate P2, and the relationship obtained in step SA14' between the detection reference position of the second alignment system 92 and the projection position of the image on the first pattern PA1, derives the relationship between the respective shot fields S1 through S21 on the second substrate P2 and the projection position of the image of the first pattern PA1 (step SA15'). As a result, the positional relationship (the array information in the X axis and the Y axis directions) of the each shot field on the second substrate P2 which is to be exposed with the image of the first pattern PA1.

Furthermore, the control apparatus 100, while measuring the position information of the second substrate stage 5 with the measurement system 3, detects the aerial image of the second alignment mark RM2 of the second mask M2, using the optical sensor 170 (step SA16'). As a result, the projection position of the second pattern PA2 is obtained. The control apparatus 100, based on the measurement results of step SA16', derives the relationship between the detection reference position of the second alignment system 92 and the projection position of the image of the second pattern PA2 of the second mask M2 (step SA17'). The control apparatus 100, based on the positional relationship (i.e., the array information of the shot fields corresponding to the detection reference position) between the detection reference position obtained in step SA10' of the second alignment system 92 and the respective shot fields on the second substrate P2, and the relationship obtained in step SA17' between the detection reference position of the second alignment system 92 and the projection position of the image on the second pattern PA2, derives the relationship between the respective shot fields S1 through S21 on the second substrate P2 and the projection position of the image of the second pattern PA2 (step SA18'). As a result, the positional relationship (the array information in the X axis and the Y axis directions) of the each shot field on the second substrate P2 which is to be exposed with the image of the second pattern PA2.

The control apparatus 100, based on the result obtained in step SA15' and the result obtained in step SA18', adjusts the positional relationship for the image of the first pattern PA1, the image of the second pattern PA2, and the shot field S on the second substrate P2 (step SA19'). Furthermore, the control apparatus 100 controls a second drive system 5DV based on a measurement value of a laser interferometer 37 which is associated with the approximate plane of the second substrate P2 obtained in step SA11' and the third and fourth image planes, and while adjusting the position of the surface (exposure surface) of the second substrate P2, controls the first drive system 5DH based on the relationship between the respective shot fields S1 through S21 on the second substrate 2, the projection position of the image of the first pattern PA1, and the projection position of the image of the second pattern PA2, obtained in steps SA15' and SA18', and controls the position of the second substrate in the X axis direction, the Y axis direction, and the θZ direction, to sequentially expose the plurality of shot fields S1 through S21 on the second substrate P2 (step SA20'). It should be noted that step SA19' may be omitted similar in step SA19. In addition, steps SA14' and SA15' or steps SA17' and SA18' may be omitted.

In the present embodiment, the control apparatus 100 performs at least one of an operation of multiply exposing the first substrate P1, and an operation of multiplying exposing the second substrate P2 in parallel. Furthermore, in the present embodiment the control apparatus 100 synchronously performs movement of the first mask M1 and the second mask M2 by means of the first mask stage 1 and the second mask stage 2, in the respective scanning directions (the Y axis direction and Z axis direction), and movement of the first substrate P1 and the second substrate P2 by means of the first substrate stage 4 and the second substrate stage 5, in the scanning direction (the Y axis direction). By so doing, it respectively illuminates the first pattern PA1 of the first mask M1 and the second pattern PA2 of the second mask M2 with the first exposure light EL1 and the second exposure light EL2, and respectively irradiates the first exposure light EL1 and the second exposure light EL2 on each of the first exposure field AR1 and the second exposure field AR2 on the first substrate P1, and multiply exposes the shot field S on the first substrate P1. Together with this, it respectively irradiates the first exposure light EL1 and the second exposure light EL2 on each of the third exposure field AR3 and the fourth exposure field AR4 on the second substrate n and multiply exposes the shot field S of the second substrate P2.

The control apparatus 100, while synchronously moving the first substrate P1 in the Y axis direction with respect to the first and second exposure fields AR1 and AR2, moving the second substrate n in the Y axis direction with respect to the third and fourth exposure fields AR3 and AR4, moving the first mask M1 in the Y axis direction with respect to the first illumination field IA1, and moving the second mask M2 in the Z axis direction with respect to the second illumination field IA2, multiply exposes the shot fields S on the first and second substrates P1 and P2. In the present embodiment, in the case where during exposure of the substrate P, for example the first mask M1 is moved in the +Y direction, then the second mask M2 is moved in the +Z direction, and the first substrate P1 and the second substrate P2 are moved in the +Y direction.

In the present embodiment, the control apparatus 100 can multiply expose (double expose) one shot field S on the fit substrate P1, by the image of the first pattern PA1 and the image of the second pattern PA2, in one round of the scanning operation, and can multiply expose (double expose) one shot field S on the second substrate P2, by the image of the first pattern PA1 and the image of the second pattern PA2, in one round of the scanning operation. The photosensitive material layer of the shot field S on the first substrate P1 is multiply exposed (double exposed) by the first exposure light EL1 irradiated onto the first exposure field AR1, and the second exposure light EL2 irradiated onto the second exposure field AR2, without going through the development steps and the like. Moreover, the photosensitive material layer of the shot field S on the second substrate P2 is multiply exposed (double exposed) by the first exposure light EL1 irradiated onto the third exposure field AR3, and the second exposure light EL2 irradiated onto the fourth exposure field AR4, without going through the development steps and the like.

As described above, each of the first and third exposure fields AR1 and AR3, and the second and fourth exposure fields AR2 and AR4 are respectively irradiated with the first and second exposure lights EL1 and EL2. Together with this, the first substrate P1 is moved so that the shot field S on the first substrate P1 passes through the first and second exposure fields AR1 and AR2, and the second substrate P2 is moved so that the shot field S on the second substrate P2 passes through the third and fourth exposure fields AR3 and AR4. As a result, the shot fields S on the first and second substrates P1 and P2 can be multiply exposed with good efficiency. Moreover, in the present embodiment, by multiply exposing the first substrate P1 and the second substrate P2 at substantially the same time, a plurality of substrates can be multiply exposed with good efficiency. Moreover, since one shot field S can be multiply exposed in one round of the scanning operation, the image of the first pattern PA1 and the image of the second pattern PA2 in the respective shot fields S can be formed with a desired positional relationship.

Furthermore, in the case where a plurality of exposure lights EL1 and EL2 are combined by the combining optical element 20, one or the other of the first exposure lights EL1 branched by the combining optical element 20 and one or other of the second exposure lights EL2 can be effectively used for the exposure light of the first and second substrates P1 and P2.

Moreover, in the present embodiment, for the combining optical element 20, a branching optical element (e.g., half mirror) that branches the respective optical paths of the first exposure fight EL1 and the second exposure light EL2 is used as the combining optical element 20. This branching optical element can favorably branch the exposure light even if for example the exposure light is random polarized light.

Eighth Embodiment

An eighth embodiment is described. In the following description, components the same as or similar to the above-mentioned embodiments are denoted by the same reference symbols, and their description is simplified or omitted.

Figure 26:
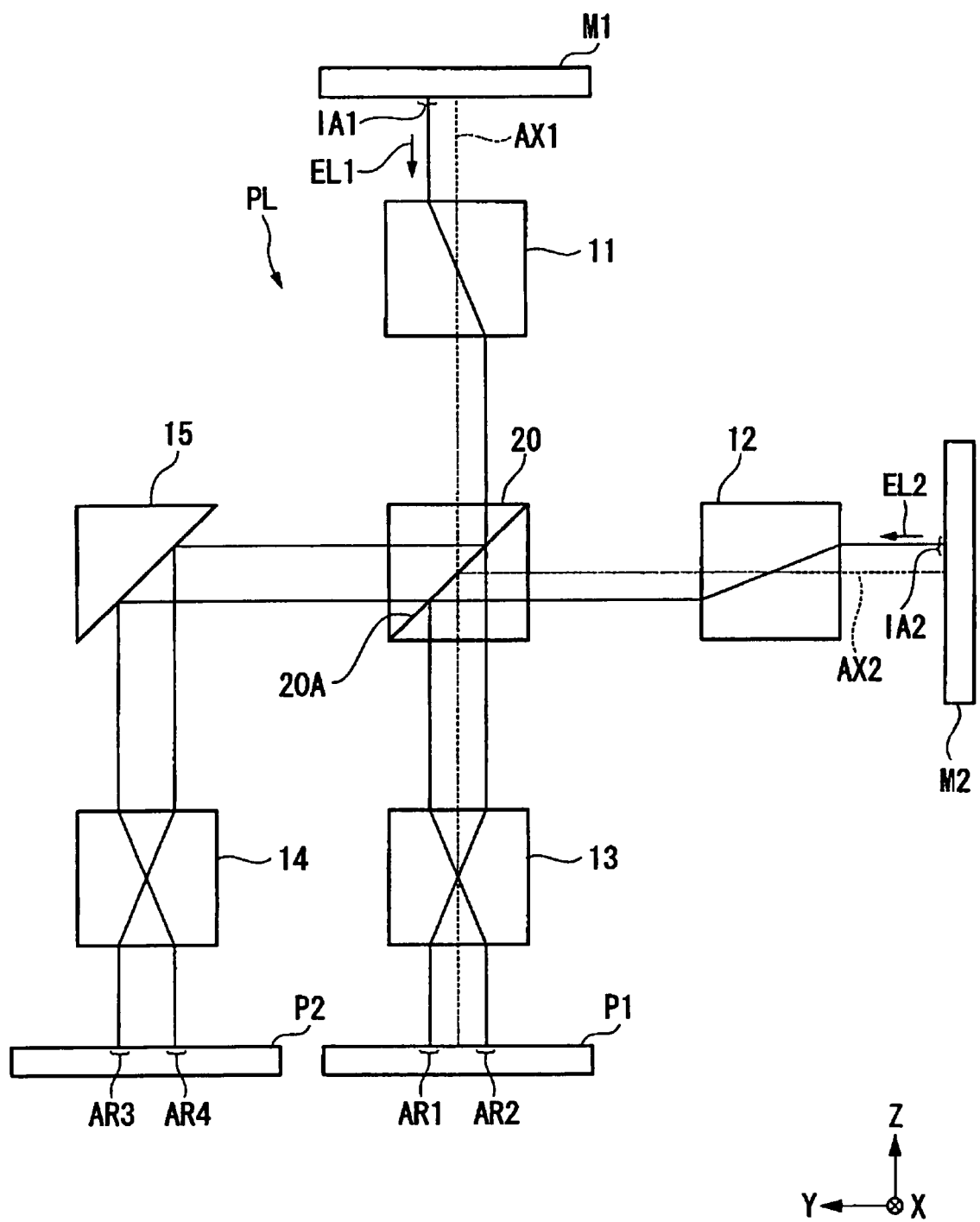
FIG. 26 shows an exposure apparatus according to an eighth embodiment.
Figure 27A:
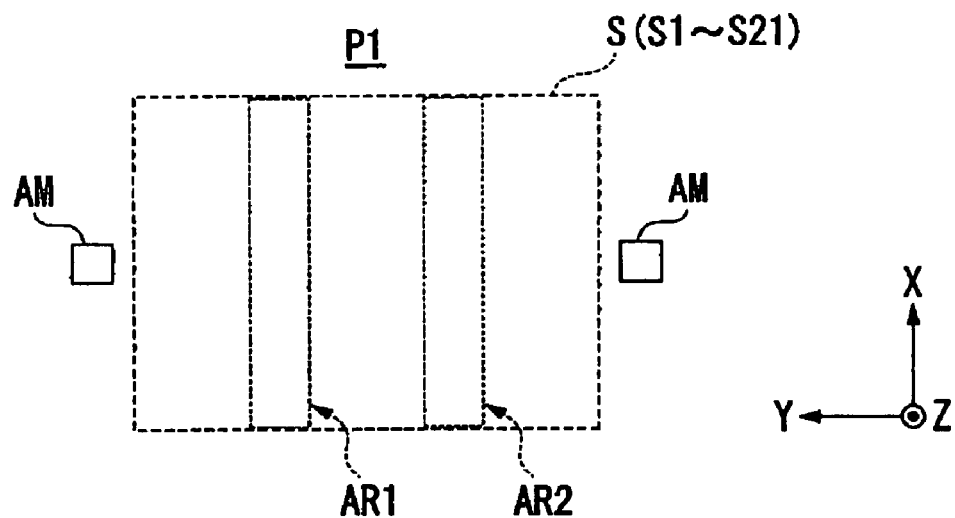
FIG. 27A is a schematic diagram showing a relationship between a shot field of a first substrate and a first and second exposure field, according to the eighth embodiment.
Figure 27B:
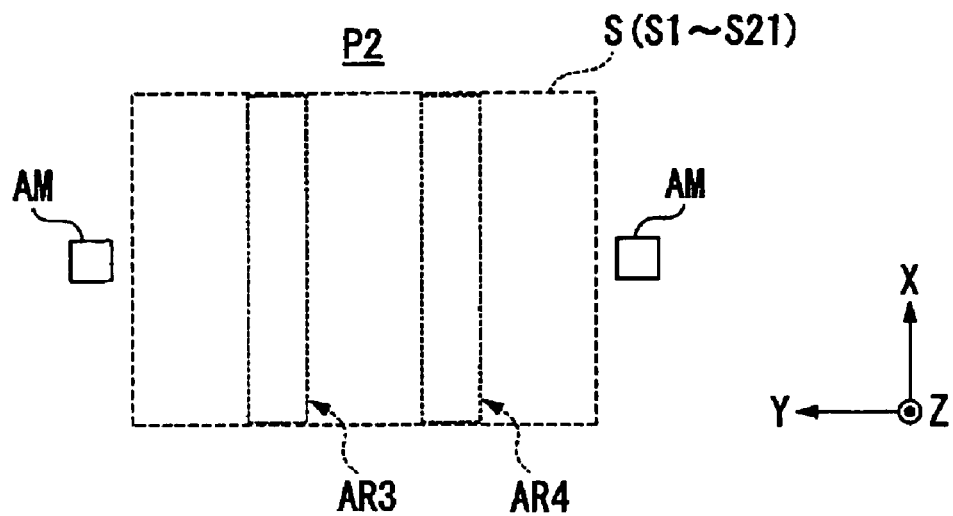
FIG. 27B is a schematic diagram showing a relationship between a shot field of a second substrate and a third and fourth exposure field, according to the eighth embodiment.
Figure 29:
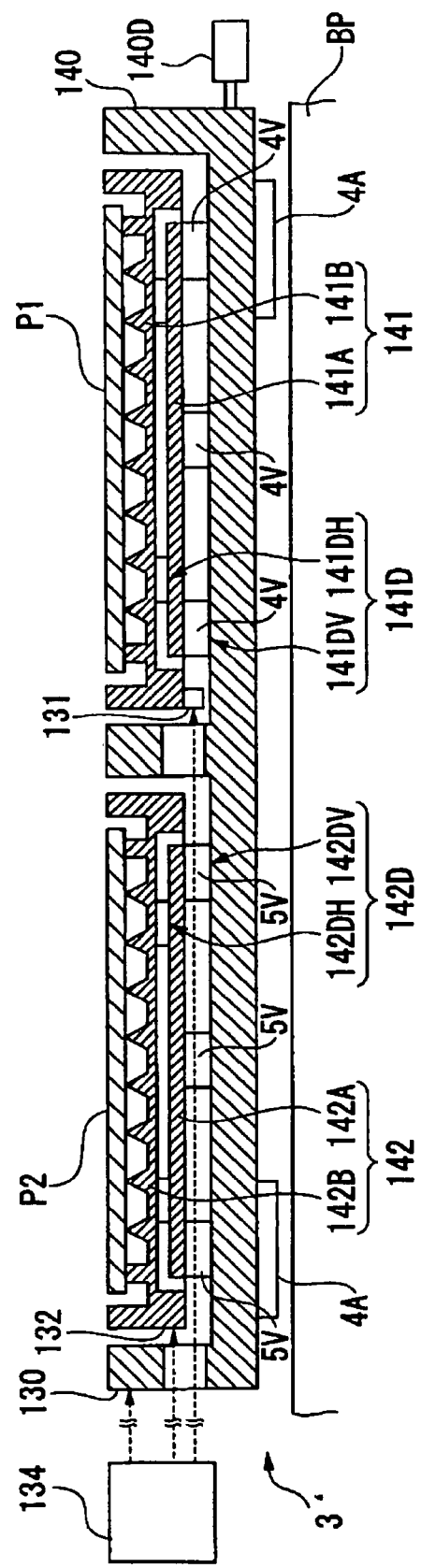
FIG. 29 is a cross-section showing a substrate stage according to the ninth embodiment.

FIG. 26 is a schematic diagram showing an exposure apparatus EX according to the eighth embodiment FIG. 27A is a schematic diagram showing the positional relationship between the shot field S on the first substrate P1, and the first and second exposure fields AR1 and AR2, according to the eighth embodiment, and FIG. 27B is a schematic diagram showing the positional relationship between the shot field S on the second substrate P2, and the third and fourth exposure fields AR3 and AR4. As shown in FIG. 29, the exposure apparatus EX of this embodiment, has a first illumination field IA1 on a first mask M1, and an optical axis AX1 of a first optical system 11 displaced, and has a second illumination field IA2 on a second mask M2, and an optical axis AX2 of a second optical system 12 displaced. In this case, as shown in FIG. 27A, the first exposure field AR1 and the second exposure field AR2 are set in different positions, and as shown in FIG. 27B, the third exposure field AR3 and the fourth exposure field AR4 are set in different positions. More specifically, the first exposure field AR1 and the second exposure field AR2 are arranged separated for example in relation to the Y axis direction (the scanning direction of the substrate P1), and the third exposure field AR3 and the fourth exposure field AR4 are arranged separated for example in relation to the Y axis direction (the scanning direction of the substrate P2). Furthermore, the first exposure field AR1 and the second exposure field AR2 can be simultaneously positioned on a single shot field S, and the third exposure field AR3 and the fourth exposure field AR4 can be simultaneously positioned on a single shot field S. That is to say, in the present embodiment, the distance in the Y axis direction between the first exposure field AR1 (center of the first exposure field AR1) and the second exposure field AR2 (center of the second exposure field AR2) is smaller than the width in the Y axis direction of the single shot field S on the substrate P1, and also the distance in the Y axis direction between the third exposure field AR3 (center of the first exposure field AR3) and the fourth exposure field AR4 (center of the second exposure field AR4) is smaller than the width in the Y axis direction of the single shot field S on the substrate P2.

In this manner, the shot field S of the first substrate P1 may be multiply exposed by the first exposure light EL1 and the second exposure light EL2 which are respectively irradiated onto the first exposure field AR1 and the second exposure field AR2 which are separated from each other, and the shot field S of the second substrate P2 may be multiply exposed by the first exposure light EL1 and the second exposure light EL2 which are respectively irradiated onto the third exposure field AR3 and the fourth exposure field AR4 which are separated from each other.

In the abovementioned seventh embodiment, the first exposure field AR1 and the second exposure field AR2 are overlapped (substantially coincide), and the third exposure field AR3 and the fourth exposure field AR4 are also overlapped (substantially coincide). In the eighth embodiment, the first exposure field AR1 and the second exposure field AR2 are separated, and the third exposure field AR3 and the fourth exposure field AR4 are separated. However a part of the first exposure field AR1 and the second exposure field AR2 may be overlapped. Similarly, a part of the third exposure field AR3 an the fourth exposure field AR4 may be overlapped.

Ninth Embodiment

Next is a description of a ninth embodiment. The characteristic part of this embodiment is the point that a substrate stage 4' has a main stage 140 capable of holding a first substrate P1 and a second substrate P2 and moving in substantially the same scanning direction, on the light emitting side (image-plane side) of the projection optical system PL, a first substage 141 capable of moving the first substrate P1 with respect to the main stage 140, and a second substage 142 capable of moving the second substrate P2 with respect to the main stage 140. In the following description, components the same as or similar to the abovementioned embodiments are denoted by the same reference symbols, and their description is simplified or omitted.

Figure 28:
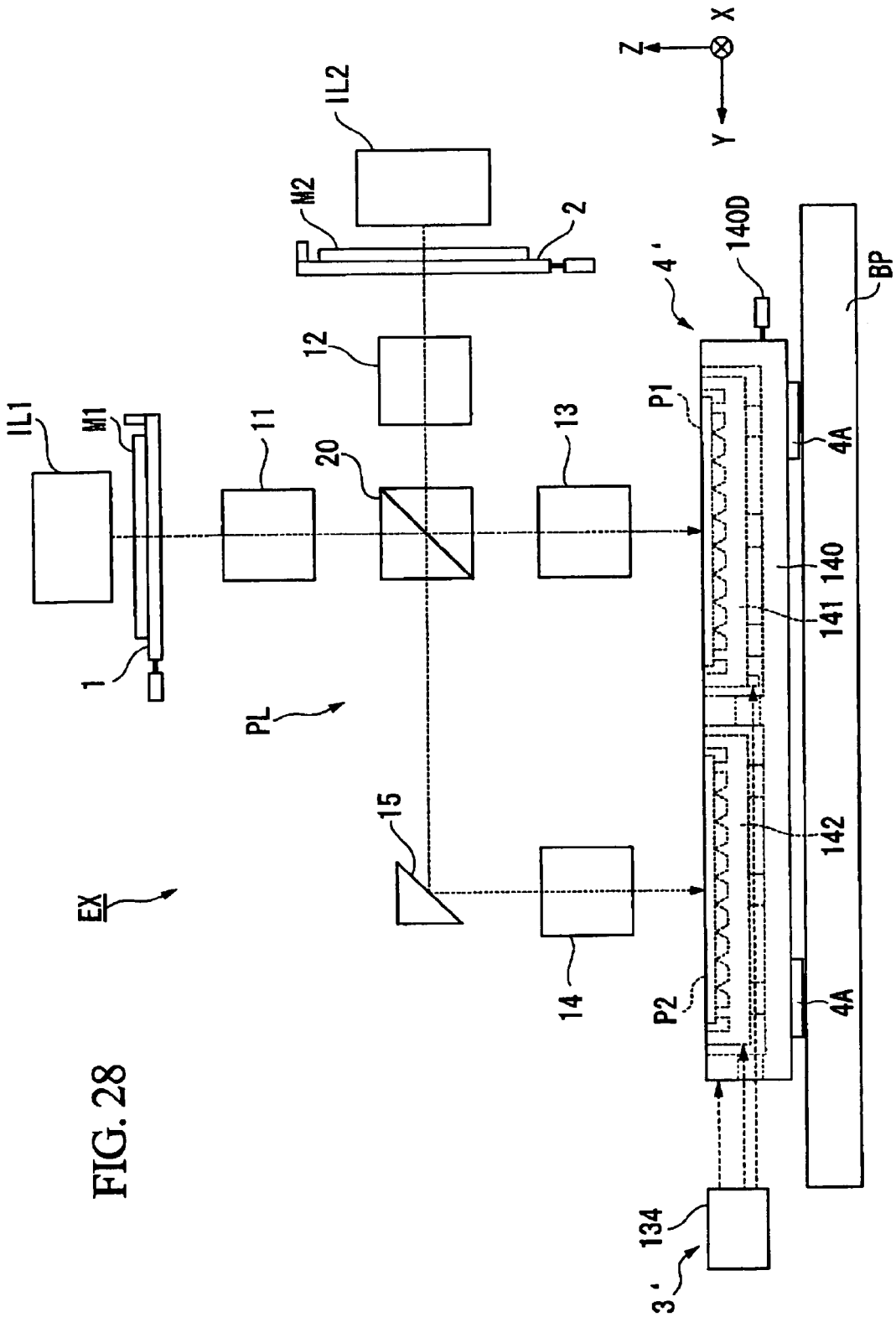
FIG. 28 shows an exposure apparatus according to a ninth embodiment.

FIG. 28 is a schematic diagram showing an exposure apparatus EX according to the present embodiment, and FIG. 29 is a sectional view showing the substrate stage 4' according to the present embodiment. The substrate stage 4' comprises a main stage 140, a first substage 141 capable of moving on the main stage 140 in a condition with the first substrate P1 held, and second substage 142 capable of moving on the main stage 140 in a condition with the first substrate P1 held.

The main stage 140 holds the first substrate P1 via the first substage 141, and holds the second substrate P2 via the second substage 142. The main stage 140 is capable holding the first substrate P1 and the second substrate P2 via the first substage 141 and the second substage 142, of moving in substantially the same scanning direction (Y axis direction) and in a direction orthogonal to the scanning direction X axis direction). Furthermore the main stage 140 is also capable of moving in the θZ direction.

The main stage 140 is supported without contact with respect to the upper surface (guide surface) of the base member BP, by for example an air bearings 4A. The upper surface of the base member BP is substantially parallel with the XY plane, and the main stage 140 is capable of moving on the base member BP along the XY plane. Furthermore, the exposure apparatus EX has a main stage drive device 140D including an actuator such as for example a linear motor, for moving the main stage 140 in the X axis, the Y axis and the θZ direction. For example, by moving the main stage 140 in the Y axis direction, the first and second substages 141 and 142 on the main stage 140 also move in the Y axis direction together with the main stage 140. Consequently, by moving the main stage 140 in the Y axis direction, the first and second substrates P1 and P2 held on the first and second substages 141 and 142 also move in the Y axis direction together with the main stage 140. Similarly, by moving the main stage 140 in the X axis direction, the first and second substages 141 and 142 on the main stage 140 also move in the X axis direction together with the main stage 140. Consequently, by moving the main stage 140 in the X axis direction, the first and second substrates P1 and held on the first and second substages 141 and 142 also move in the X axis direction together with the main stage 140.

The first substage 141 has a table 141A and a holder 141B mounted on the table 141A, that holds the first substrate P1. The table 141A is provided so as to be capable of moving in the Z axis, the θX and the θY directions with respect to the main stage 140. The holder 141B is provided so as to be capable of moving in the X axis, the Y axis and the θZ directions with respect to the table 141A. The substrate stage 4' comprises a first drive system 141DH provided between the table 141A and the holder 141B of the first substage 141, and including a plurality of actuators such as for example a voice coil motor, and a second drive system 141DV provided between the table 141A and the main stage 140 and including a plurality of actuators 4V such as for example a voice coil. The control apparatus 100 is capable of minutely moving the holder 141B in the X axis, the Y axis and the θZ directions with respect to the table 141A by means of the first drive system 141DH, and is capable of minutely moving the table 141A in the Z axis, the θZ and the θY directions with respect to the main stage 140 by means of the second drive system 141DV. The control apparatus 100 controls the second drive system 141DV, and adjusts the position of the table 141A in relation to the Z axis, the θZ and the θY directions, and is thereby capable of adjusting the position of the first substrate P1 held on the holder 141B on the table 141A, in the Z axis, the θX, and the θY directions. Furthermore, the control apparatus 100 is capable of moving the holder 141B in the X axis, the Y axis and the θZ directions wilt respect to the table 141A by driving the first drive system 141DH. The control apparatus 100 controls the first drive system 4DH, and adjusts the position of the holder 141B in relation to the X axis, the Y axis, and the θZ directions, and is thereby capable of adjusting the position of the first substrate P1 held in the holder 141B, in the X axis, the Y axis, and the θZ directions. In this manner, the control apparatus 100 is capable of adjusting the position of the first substrate P1 held in the holder 141B of the first substage 141, in relation to directions of 6 degrees of freedom of the X axis, the Y axis, the Z axis, the θX, the θY, and the θZ directions, by driving a first substage drive device 141D which includes the first drive system 141DH and the second drive system 141DV.

Similarly to the first substage 141, the second substage 142 has a table 142A and a holder 142B mounted on the table 142A, that holds the second substrate P2. The table 142A is provided so as to be capable of moving in the Z axis, the θX and the θY directions with respect to the main stage 140. The holder 142B is provided so as to be capable of moving in the X axis, the Y axis and the θZ directions with respect to the table 142A. Moreover, a first drive system 142DH is provided between the table 142A and the holder 142B of the second substage 142, and a second drive system 142DV is provided between the table 142A and the main stage 140. The control apparatus 100 is capable of minutely moving the holder 142B in the X axis, the Y axis and the θZ directions with respect to the table 142A by means of the first drive system 142DH, and is capable of minutely moving the table 142A in the Z axis, the θZ and the θY directions with respect to the main stage 140 by means of the second drive system 142DV. The control apparatus 100 is capable of adjusting the position of the second substrate P2 held in the holder 142B of the second substage 142, in relation to directions of 6 degrees of freedom of the X axis, the Y axis, the Z axis, the θX the θY, and the θZ directions, by driving a second substage drive device 142D which includes the first drive system 142DH and the second drive system 142DV.

A measurement system 3' of the present embodiment is capable of respectively measuring the position information of the main stage 140, the first substage 141, and the second substage 142. The measurement system 3' includes; a reflecting surface 130 provided on the main stage 140, a reflecting surface 131 of a reflecting member provided on the first substage 141, a reflecting surface 132 provided on the second substage 142, and a laser interferometer 134 that projects measuring light onto the reflecting surfaces 130, 131 and 132 and receives the reflected light and acquires position information of each of the main stage 140, the first substage 141, and the second substage 142.

In FIG. 29, the laser interferometer 134 is positioned on the +Y side of the main stage 140, and is capable of irradiating a plurality of measuring lights with the Y axis direction as the measuring axis, onto the reflecting surface 130. The laser interferometer 134 is capable of acquiring the position information of the main stage 140 in relation to the Y axis direction and the θZ direction, based on the reflection light of the measuring light irradiated onto the reflecting surface 130.

Furthermore, an aperture is formed at a predetermined position in the main stage 140, and the laser interferometer 134 is capable of irradiating a plurality of measurement lights with the Y axis direction as the measuring axis, onto the reflecting surface 131 via this aperture, and is capable of irradiating measurement light with the Y axis direction as the measuring axis, onto the reflecting surface 132. The laser interferometer 134 is capable of acquiring position information of the first substage 141 (holder 141B) and the second substage 142 (holder 142B) in the Y axis direction and the θZ direction, based on the reflection light of the measuring light irradiated onto to the reflecting surfaces 131 and 132.

Furthermore, while not shown in the figure, the measurement system 3' comprises a laser interferometer capable of irradiating a plurality of measurement lights with the X axis direction as the measuring axis, onto reflecting surfaces respectively provided at predetermined positions on the main stage 140, the first substage 141, and the second substage 142, and is capable of acquiring position information of the man stage 140, the first substage 141 (holder 141B), and the second substage 142 (holder 142B) in relation to the X axis direction. Furthermore, the measurement system 3' comprises a laser interferometer capable of irradiating a plurality of measurement lights with the Z axis direction as the measuring axis, onto reflecting surfaces respectively provided at predetermined positions on the main stage 140, the first substage 141, and the second substage 142, and is capable of acquiring position information of the main stage 140, the first substrate 141 (holder 141B), and the second substage 142 (holder 142B) in relation to the Z axis, and the θX and the θY directions.

The control apparatus 100 appropriately moves the main stage 140, the first substage 141, and the second substage 142, based on the measurement results of the measurement system 3', and performs position control of the first and second substrate P1 and P2 held on the holders 141B and 142B of the first and second substages 141 and 142. Furthermore, the control apparatus 100 moves at least one of the first substage 141 and the second substage 142 with respect to the main stage 140, and can thereby adjust the relative positional relationship between the first substrate P1 and the second substrate P2.

When the first and second substrates P1 and P2 are multiply exposed, the control apparatus 100 irradiates each of the first and second exposure lights EL1 and EL2 for the first and second substrates P1 and P2, while moving the first mask M1 and the second mask M2 in the respective scanning directions (the Y axis direction and the Z axis direction) using the first mask stage 1 and the second mask stage 2, and while moving the first substrate P1 and the second substrate P2 in the scanning direction (the Y axis direction) using the main stage 140. The control apparatus 100 drives the first and second substages 141 and 142 while moving in the Y axis direction by means of the main stage 140, and is can multiply expose the first and second substrates P1 and P2 while adjusting the position and posture of the first and second substrates P1 and P2.

In this manner, also by using the substrate stage 4' shown in FIGS. 28 and 29, the first substrate P1 and the second subs P2 can be multiply exposed at substantially the same time, and a plurality of substrates can be multiply exposed with good efficiency.

In the above described seventh through ninth embodiments, the exposure light emitted from a single light source may be branched into the first exposure light EL1 and the second exposure light EL2 by the branching optical element, and the first pattern PA1 and the second pattern PA2 may be illuminated by the first exposure light EL1 and the second exposure light EL2.

Figure 30:
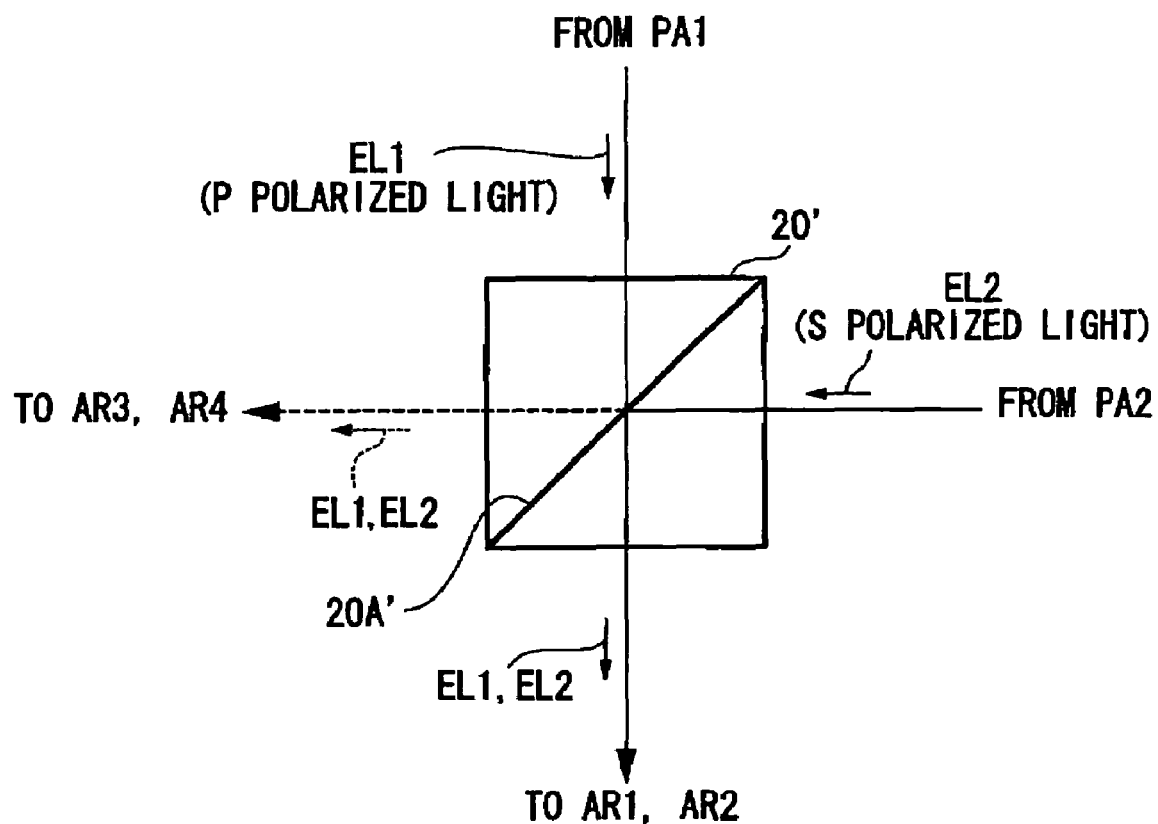
FIG. 30 shows another example of a combining optical element.

As in the schematic diagram shown in FIG. 30, as the combining optical element 20', it is also possible to use a polarization dissociation optical element (optical beam splitter) that dissociates the respective first exposure light EL1 and the second exposure light EL2 into exposure light of a first polarization (for example P polarized light), and exposure light of a second polarization (for example S polarized light). As a result, exposure light of a first polarization condition and exposure light of a second polarization condition can be irradiated onto the first exposure field AR1 and the second exposure field AR2, and exposure light of a first polarization condition and exposure light of a second polarization condition can be irradiated onto the third exposure field AR3 and the fourth exposure field AR4.

In the above described seventh through ninth embodiments, principally the case where the shot field S is multiply exposed was described as an example. However of course the seventh through ninth embodiments may also be used for normal single exposure (one unit exposure). For example, when the first mask M1 is irradiated by the first exposure light EL1 in a condition with the irradiation of the second exposure light EL2 stopped, the first exposure light EL1 is branched by the combining optical element 20, and one of the branched first exposure lights EL1 is irradiated onto the first exposure field AR1, and the other of the branched second exposure lights is irradiated onto the third exposure field AR3. As a result, the first pattern PA1 of the first mask M1 is exposed simultaneously on the first exposure field AR1 and the third exposure field AR3.

In the above described seventh through ninth embodiments, the branching and combining of the first exposure light EL1 and the second exposure light EL2 is executed by one combining optical element 20. However an optical elements which handles the branching operation, and an optical element which handles the combining operation may be provided separately, and after combining the first exposure light EL1 and the second exposure light EL2 with a predetermined combining optical element, the combined exposure light may be branched towards the first substrate P1 and the second substrate P2 by a predetermined branching optical element. Furthermore, after respectively branching the first exposure light EL1 and the second exposure light EL2, the branched EL1 and the second exposure light EL2 may be combined.

Furthermore, in the above described seventh through ninth embodiments, the optical sensor 170 detects the aerial images of the measurement marks provided on the first and second masks M1 and M2 to obtain the position information of the first through fourth image planes IS1-IS4. However, the measurement marks provided on the first and second mask stages 1 and 2 may arranged in the first and second illumination fields IA1 and IA2, and the optical sensor 170 may detect the aerial images. It should be noted that the mask stage on which the reference mark is provided is disclosed in, for example, Japanese Unexamined Patent Application, Publication Nos. H08-78313 and H08-79314 (both corresponding to U.S. Pat. No. 6,018,384), and Japanese Unexamined Patent Application, Publication No. H08-227847 (corresponding to U.S. Pat. No. 6,169,602) and the like.

Furthermore, in the above described seventh through ninth embodiments, the first and second image planes IS1 and IS2, in which the images of the first and second patterns PA1 and PA2 are formed, are positionally adjusted so as to be formed substantially in a same plane, in step SA5 shown in FIG. 23. However, the first image plane LS1 and the second image plane LS2 may be positionally adjusted so as to be formed in different planes from each other, or the positional adjustment (step SA5) of the first and second image planes LS1 and LS2 may have no need. That is to say, the first image plane LS1 and the second image plane LS2 may have different positions in the Z axis from each other. In this case, the position information (including incline information) for the first and second image planes LS1 and IS2 are measured in steps SA1 and SA2 shown in FIG. 23, and then the positional relationship is known. Therefore, steps SA20 and SA20' shown in FIG. 24 can be executed based on the plane positional relationship between the first image plane IS1 and the second image plane IS2. This manner can be similarly applied to the case for the third and fourth images IS3 and IS4 on which the images of the first and second patterns PA1 and PA2 are formed.

Furthermore, in the above described seventh through ninth embodiments, the exposure apparatus EX can include two substrate stages, each of which has same configuration as the first or second substrate stage 4 or 5, or can further include a substrate stage having a same configuration as the substrate stage 4'. In this case, the exposure process and the measurement process (for example, steps SA7-SA12, steps SA7'-SA12') can be concurrently executed. It should be noted that the first and second alignment systems 91 and 92, and the first and second focus leveling detection systems 81 and 82 are arranged at the measurement station where the measurement process is executed.

Furthermore, in the above described seventh through ninth embodiments, the measurement processes with the first and second alignment systems 91 and 92 and the first and second focus leveling detection systems 81 and 82 are executed in or at adjacent the areas where the exposure processes are executed. However, the alignment systems and/or the focus leveling detection systems can be provided for example between a replacement position of the substrate and a position where the exposure process is executed, and then the measurement process can be executed while the substrate is moved from the substrate replacement position to the exposure position.

Furthermore, in the above described seventh through ninth embodiments, the first and second alignment systems 91 and 92 employ a type of image processing. However, the type is not limited to this and the other type may be employed for example in which a mark is irradiated with a coherent beam and diffracted light from the mark is detected. Furthermore, in the above described seventh through ninth embodiments, an aerial image measurement instrument as the optical sensor 170 is used for measurement of the position information for the images of the first and second patterns PA1 and PA2. However, the measurement instrument of the position information is not limited to the aerial image measurement instrument and can be arbitrary. Furthermore, in the above described seventh through ninth embodiments, the images of the first and second alignment marks RM1 and RM2 of the first and second masks M1 and M2 are detected by the optical sensor 170. However, the position information for the images of the first and second alignment marks RM1 and RM2 may be obtained by, for example, detecting the first and second alignment marks RM1 and RM2 and the aperture 173 (or another reference mark) of the measurement filed 171 by means of different measurement system from the optical sensor 170, for example, alignment systems arranged above the first and second masks M1 and M2. Furthermore, in the above described seventh through ninth embodiments, the ArF excimer laser beam is used for the exposure lights. However, light having different wavelength from the ArF excimer laser beam, for example EUV light may be used.

In the above described first through ninth embodiments, when the first mask M1 moves in the +Y direction, the send mask M2 moves in the +Z direction. However when the first mask M1 moves in the +Y direction, the second mask M2 may move in the −Z direction.

In the above described first through ninth embodiments, during exposure of the substrate P, the first mask M1 is moved in the Y axis direction, and the second mask M2 is moved in a direction (Z axis direction) orthogonal to the moving direction (Y axis direction) of the first mask M1. However, the first mask M1 and the second mask M2 may be moved in the same direction (for example the Y axis direction). For example, by providing a mirror which bends the light from the second mask M2 towards the second optical system 12 through approximately 90 degrees, between the second mask M2 and the second optical system 12, then each of the first mask M1 and the second mask M2 can be moved in the Y axis direction. Furthermore, for example in a case where the projection optical system employs double head type, the first and second masks M1 and M2, on which the first and second pattern forming surfaces are arranged on a same plane, may be respectively moved at object plane side of the projection optical system in a same scanning direction with different mask stages, or the first and second masks M1 and M2 may be mounted on a same mask stage and be moved in a same scanning direction. In the latter case, it is preferable that an actuator that executes relatively movement between the first and second masks M1 and M2 on the mask stage be provided, and that the positional relationship of the images of the first and second patterns PA1 and PA2 be capable of adjusting. Furthermore, it is not limited to the case in which the first and second patterns PA1 and PA2 are formed on different masks (M1, M2), and the first and second patterns PA1 and PA2 may be formed on one mask. In the above described first through ninth embodiments, the substrate is double exposed with the first and second patter PA1 and PA2. However, the multiple exposure may be executed with 3 or more patterns.

In the above described first through ninth embodiments, the projection optical system PL is not limited to a reduction system, and for example either an equal magnification system or a magnification system may be used. Furthermore, the projection optical system PL may be a refractive system including a may be: a dioptric system that does not include reflecting optical elements; a catoptric system that does not include refracting optical elements; or a catadioptric system (a reflection/refraction system) that includes both reflecting optical elements and refracting optical elements. Furthermore, the projection optical system is not limited to a double head and catadioptric system, and may be for example a so-called in-line and catadioptric system, as disclosed in for example PCT International Publication No. WO 2004/107011 (corresponding to U.S. Patent Application, Publication No. 2006/0121364), in which an optical system (catoptric system or catadioptric system) having a plurality of reflection surfaces and forming an intermediate image at least once is provided on a part thereof, and single optical axis is provided with. Furthermore, the projected image created with the projection optical system PL may be either an inverted image or an erect image.

In the above described first through ninth embodiments, an ArF excimer laser light is used as the exposure light EL. However as mentioned above, various types of exposure lights (exposure beams) of for example a $F_2$ laser light may be employed. Here instead of the ArF excimer laser, a harmonic generation device as described for example in PCT International Publication No. WO 1999/46835 (corresponding to U.S. Pat. No. 7,023,610), that includes; a fixed laser light source such as a DFB semiconductor laser or a fiber laser, an optical amplification section having a fiber amplifier or the like, and a wavelength conversion section, and that outputs pulse light of wavelength 193 nm may be used.

Furthermore, in the abovementioned respective embodiments, at least one of the size and the shape of the first exposure field AR1 and the second exposure field AR2 may be different. For example, the width in the X axis direction and/or the width in the Y axis direction of the first exposure field ARM and the second exposure field AR2 may be different. In the case where the width in the X axis direction is different, only a part of inside the shot field S is multiply (double) exposed while one scanning operation. Similarly, at least one of the size and the shape of the second exposure field AR2 and the fourth exposure field AR4 may be different. Furthermore, in the above described first through ninth embodiments, the first and second illumination fields and the first and second exposure fields (and the third and fourth exposure fields) are respectively have a rectangular shape, however, may have another shape such as, for example, an arc shape, a trapezoidal shape, a parallelogram shape, or a diamond shape.

Furthermore, in the abovementioned respective embodiments, irradiation of the exposure lights EL1 and EL2 on each of the first exposure field AR1 and the second exposure field AR2 (the third exposure field AR3 and the fourth exposure field AR4) while the shot field S1 is passing through the first exposure field AR1 and the second exposure field AR2 (the third exposure field AR3 and the fourth exposure field AR4) is continuous. However in at least one of the exposure fields, the exposure light may be irradiated in a part of the period of time while the shot field S is passing. That is to say, only a part of inside the shot field S may be multiply (double) exposed.

In the abovementioned respective embodiments, an immersion system such as disclosed for example in PCT International Publication No. WO 1999/49504 and Japanese Patent Application, Publication No. 2004-289126 (corresponding to U.S. Patent Application, Publication No. 2004/0165159) may be applied. For example, a liquid immersion region may be formed on the substrate P with the liquid immersion system so as to cover the first and second exposure fields AR1 and AR2 (third and fourth exposure fields AR3 and AR4), and the first and second exposure lights EL1 and EL2 may be irradiated onto the first substrate P1 (second substrate P2) via the liquid. The immersion system can include: for example, a supply member provided at adjacent an optical path of an exposure light between a front optical element of a projection optical system and a substrate and having a supply outlet for supplying a liquid to the optical path; and a recovery member having an collection inlet for recovering the liquid.

Furthermore, it is not essential for the exposure apparatus to be provided with a portion of the liquid immersion system (for example, the liquid supply member and/or the liquid recovery member), and these may be substituted, for example, by equipment in the factory or the like where the exposure apparatus is installed. Note that the structure of the liquid immersion system is not limited to the described structure, and a variety of structures may be employed. For example, the structures such as those disclosed in European Patent Publication No. EP 1,420,298, PCT International Publication Nos. WO 2004/055803, WO 2004/057590, WO 2005/029559 (corresponding to U.S. Patent Application, Publication No. 2006/0231206), WO 2004/086468 (corresponding to U.S. Patent Application, Publication No. 2005/0280791), and Japanese Unexamined Patent Application, Publication No. 2004-289126 (corresponding to U.S. Pat. No. 6,952,253) may be used.

As the liquid used for the immersion method, water (pure water) may be used. Other than water, for example a fluorocarbon fluid such as a perfluoropolyether (PFPE) or a fluorocarbon oil, or a cedar oil or the like may be used. Moreover as the liquid, a liquid with a refractive index that is higher than that of water with respect to the exposure light (for example a liquid with a refractive index of approximately 1.6 to 1.8) may be used.

As liquid LQ with a refractive index higher than that of pure water (for example greater than 1.5), specific liquids with C—H bonds or O—H bonds such as isopropanol with refractive index of about 1.50, glycerol (glycerine) with refractive index of about 1.61, specific liquids (organic solvents) such as hexane, heptane, decane, or Decalin (Decahydronaphthalene) with refractive index of about 1.60 may be used. The liquid LQ may also be a combination of two or more kinds of any of the liquids mentioned above, or it may be any one of these liquids added (mixed) with pure water. Furthermore, the liquid LQ may be pure water with base or acid such as $H^+$, $Cs^+$, $K^+$, $Cl^-$, $SO4^{2-}$, $PO4^{2-}$ added (mixed) to it, or may be pure water with fine particles of Al oxide added (mixed) to it. The liquid used should preferably have a small light absorption coefficient, less temperature dependency, and stability of photosensitive material (or top coat film or reflection preventing film, and so on) coated on the surface of the projection optical system and/or the substrate. A supercritical fluid may also be used as the liquid. A top coat film and the like to protect the photosensitive material and base material from the liquid may be provided on the substrate. The front optical element may be formed of single crystals of silica or fluorine compounds such as calcium fluoride (fluorite), barium fluoride, strontium fluoride, lithium fluoride, and sodium fluoride, or it may be formed of a material with higher refractive index (greater than 1.6, for example) than silica or fluorite. Sapphire, germanium dioxide, and so on disclosed in PCT International Publication WO 2005/059617, or potassium chloride (refractive index of about 1.75) disclosed in PCT International Publication WO 2005/059618, may be used material with refractive index greater than 1.6.

When the liquid immersion method is used, in addition to the light path on the image plane side of the front optical element, the light path on the objective plane side of the front optical element may also be filled with liquid, as disclosed in PCT International Publication WO 2004/019128 (corresponding to US Patent Application, Publication No. 2005/0248856). Moreover, a lyophilic thin film and, or thin film with function to prevent dissolution may be formed on the complete surface of the front optical element or part thereof (including the contact surface with at least the liquid). Silica has good affinity with the liquid and does not require film to prevent dissolution, but at least a film to prevent dissolution should preferably be formed in case of fluorite.

The above respective embodiments, are ones which measure the position information of the mask stage and the substrate stage using an interferometer system as a measurement system 3 (3'). However the invention is not limited to this, and for example an encoder system that detects a scale (grating) provided for example on the top surface of the substrate stage may be used. In this case, as a hybrid system which uses both the interferometer system and the encoder system, preferably the measurement results of the interferometer system are used to perform calibration on the detection results of the encoder system. Furthermore, the interferometer system and the encoder system may be alternately used, or both may be used, to perform position control of the substrate stage.

As the substrate in the abovementioned respective embodiments, not only a semiconductor wafer for manufacturing a semiconductor device, but also a glass substrate for a display device, a ceramic wafer for a thin film magnetic head, a mask or an original plate of a reticle (synthetic quartz or silicon wafer) used in an exposure apparatus, or a film member can be used. Furthermore, the shape of the substrate is not limited to a circle, and may be another shape such as a rectangle.

Furthermore, in the above respective embodiments, the exposure apparatus EX may be provided with a measurement stage that is capable of moving independently from the substrate stage holding the substrate, and that is equipped with measurement members (for example, reference member formed with reference marks and/or various kinds of photoelectric sensor), as disclosed, for example, in the Japanese Unexamined Patent Application, Publication No. H11-135400 (corresponding to PCT International Publication No. 1999/23692) and the Japanese Unexamined Patent Application, Publication No. 2000-164504 (corresponding to U.S. Pat. No. 6,897,963). The exposure apparatus provided with this measurement stage may have the measurement stage wherein a plurality of measurement members including aerial image measurement instrument mentioned above are all installed, but with at least one of the plurality of measurement members installed in the substrate stage.

In the above respective embodiments, the first and second mask M1 and M2 are used for forming the first and second patterns. Alternatively, electronic mask that generates variable patterns (also called variable pattern forming mask, active mask or pattern generator) may be used. For example, a deformable micro-mirror device or digital micro-mirror device (DMD), which is a kind of non-radiative type image display element (also called spatial light modulator (SLM)) may be used as the electronic mask. The DMD has a plurality of reflecting elements (micro-mirrors) that are driven based on specified electronic data. The plurality of reflecting elements are arranged in a two dimensional matrix form on the surface of the DMD, are driven in element units, and they reflect and deflect the exposure light. The operation of the DMD is controlled by the control apparatus 100. The control apparatus 100 drives the reflecting elements of each DMD and forms patterns of the exposure light shone by the illumination system using the reflecting elements, based on the electronic data (pattern information) corresponding to the first and second patterns to be formed on the substrate. By using DMD, mask alignment operations in the mask stage and during the mask replacement work are not required when the pattern is changed, therefore, the multiple exposure is performed with more efficiently, in contrast to the case when exposure is performed using mask (reticle) on which pattern is formed. A mask stage is not installed in an exposure apparatus using electronic mask; the substrate may merely be moved in the X-axis and the Y-axis directions by the substrate stage. Moreover, to adjust the relative position of the images of the first and second patterns on the substrate, the relative position of the electronic mask that generates the patterns may be adjusted by an actuator and the like. Moreover, to adjust the relative position of the images of the first and second patterns on the substrate, the relative position of the two electronic masks that generate the first and second patterns may be adjusted by an actuator and the like, or, in at least one of the two electronic masks, the timing for generating the pattern may be adjusted or the generation position on the electronic mask may be shifted. The exposure apparatus using DMD is disclosed, for example, in Japanese Unexamined Patent Application, Publication No. H08-313842, Japanese Unexamined Patent Application, Publication No. 2004-304135, and U.S. Pat. No. 6,778,257.

The types of exposure apparatuses EX are not limited to exposure apparatuses for semiconductor device manufacture that expose a semiconductor device pattern onto a substrate P, but are also widely applicable to exposure apparatuses for the manufacture of liquid crystal display devices and for the manufacture of displays, and exposure apparatuses for the manufacture of thin film magnetic heads, image pickup devices (CCDs), micro machines, MEMS, DNA chips, and reticles or masks.

As far as is permitted, the disclosures in all of the Japanese Patent Publications and U.S. Patents related to exposure apparatuses and the like cited in the above respective embodiments and modified examples, are incorporated herein by reference.

As described above, the exposure apparatus EX of the aforementioned embodiments is manufactured by assembling various subsystems, including the respective constituent elements, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the mutual mechanical connection, the wiring and connection of electrical circuits, and the piping and connection of the atmospheric pressure circuit of the various subsystems. Of course, before the process of assembling the exposure apparatus from these various subsystems, there are also the processes of assembling each individual subsystem. When the process of assembling the exposure apparatus from the various subsystems is finished, a comprehensive adjustment is performed to ensure the various accuracies of the exposure apparatus as a whole. Furthermore, it is preferable to manufacture the exposure apparatus in a clean room wherein for example, the temperature and the cleanliness level are controlled.

Figure 31:
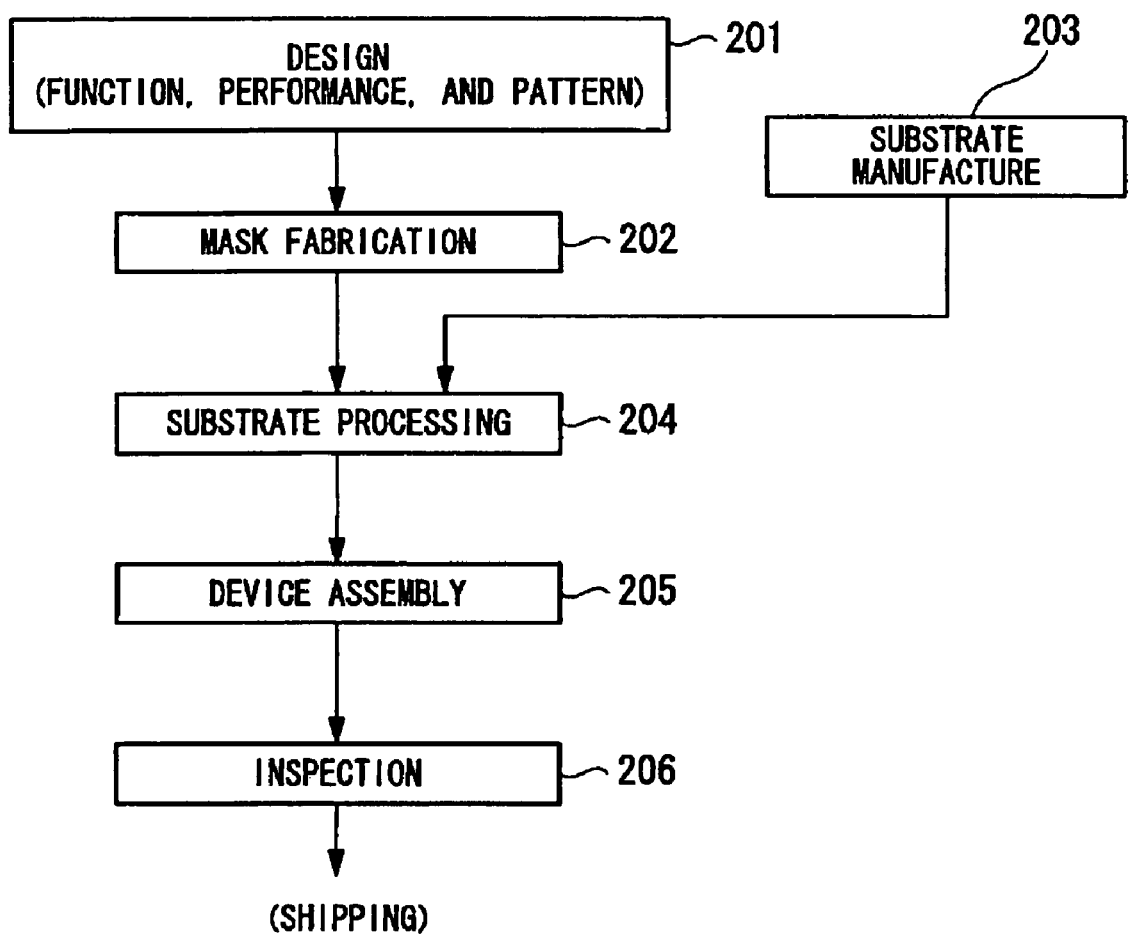
FIG. 31 is a flow chart that depicts one example of a process for fabricating a microdevice.

As shown in FIG. 31, microdevices such as semiconductor devices are manufactured by going through; a step 201 that performs microdevice function and performance design, a step 202 that fabricates the mask (reticle) based on this design step, a step 203 that manufactures the substrate that is the device base material, a step 204 including substrate processing steps such as a process that exposes the pattern on the mask onto a substrate by means of the exposure apparatus EX of the aforementioned embodiments, a process for developing the exposed substrate, and a process for heating (curing and etching the developed substrate, a device assembly step (including treatment processes such as a dicing process, a bonding process and a packaging process) 205, and an inspection step 206, and so on.

What is claimed is:
1. An exposure apparatus that exposes a substrate, comprising:
   an optical system having an optical element on which a first exposure light and a second exposure light are incident, the first exposure light and the second exposure light from the optical element being irradiated onto a first exposure field and a second exposure field; and
   a detection device that detects at least one of the first exposure light and the second exposure light, which are from the optical element and are directed towards a different direction from directions towards the first and second exposure fields.

2. The exposure apparatus according to claim 1, wherein a predetermined field on the substrate is multiply exposed with the first exposure light irradiated onto the first exposure field, and the second exposure light irradiated onto the second exposure field.

3. The exposure apparatus according to claim 1, wherein the detection device has a detection surface on which, at a position corresponding to a positional relationship between the first exposure field and the second exposure field, the first exposure light and the second exposure light are incident.

4. The exposure apparatus according to claim 3, wherein
   the first exposure field and the second exposure field are set at different positions from each other,
   and the first exposure light and the second exposure light are respectively incident on two positions of the detection surface of the detection device, the two positions corresponding to a positional relationship between the first exposure field and the second exposure field.

5. The exposure apparatus according to claim 3, wherein the detection surface of the detection device is arranged at a position being optically conjugate with a surface of the substrate or at a vicinity of the position.

6. The exposure apparatus according to claim 3, wherein at least a part of the first exposure field and at least a part of the second exposure field are overlapped.

7. The exposure apparatus according to claim 1, wherein the detection device detects at least one of the first exposure light and the second exposure light in parallel with an exposure operation for the substrate.

8. The exposure apparatus according to claim 7, wherein each of predetermined fields set on the substrate is sequentially exposed,
   the exposure apparatus further comprising a storage device that stores detection results of the demon device, associated with the predetermined fields.

9. The exposure apparatus according to claim 1, further comprising a control apparatus that controls irradiation condition of at least one of the first exposure light and the second exposure light based on a detection result of the detection device.

10. The exposure apparatus according to claim 9, wherein the control apparatus adjusts quantity of light of at least one of the first exposure light and the second exposure light based on a detection result of the detection device.

11. The exposure apparatus according to claim 1, further comprising an alarm device that gives an alarm based on a detection result of the detection device.

12. The exposure apparatus according to claim 1, wherein the detection device detects quantity of light of at least one of the first exposure light and the second exposure light, which are directed towards the different direction.

13. The exposure apparatus according to claim 1, further comprising an illumination system that illuminates a first pattern with the first exposure light and illuminates a second pattern with the second exposure light, the first and second exposure light being incident on the optical element via the first and second patterns.

14. The exposure apparatus according to claim 13, further comprising a movement apparatus that synchronously executes a movement of the first and second patterns relative to first and second illumination fields irradiated with the first and second exposure lights and a movement of the substrate relative to the first and second exposure fields, a predetermined field on the substrate being multiply exposed with the first and second exposure lights by means of the synchronous movement.

15. The exposure apparatus according to claim 1, further comprising:
    a first illumination system that illuminates a first pattern with the first exposure light; and
    a second illumination system that illuminates a second pattern with the second exposure light, wherein
    the optical system includes
    a first optical system that guides the first exposure light from the first pattern to the optical element,
    a second optical system that guides the second exposure light from the second pattern to the optical element, and
    a third optical system that guides each of the first exposure light and the second exposure light from the optical element to the first exposure field and the second exposure field.

16. The exposure apparatus according to claim 15, further comprising:
    a first mask moving device that relatively moves a first mask having the first pattern relative to the first exposure light;
    a second mask moving device that relatively moves a second mask having the second pattern relative to the second exposure light; and
    a substrate moving device that relatively moves the substrate relative to the first and second exposure fields, a predetermined field on the substrate being multiply exposed while synchronously executing a movement of the first mask and the second mask by means of the first mask moving device and the second mask moving device and a movement of the substrate by means of the substrate moving device.

17. The exposure apparatus according to claim 1, wherein the optical element includes a branching optical element that branches each of the first exposure light and the second exposure light.

18. The exposure apparatus according to claim 1, wherein the optical system conducts the first and second exposure lights into the optical element from different orientations.

19. The exposure apparatus according to claim 18, wherein the optical element is a transmissive type through which at least a part of the first exposure light and/or at least a part of the second exposure light are transmitted.

20. The exposure apparatus according to claim 19, wherein the optical element deflects at least a part of the first exposure light and/or at least a part of the second exposure light.

21. The exposure apparatus according to claim 1, wherein the optical system conducts the first and second exposure lights into the optical element via different optical elements.

22. The exposure apparatus according to claim 21, wherein the optical system conducts the first and second exposure lights from the optical element to the first and second exposure fields via a same optical element.

23. The exposure apparatus according to claim 1, wherein
    the first exposure light via a first pattern and the second exposure light via a second pattern are incident on the optical element,
    the optical system is capable of forming an image of the first pattern and an image of the second pattern on the first exposure field and the second exposure field, and is capable of forming an image of the first pattern and an image of the second pattern on a third exposure field and a fourth exposure field,
    a predetermined field on a first substrate is multiply exposed with the image formed in the first exposure field of the first pattern and the image formed in the second exposure field of the second pattern,
    a predetermined field on a second substrate is multiply exposed with the image formed in the third exposure field of the first pattern and the image formed in the fourth exposure field of the second pattern.

24. The exposure apparatus according to claim 23, wherein the predetermined fields on the first and second substrates are multiply exposed while moving the first pattern and the second pattern.

25. A device manufacturing method that uses the exposure apparatus according to claim 1.

26. An exposure method for exposing a substrate, the method comprising:
    irradiating first and second exposure fields with first and second exposure lights via an optical system having an optical element on which the first and second exposure lights are incident, to multiply expose the substrate; and
    detecting at least one of the fit exposure light and the second exposure light, which are from the optical element and are directed towards a different direction from directions towards the first and second exposure fields.

27. The exposure method according to claim 26, wherein the detection of at least one of the first exposure light and the second exposure light, which are directed towards the different direction, is executed in parallel with the multiple exposure for the substrate.

28. The exposure method according to claim 26, wherein
    a first pattern is illuminated with the first exposure light,
    a second pattern is illuminated with the second exposure light,
    each of the first and second exposure lights is incident on the optical element via the first and second patterns.

29. The exposure method according to claim 28, wherein the multiple exposure of the substrate with the first and second exposure lights includes synchronously executing a movement of the first and second patterns relative to first and second illumination fields irradiated with the first and second exposure lights and a movement of the substrate relative to the first and second exposure fields.

30. The exposure method according to claim 26, wherein the first and second exposure lights are incident on the optical element from different orientations.

31. The exposure method according to claim 30, wherein at least a part of the first exposure light and/or at least a part of the second exposure light are transmitted through the optical element.

32. The exposure method according to claim 31, wherein at least a part of the first exposure light and/or at least a part of the second exposure light are deflected by the optical element.

33. The exposure method according to claim 26, wherein the first and second exposure lights are incident on the optical element via different optical elements.

34. The exposure method according to claim 33, wherein the first and second exposure lights from the optical element are irradiated onto the first and second exposure fields via a same optical element.

35. A device manufacturing method comprising:
    exposing the substrate with the method according to claim 26;
    developing the exposed substrate; and
    treating the developed substrate.

* * * * *